(12) United States Patent
Shiomi et al.

(10) Patent No.: US 6,314,037 B1
(45) Date of Patent: Nov. 6, 2001

(54) SEMICONDUCTOR INTEGRATED CIRCUIT DEVICE USING BICMOS TECHNOLOGY

(75) Inventors: Toru Shiomi; Shigeki Ohbayashi, both of Hyogo-ken (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/658,038

(22) Filed: Sep. 8, 2000

Related U.S. Application Data

(62) Division of application No. 09/357,174, filed on Jul. 19, 1999, now Pat. No. 6,141,269, which is a division of application No. 08/362,051, filed on Dec. 22, 1994, now abandoned, which is a continuation of application No. 07/911,583, filed on Jul. 10, 1992, now abandoned.

(30) Foreign Application Priority Data

Aug. 30, 1991 (JP) .................................................. 3-219619
Nov. 7, 1991 (JP) .................................................. 3-291756

(51) Int. Cl.⁷ ...................................................... G11C 7/00
(52) U.S. Cl. ..................... 365/203; 365/156; 365/230.03; 365/177
(58) Field of Search .................................. 365/154, 156, 365/230.03, 203, 177

(56) References Cited

U.S. PATENT DOCUMENTS

| | | |
|---|---|---|
| 4,566,081 | 1/1986 | Ochii . |
| 4,769,561 | 9/1988 | Iwamura et al. . |
| 4,827,159 | 5/1989 | Naganuma . |
| 4,982,372 | 1/1991 | Matsuo . |
| 4,985,864 * | 1/1991 | Price .................................. 365/203 X |
| 5,019,726 | 5/1991 | Guo . |
| 5,146,120 | 9/1992 | Kimura et al. . |
| 5,204,836 | 4/1993 | Reed . |
| 5,255,227 | 10/1993 | Haeffele . |
| 5,307,307 * | 4/1994 | Wada et al. ............................ 365/51 |

FOREIGN PATENT DOCUMENTS

| | | |
|---|---|---|
| 60-68718 | 4/1985 | (JP) . |
| 60-142618 | 7/1985 | (JP) . |
| 60-170090 | 9/1985 | (JP) . |
| 61-61300 | 3/1986 | (JP) . |
| 61-125222 | 6/1986 | (JP) . |
| 61-35636 | 8/1986 | (JP) . |
| 61-283162 | 12/1986 | (JP) . |
| 62-48806 | 3/1987 | (JP) . |
| 62-230221 | 10/1987 | (JP) . |
| 62-250600 | 10/1987 | (JP) . |
| 2-2668 | 1/1990 | (JP) . |
| 2-237313 | 9/1990 | (JP) . |
| 3-8200 | 1/1991 | (JP) . |

OTHER PUBLICATIONS

"Design of CMOS VLSI" by Sugano et al. (1989), pp. 85, 86, 147, 148, and 149.

"A 12–ns ECL I/O 256Kx1–bit SRAM Using a 1–μm DiCMOS Technology" by Kertis et al., IEEE Journal of Solid–State Circuits, vol. 23, No. 5 (Oct. 1988), pp. 1048–1053.

"A 7–ns 1–Mb BiCMOS ECL SRAM with Shift Redundancy" by Ohba et al., IEEE Journal of Solid–State Circuits, vol. 26, No. 4 (Apr. 1991), pp. 507–512.

* cited by examiner

Primary Examiner—Huan Hoang
(74) Attorney, Agent, or Firm—McDermott, Will & Emery

(57) ABSTRACT

In an input buffer circuit, a second stage includes a BiNMOS non-inverter and a CMOS inverter, and a driver circuit includes BiNMOS push-pull circuits.

16 Claims, 58 Drawing Sheets

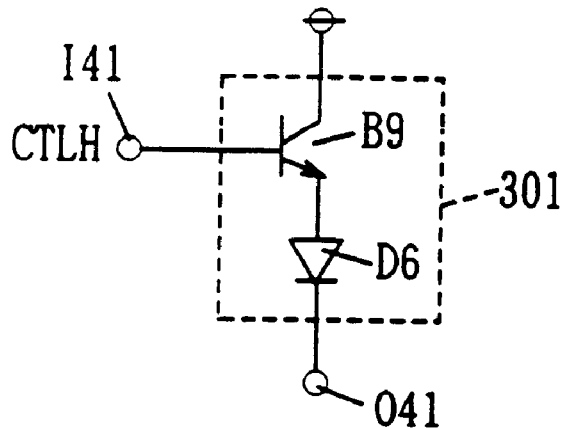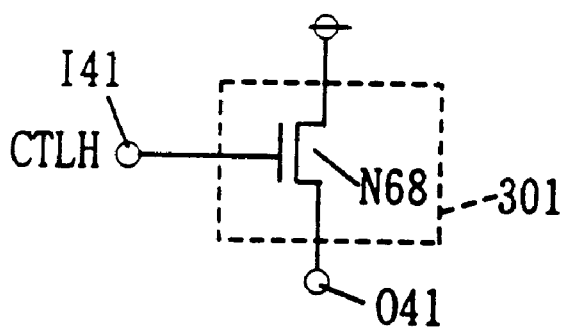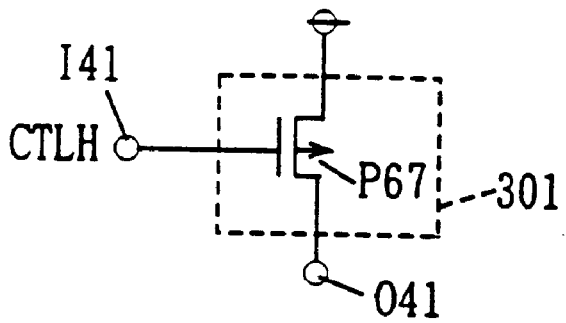
FIG. 54 PRIOR ART (a)
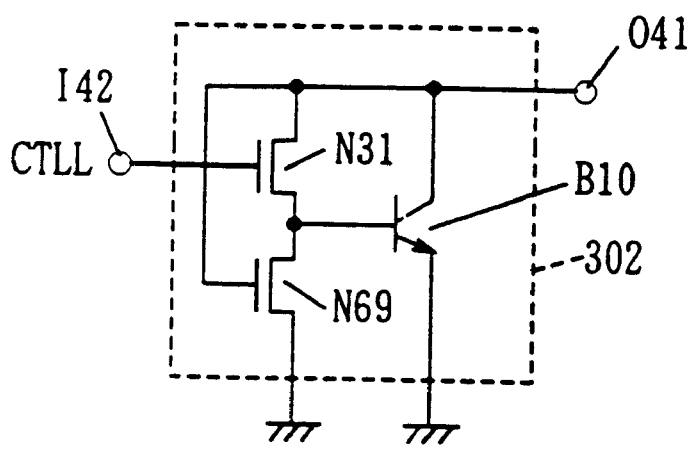
(b)
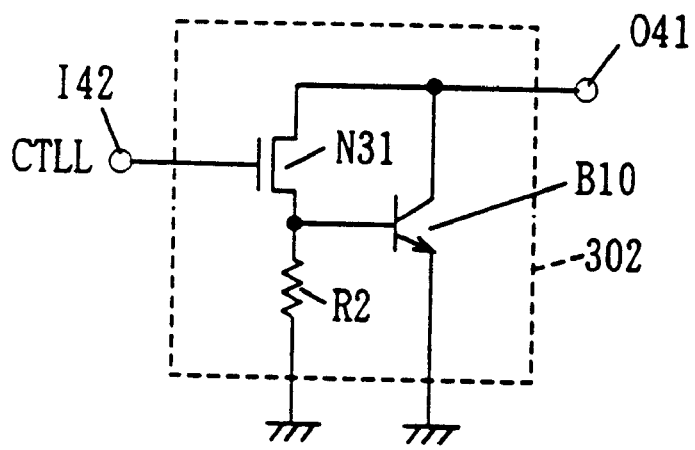
FIG. 55
PRIOR ART FIG. 67 PRIOR ART
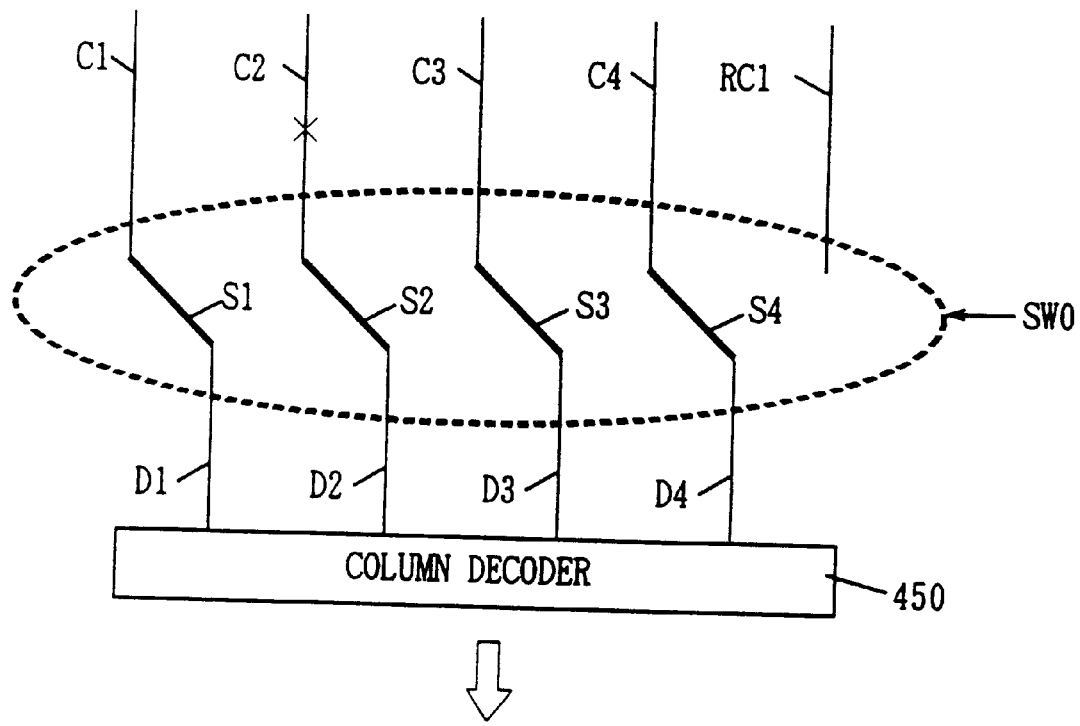
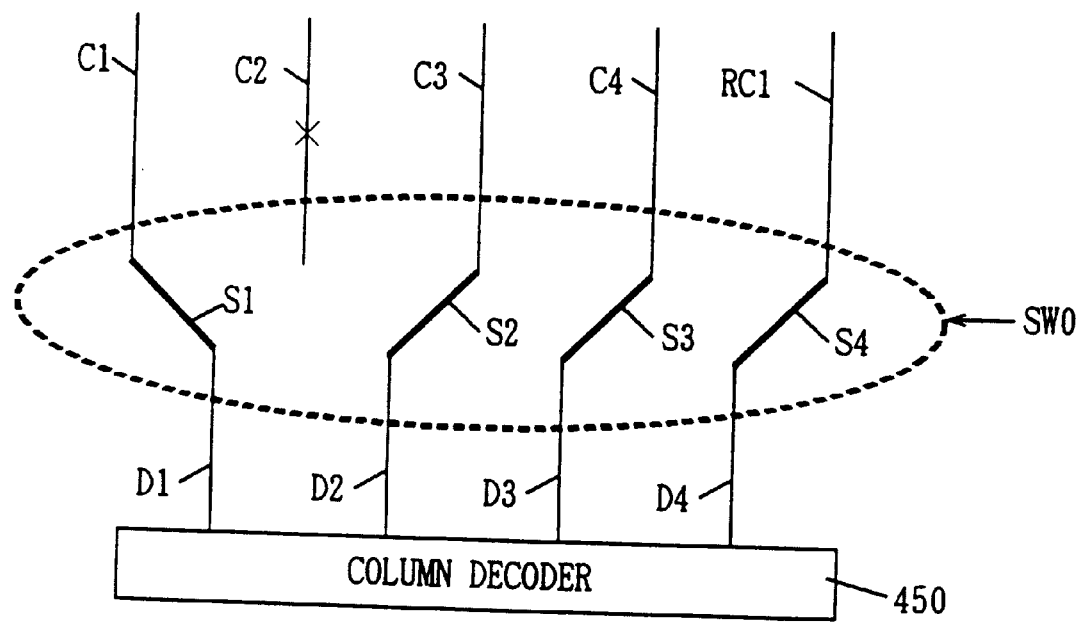

SEMICONDUCTOR INTEGRATED CIRCUIT DEVICE USING BiCMOS TECHNOLOGY

This application is a Divisional of application Ser. No. 09/357,174 filed Jul. 19, 1999, now U.S. Pat. No. 6,141,269 which is a Divisional of application Ser. No. 08/362,051 filed Dec. 22, 1994, now abandoned, which is a Continuation of application Ser. No. 07/911,583 filed on Jul. 10, 1992, now abandoned.

BACKGROUND OF THE INVENTION

1. Field of the Invention

The present invention relates to semiconductor integrated circuit devices, and particularly to a semiconductor integrated circuit device using BiCMOS technology.

2. Description of the Background Art

The BiMOS is a kind of circuit structure system in which a bipolar element and a MOS element are mixedly provided on the same chip, and is LSI technology in which a bipolar IC performing analog processes and an MOS IC performing digital processes with low consumption power are provided mixedly on the same chip.

The bipolar IC has an advantage that it can process high frequency signals and operate at high speed because it can perform analog processings with high accuracy and has large current driving capability. On the other hand, however, it has a disadvantage that the input impedance is low and consumption power is large. On the other hand, MOS IC has an advantage that the integrity level and input impedance are high but has a disadvantage that it is not suitable for analog processings.

Accordingly, a circuit configuration method, the BiMOS has been devised in order to realize semiconductor integrated circuit devices having advantages of both of bipolar IC and MOS IC. In order to make the most of strong points of both of the bipolar IC and the MOS IC, in a semiconductor integrated circuit device of BiMOS structure, a circuit portion for outputting TTL level signals includes a bipolar element and a MOS element, for example.

In the specification and drawings, N1–N80 denote N-channel MOS field effect transistors (NMOS transistors), and P1–P35, P61–P74 denote P-channel MOS field effect transistors (PMOS transistors). Also, B1–B22 denote NPN-type bipolar transistors.

(1) Schematic Structure of the Entirety of Conventional SRAM (FIG. 45)

FIG. 45 is a block diagram illustrating a schematic structure of a conventional general SRAM (Static Random Access Memory) using the BiMOS technology.

In a memory cell array 51, a plurality of word lines and a plurality of bit line pairs are arranged intersecting one another and memory cells are provided at intersections thereof.

A row address buffer 52 applies row address signals X0–X7 externally supplied to a row decoder 53. Row decoder 53 selects one word line inside memory cell array 51 in response to a row address signal. A column address buffer 55 applies column address signals Y0–Y6 provided from outside to a column decoder 56. Column decoder 56 selects one bit line pair inside memory cell array 51 in response to a column address signal. Thus, a memory cell provided at an intersection of the selected word line and the selected bit line pair is selected. Data is written into the selected memory cell, or data stored in that memory cell is read out.

When both of a write enable signal $\overline{WE}$ and a chip select signal $\overline{CS}$ provided to a R/W control circuit 62 from outside attain "L", data writing operation is performed. At this time, input data to be written is applied to an input pin DQ. The input data is applied to a write driver 61 through a data input/output buffer 59 and R/W control circuit 62 and written into a selected memory cell inside memory cell array 51. When the writing operation is finished, bit line pairs inside memory cell array 51 are charged to a predetermined potential by a bit line load circuit 60.

When a write enable $\overline{WE}$ attains "H", data reading operation is performed. Data stored in a selected memory cell inside memory cell array 51 is detected and amplified by a sense amplifier 58 and outputted to input/output pin DQ through data input/output buffer 59.

The SRAM in FIG. 45 has a common input and output pin. Also, redundant circuits such as a row redundancy circuit (row repair circuit) 54 and a column redundancy circuit (a column repair circuit) 57 are provided to enhance the yield.

(2) Detailed Structure of Respective Parts of Conventional SRAM

(a) Input Buffer Circuit (FIG. 46)

FIG. 46 is a circuit diagram illustrating an input buffer circuit of TTL interface used in row address buffer 52, column address buffer 55 and R/W control circuit 62 shown in FIG. 45.

A power-supply potential Vcc is applied to a high potential side power-supply terminal (hereinafter, referred to as a power-supply terminal) and a ground potential GND is applied to a low potential side power-supply terminal (hereinafter, referred to as a ground terminal). In a semiconductor integrated circuit device of TTL interface, the power-supply potential Vcc is set to 5V and the ground potential GND is set to 0V.

In FIG. 46, a CMOS inverter 101 including transistors P1, P2, N1 is connected between an input terminal I1 and a node n1. A CMOS inverter 121 including transistors P61, N61 and a CMOS inverter 123 including transistors P63, N63 are connected between node n1 and an output node 02. A CMOS inverter 122 including transistors P62, N62, a CMOS inverter 124 including transistors P64, N64 and a CMOS inverter 125 including transistors P65, N65 are connected between node n1 and an output node 01.

In the case of TTL interface, an "H" level of an input signal A applied to input terminal I1 is 2.2V and an "L" level is 0.8V. Accordingly, an amplitude of an input signal A is small and the "H" potential is low as compared to a CMOS level ("H"=5V, "L"=0V).

Therefore, it is adjusted so that a logical threshold value of the next stage is 1.5V by CMOS inverter 101. 1.5V is an intermediate potential between 2.2V and 0.8V.

Specifically, a size of transistor N1 is increased. Furthermore, the sizes of transistors N61 and N62 are increased so that logical threshold values of the next stages of CMOS inverters 121 and 122 become 2.5V which is intermediate potential between 5V and 0V.

CMOS inverters 123, 124, 125 work as driver circuits and have a decoder circuit connected to the next stage operate at a high speed.

As shown in FIG. 46, extra one stage of CMOS inverter 125 is required for obtaining complementary output signals B and $\overline{B}$ in a CMOS circuit.

(b) WE Buffer Circuit (write enable buffer circuit) (FIGS. 47 and 48)

FIG. 47 is a block diagram illustrating a WE buffer included in the R/W control circuit 62 shown in FIG. 45 and relating parts thereof. FIG. 48 is a waveform diagram for use in describing operation of the WE buffer.

Referring to FIGS. 47 and 48, operation of the SRAM in FIG. 45 will be described. Operation with the worst timing will be considered in which an address signal and an external write enable signal $\overline{WE}$ change at the same timing (i.e., set up time=0 ns, and hold time=0 ns).

Period of Cycle CY1

Since a write enable signal $\overline{WE}$ attains "L" in the cycle CY1, the SRAM comes in a write state. In the write state, it is necessary that a fall of an internal write enable signal $\overline{IWE}$ is later than switching of a word line.

This is because data is written into a memory cell selected with an address signal An−1 (erroneous writing) if an internal write enable signal $\overline{IWE}$ falls before switching of word lines.

Period of Cycle Y2

In cycle CY2, since a write enable signal $\overline{WE}$ attains "H", a SRAM comes in a read state. In the read state, it is necessary that a rise of an internal write enable signal $\overline{IWE}$ is earlier than switching of word lines.

This is because it is possible that data is erroneously written into a memory cell selected with an address signal An+1 if an internal write enable signal $\overline{IWE}$ rises before switching of a word line. This is also because a read time, that is, an access time becomes long since a time when potential of an "L" level of a bit line recovers to a potential close to power-supply potential Vcc in a read state is later than time of switching of word lines.

Accordingly, an internal write enable signal $\overline{IWE}$ is required to respond slowly to address change coming into a write state and rapidly respond to address change coming into a read state.

On the other hand, an internal output enable signal $\overline{IOE}$ for controlling an output buffer circuit is required completely opposite characteristics as follows.

Period of Cycle CY1

If an input pin and an output pin are made common, an input/output pin DQ is used as an input pin in writing operation. Accordingly, it is necessary to bring an output buffer circuit into a disable state to realize high impedance as quickly as possible by raising an internal output enable signal $\overline{IOE}$.

Period of Cycle CY2

On the other hand, in reading operation, when an output buffer circuit is rapidly brought into an enable state with a fall of an internal output enable signal $\overline{IOE}$, previous data is once read out and true data is read out thereafter. Accordingly, it has a problem that the access time is long.

Accordingly, an internal output enable signal $\overline{IOE}$ is required to rapidly respond to address change coming into a write state and slowly respond to address change coming into a read state.

As shown in FIG. 48, a time T11 from a fall point t10 of a write enable signal $\overline{WE}$ to a fall point of an internal write enable signal $\overline{IWE}$ is set to be long, and a time T12 from a rise point t11 of a write enable signal $\overline{WE}$ to a rise point of an internal write enable signal $\overline{IWE}$ is set to be short.

Furthermore, a time T13 from a fall point t10 of a write enable signal $\overline{WE}$ to a rise point of an internal output enable signal $\overline{IOE}$ is set to be short and a time T14 from a rise point t11 of a write enable signal $\overline{WE}$ to a fall point of an internal output enable signal $\overline{IOE}$ is set to be long.

As shown in FIG. 47, a WE buffer 18a receives a write enable signal $\overline{WE}$ and applies the same to a WE waveform shaping circuit 19a and an OE waveform shaping circuit 23a. An internal write enable signal $\overline{IWE}$ is obtained by WE waveform shaping circuit 19a and an internal output enable signal $\overline{IOE}$ is obtained by OE waveform shaping circuit 23a. In WE buffer 18a, the input buffer circuit shown in FIG. 46 is used.

(c) Gate Circuit (FIGS. 49–51)

FIG. 49 is a circuit diagram showing a CMOS inverter circuit, and FIG. 50 is a circuit diagram showing a BiCMOS gate circuit.

The CMOS inverter circuit shown in FIG. 49 includes a PMOS transistor P66 and an NMOS transistor N66. Transistor P66 is connected between a power-supply terminal and an output terminal O21 and transistor N66 is connected between an output terminal O21 and a ground terminal. Gates of transistors P66 and N66 are connected to an input terminal I21.

The BiCMOS gate circuit shown in FIG. 50 includes a PMOS transistor P13, NMOS transistors N17, N18, N19 and bipolar transistors B7, B8.

Transistor P13 is connected between a power-supply terminal and a node n21, and transistor N17 is connected between node n21 and a ground terminal. Transistor N18 is connected between output terminal O21 and a node n22, and transistor N19 is connected between node n22 and a ground terminal. Gates of transistors P13, N17, N18 are connected to input terminal I21 and a gate of transistor N19 is connected to node n21.

Transistor B7 is connected between a power-supply terminal and output terminal O21, and transistor B8 is connected between output terminal O21 and a ground terminal. A base of transistor B7 is connected to node n21 and a gate of transistor B8 is connected to node n22.

In an MOS LSI, taking compatibility with TTL into account, 5V is used as a power-supply voltage. Also, for the purpose of increasing power-supply noise margin not to degrade performance of MOSFET, and so forth, in an LSI using the design rule larger than 0.8 μm, 5V is used as a power-supply voltage.

When an MOSFET is made fine, an electric field in the vicinity of a drain increases and carriers in a channel are accelerated by the high electric field. Therefore, the carriers get large energy. Such carriers have extremely high energy, so that they are called hot carriers.

At this time, impact ionization occurs to produce electron-hole pairs. These hot carriers are trapped into an oxide film or produce a surface state to degrade characteristics of a transistor. This is called device degradation due to hot carriers.

The impact ionization rate is larger in an NMOS transistor than in a PMOS transistor, and the impurity profile of source and drain is sharp and the electric field in the vicinity of a drain is high. Accordingly, the device degradation due to hot carriers is more serious in an NMOS transistor.

Accordingly, when using the design rule smaller than 0.8 µm for speeding up, some measures must be taken against the device degradation due to hot carriers.

FIG. 51 shows degradation of a MOS transistor due to hot carriers, in which (a) shows a degradation rate of Gm and (b) shows a shift amount of a threshold value. FIGS. 51(a) and (b) are recited in "design of CMOS VLSI", by Editor in Chief; Takuo Sugano and Editor; Tetsuya Iizuka, Baifukan.

It is seen from FIGS. 51(a) and (b) that degradation of the device increases as the drain voltage $v_{DS}$ increases.

(d) Decoder Circuit (FIG. 52)

FIG. 52 is a circuit diagram showing a structure of a decoder circuit used in row decoder 53 and column decoder 56 shown in FIG. 45.

The decoder circuit in FIG. 52 includes four BiNMOS-3NAND circuits 211–214 and four BiCMOS inverters 241–244. Each of BiNMOS-3NAND circuits 211–214 includes PMOS transistors P14–P16, NMOS transistors N20–N25 and a bipolar transistor B23. A structure of each of BiCMOS inverters 241–244 is the same as the structure of the BiCMOS gate circuit shown in FIG. 50.

An input terminal of a corresponding BiCMOS inverter is connected to an output terminal 031 of each BiNMOS-3NAND circuit. Nodes n31 of BiNMOS-3NAND circuits 211–214 and sources of transistors N17 of BiCMOS inverters 241–244 are connected to a ground terminal.

With such a strict design rule as described above, some measures should be taken against hot carriers also in the decoder circuit in FIG. 52.

(e) Output Buffer Circuit (FIGS. 53–58)

FIG. 53 is a diagram illustrating a general structure of a semiconductor integrated circuit device having a BiCMOS structure outputting a signal of TTL level.

The semiconductor integrated circuit device includes a data generating circuit 340, an output control circuit 350 and an output buffer circuit 300 on one chip. Data generating circuit 340 applies two complementary data signals to output control circuit 350 through data buses DB1, SB2 in response to an external signal. Output control circuit 350 applies a pull-up control signal CTLH and a pull-down control signal CTLL to input terminals I41 and I42 of output buffer circuit 300 in response to an output enable signal $\overline{OE}$ and a data signal.

Output buffer circuit 300 includes a pull-up circuit 301 and a pull-down circuit 302. Pull-up circuit 301 includes a bipolar transistor B9 connected between a power-supply terminal and an output terminal O41. Pull-down circuit 302 includes an NMOS transistor N67 connected between an output terminal O41 and a ground terminal. A base of transistor B9 is connected to an output terminal I41 and a gate of transistor N67 is connected to input terminal I42.

When a control signal CTLH attains "H", a voltage between base/emitter of transistor B9 increases. Transistor B9 is thus brought into an ON state and output terminal O41 is electrically connected to a power-supply terminal. Accordingly, the potential of output terminal O41 rises to "H".

On the other hand, when a control signal CTLL attains "H", transistor N67 comes into an ON state. Output terminal O41 is thus electrically connected to a ground terminal. Accordingly, the potential of output terminal O41 falls to "L".

Another example of pull-up circuit 301 is shown in FIG. 54. The pull-up circuit 301 of FIG. 54(a) includes a bipolar transistor B9 and a diode D6 connected in series between a power-supply terminal and an output terminal O41. A control signal CTLH is applied to a base of transistor B9.

The pull-up circuit 301 of FIG. 54(b) includes an NMOS transistor N68 connected between a power-supply terminal and an output terminal O41. A control signal CTLH is applied to a gate of transistor N68.

The pull-up circuit 301 of FIG. 54(c) includes a PMOS transistor P67 connected between a power-supply terminal and an output terminal O41. A control signal CTLH is applied to a gate of transistor P67.

In the pull-up circuits 301 of FIGS. 54(a), (b), when a control signal CTLH attains "H", transistors B9, N68 and diode D6 turn on and the potential of output terminal O41 rises to "H". Also, in the pull-up circuit 301 of FIG. 54(c), when a control signal CTLH attains "L", transistor P67 turns on and the potential of output terminal O41 rises to "H".

Another example of pull-down circuit 302 is shown in FIG. 55.

The pull-down circuit 302 of FIG. 55(a) includes NMOS transistors N31, N69 connected in series between an output terminal O41 and a ground terminal, and a bipolar transistor B10 connected in parallel to these transistors N31, N69.

A control signal CTLL is applied to a gate of transistor N31 and a gate of transistor N69 is connected to output terminal O41. Potential of a connection point of transistors N31, N69 is applied to a base of transistor B10.

When the potential of output terminal O41 is "H", transistor N69 turns on. Base potential of transistor B10 thus attains "L", and output terminal O41 is charged by the pull-up circuit.

When a control signal CTLL attains "H" at this time, transistor N31 turns on and the charge of output terminal O41 is supplied to the base of transistor B10. As a result, transistor B10 turns on and output terminal O41 is electrically connected to the ground terminal. Accordingly, the potential of output terminal O41 attains "L".

In the pull-down circuit 302 of FIG. 55(b), a resistor R2 is connected in place of transistor N69 shown in FIG. 55(a). Also in the pull-down circuit 302, a control signal CTLL attains "H" to bring the potential of output terminal O41 to "L".

In the pull-down circuit 302 of FIG. 55(a), when the potential of output terminal O41 is at "H", transistor N69 comes in an ON state and the base of transistor B10 is electrically connected to the ground terminal. Accordingly, even if current leaks to the base of transistor B10 because of some reason from transistor N31 to be in an OFF state in such a period, the leak current is discharged through transistor N69.

Accordingly, it is avoided that transistor B10 somewhat reaches an ON state due to such leak current to cause throughout current to flow from the power-supply terminal to the ground terminal through the pull-up circuit and transistor B10.

Similarly, in the pull-down circuit 302 of FIG. 55(b), leak current of transistor N31 is prevented from being supplied to the base of transistor B10 by resistor R2. Accordingly, generation of throughout current in a period in which the potential of output terminal O41 is at "H" can be avoided.

Examples of output control circuit 350 are shown in FIGS. 56 and 57.

The output control circuit 350 of FIG. 56(a) includes conversion input type 2-input AND gates 351 and 352. If an output enable signal $\overline{OE}$ is at "L", levels of control signals CTLH and CTLL are determined by potentials of data buses DB1 and DB2, respectively.

If potentials of data buses DB1, DB2 are at "L" and "H", respectively, control signals CTLH and CTLL respectively attain "H" and "L". On the other hand, if potentials of data buses DB1 and DB2 are respectively at "H" and "L", control signals CTLH and CTLL attain "L" and "H", respectively.

Accordingly, when a data signal of "L" corresponding to a logical value "0" is applied to data bus DB2 by a data generating circuit, the potential of output terminal O41 attains "L". On the contrary, when a data signal of "H" corresponding to a logical value "1" is applied to data bus DB2 by the data generating circuit, the potential of output terminal O41 attains "H". That is, a data signal applied to data bus DB2 from the data generating circuit is outputted at output terminal O41.

The output control circuit 350 of FIG. 56(b) includes input conversion type 2-input AND gates 351 and 352 and an inverter 353. The output control circuit 350 is connected to a single data bus DB. In a period in which an output enable signal $\overline{OE}$ is at "L", a data signal applied from the data generating circuit to the data bus DB is outputted at output terminal O41.

The output control circuit 350 of FIG. 57 includes a 2-input NAND gate 354, an input conversion type 2-input AND gate 352 and an inverter 355. When an output enable signal $\overline{OE}$ is at "L", potentials of control signals CTLH and CTLL are both determined by the potential of data bus DB.

If the potential of data bus DB is "H", both of control signals CTLH and CTLL attain "L". On the contrary, if the potential of data bus DB is "L", control signals CTLH and CTLL both attain "H".

Accordingly, when a data signal of "H" is applied to data bus DB from the data generating circuit, a transistor P67 of output buffer circuit 300 turns on and a transistor N67 turns off. As a result, a data signal of "H" is outputted at output terminal O41. Similarly, if a data signal of "L" is applied to data bus DB from the data generating circuit, transistor P67 of output buffer circuit 300 turns off and transistor N67 turns on. A data signal of "L" is thus outputted at output terminal O41.

An output enable signal $\overline{OE}$ is a signal for instructing as to whether a data signal generated by the data generating circuit is to be externally outputted or not. In the output control circuit 350 of FIGS. 56(a), (b), if an output enable signal $\overline{OE}$ is at "H", both of control signals CTLH and CTLL attain "L". Accordingly, transistors B9 and N67 of output buffer circuit 300 turn off and output impedance of output terminal O41 increases.

If an output enable signal $\overline{OE}$ is "H" in the output control circuit 350 of FIG. 57, a control signal CTLH attains "H" and a control signal CTLL attains "L". Therefore, transistors P67 and N67 of output buffer circuit, 300 turn off and the output impedance of output terminal O41 increases.

FIG. 58 is a circuit diagram illustrating a structure of an output buffer circuit used in the data input/output buffer 59 shown in FIG. 45.

The output buffer circuit includes a CMOS inverter 360 having transistors P68 and N70, a CMOS·2NOR circuit 370 having transistors P69, P70, N71, N72, a CMOS·2NOR circuit 380 having transistors P71, P72, N73, N74 and a BiNMOS driver circuit 300 having transistors B9, N67.

An input signal $\overline{SA}$ is applied to input terminal 150. The output buffer circuit comes into an output enable state (read state) when a chip select signal CS is at "L", and comes in an output disable state (write state) or a chip non-selection state when a chip select signal CS is at "H". In the output disable state or the chip non-selection state, output terminal O50 attains a high impedance state. In the output buffer circuit, a rise of an output signal is speeded up by bipolar transistor B9.

(f) Bit Line Load Circuit (FIGS. 59–63)

FIG. 59 is a diagram showing memory cell array 51 shown in FIG. 45 and a structure in the vicinity thereof.

A plurality of word lines WLs and a plurality of bit line pairs BLs, $\overline{BL}$s are arranged intersecting one another and memory cells MCs are provided at their intersections.

Each memory cell MC has a structure shown in FIGS. 60(a) or (b), for example. The memory cell of FIG. 60(a) includes NMOS transistors N75–N78 and load resistors R6, R7. The memory cell of FIG. 60(b) includes PMOS transistors P73 and P74 and NMOS transistors N75–N78.

In FIG. 59, a bit line load circuit 470 and a column selection circuit 480 are connected to each of bit line pairs BL, $\overline{BL}$. Bit line load circuit 470 is connected to write data buses WBa, WBb. Column selection circuit 480 is connected to read data buses RBa and RBb. A write driver 490 is connected to write data buses WBa and WBb and a sense amplifier 420 is connected to read data buses RBa and RBb.

Bit line load circuit 470 is controlled with a signal obtained by a logical product of a column selection signal Yi (i=1 through n) and a write enable signal WE. Column selection circuit 480 is controlled by a column selection signal Yi. Column selection circuit 480 transmits potential difference occurring in bit lines BL, $\overline{BL}$ to read data buses RBa and RBb. Sense amplifier 420 amplifies signals of read data buses RBa and RBb and applies the same to an output circuit.

FIG. 61 shows waveforms of bit line potential when a SRAM changes from a write state to a read state by change of an external write enable signal $\overline{WE}$ from "L" to "H".

In FIG. 61, a simultaneous change of a write enable signal $\overline{WE}$ and an external address signal is shown. It is now assumed that a column address signal is fixed and only a row address signal changes.

In writing operation, potential of one of bit line pair BL, $\overline{BL}$ is decreased to a write level. Writing operation is finished with a write enable signal $\overline{WE}$ being rising, and bit lines are charged by bit line load circuit 470.

In FIG. 61, the solid line L5 indicates bit line potential when bit lines are rapidly charged and normal operation is performed. If charging of bit lines after writing operation is finished is late with respect to switching of word lines, as shown by the broken line L6 in FIG. 61, the crossing of bit line potentials is late to cause a delay of access, or erroneous writing may occur as shown in the broken line L7.

Detailed circuit structure of a bit line load circuit is shown in FIGS. 62 and 63.

The bit line load circuit of FIG. 62 includes an equalize transistor P28, pull-up transistors P29, P30, and transfer gate transistors N47, N48 for transmitting signals of data buses WBa and WBb to bit line pair BL, $\overline{BL}$.

A signal Yi·WE obtained by logical product of a column selection signal and a write enable signal is applied to input terminal I61.

In reading operation, signal Yi·WE is at "L". Therefore, transistors P28–P30 turn on and transistors N47, N48 turn off. With cell current of a selected memory cell flowing to transistors P28–P30, potential difference is caused between bit lines BL, $\overline{BL}$. The potential difference is transmitted to read data buses RBa, RBb through the column selection circuit 480 of FIG. 59. Equalize transistor P28 acts to limit an amplitude of bit line potential.

In writing operation, a signal Yi·WE is at "H". Therefore transistors P28–P30 turn off and transistors N47 and N48 turn on. Potential of one of write data buses WBa and WBb attains "L" and the data of the write data bus is transferred to bit line BL or $\overline{BL}$ through transistor N47 or N48. At this time, transistors P28–P30 are OFF, so that write current does not flow to the bit line load circuit.

When writing operation is finished, potentials of write data buses WBa and WBb both attain "H". Bit lines of "L" are charged by write driver 490 of FIG. 59 through transistor N47 or N48. Also, with the end of writing operation, a signal Yi·WE changes to "L". Transistors P28–P30 thus turn on and bit lines are also charged by these transistors P28–P30.

In the bit line load circuit of FIG. 63, instead of pull-up transistors P29, P30 shown in FIG. 62, pull-up transistors N79 and N80 are provided.

In reading operation, a signal Yi·WE is at "L". Accordingly, transistor P28 is ON and transistors N47 and N48 are OFF. With cell current of a selected memory cell flowing to transistors P28, N79, N80, a potential difference is caused between bit lines BL and $\overline{BL}$. The potential difference is transferred to read data buses RBa and RBb through the column selection circuit 480 of FIG. 59.

In writing operation, a signal Yi·WE is at "H". Therefore, transistor P28 is OFF and transistors N47 and N48 are ON. Potential of one of write data buses WBa and WBb attains "L", and data of that data bus is transmitted to bit line BL or $\overline{BL}$ through transistor N47 or N48. At this time, although transistor P28 is OFF, transistors N79 and N80 are ON. Accordingly, write current flows to the bit line load circuit.

When writing operation is finished, potentials of write data buses WBa and WBb both attain "H". Bit lines which attain "L" are charged by write driver 490 of FIG. 59 through transistor N79 or N80 and transistor N47 or N48. Also, with the end of writing operation, a signal Yi·WE changes to "L". Accordingly, that bit line is also charged by transistor P28.

(g) Chip Layout (FIGS. 64–66)

FIGS. 64 and 65 show pin arrangement of 32KX8 TTL SRAM. FIG. 64 shows an example of corner power pin arrangement and FIG. 65 shows an example of dual center power pin arrangement.

In the corner power pin arrangement of FIG. 64, a GND pin and a VCC pin are respectively assigned to a fourteenth pin and a twenty-eighth pin at corners of the package. In the dual center power pin arrangement of FIG. 65, GND pins are assigned to the ninth pin and the twenty-fifth pin, and VCC pins are assigned to the eighth pin and the twenty-fourth pin.

The SRAMs of FIGS. 64 and 65 operate completely the same except for the pin arrangements.

Such a corner power pin arrangement has been often used in general SRAMs in conventional cases. However, in the center power pin arrangement, since power-supply pins such as GND pin and VCC pin are arranged in the center of the package, the length of power-supply interconnection is short and impedance component of power-supply interconnection is small, including interconnection of the frame of package and interconnection inside the chip. Therefore, the center power pin arrangement has a feature that it can suppress a voltage decrease of power-supply interconnection and output noise.

Therefore, use of center power pin arrangement as shown in FIG. 65 is on an increase these days mainly in high-speed SRAMs of multi-bits having a large capacity of 256K bits or more.

FIG. 66 is a diagram showing layout of the entirety of a chip of a SRAM using the center power pin arrangement.

The SRAM of FIG. 66 is a SRAM of the X4 structure including four output circuits 291a–294a. Memory cell arrays 1a and 1b are arranged on a chip CH and a global row decoder 4 of a division word line structure is arranged in a central portion of the chip CH.

Bit line load circuits 471 and 472 are each arranged on one side of each memory cell array 1a and 1b and column selection circuits 481 and 482 and sense amplifiers 421 and 422 are arranged on each of the other sides of memory cell arrays 1a and 1b.

In the center power pin arrangement, output pins are provided on both sides of a power-supply pin, so that output circuits 291a and 292a are arranged on one side portion of memory cell arrays 1a and 1b, and output circuits 293a and 294a are arranged on the other side portion of memory cell arrays 1a and 1b.

Read data buses RB1–RB4 are arranged on one side portion on the chip CH. Data read from memory cell arrays 1a and 1b are amplified by sense amplifiers 421 and 422, and transmitted to output circuits 291a–294a through read data buses RB1–RB4.

(h) Shift Redundancy Circuits (FIGS. 67–69)

A redundancy circuit is used for preventing a decrease of yield by replacing defective bits by spare bits. With an increase of capacity of RAM, it is becoming an important problem what redundancy system should be introduced.

A conceptual diagram of the shift redundancy system is shown in FIG. 67. The shift redundancy system is a method in which defective bits are sequentially replaced by adjacent bits by turning a switch provided in the middle of a decode path.

Normally, outputs D1–D4 of column decoder 450 are respectively connected to columns C1–C4 by switches S1–S4 of a column redundancy control circuit SW0. Each column includes a set of bit line pair and a plurality of memory cells connected thereto. If, as shown in FIG. 67, a defective bit exists in the second column C2 from left, outputs D2–D4 are respectively connected to columns C3, C4 and a redundant column RC1 by turning switches S2–S4.

FIG. 68 is a circuit diagram illustrating a detailed structure of the shift redundancy system of FIG. 67.

If fuses F1–F3, FE are in a connected state, transistor N60 is OFF. Accordingly, decoder outputs D1, D2, D3 are respectively connected to columns C1, C2, C3. Disconnecting only fuses F2, FE, decoder output D1 is connected to column C1 and decoder outputs D2, D3 are respectively connected to columns C3, C4.

Thus, the shift redundancy system has two features as follows. One is that a program circuit of a redundancy circuit is extremely simple. Another one is that a delay of access does not occur at all even if a defective bit is replaced since a selected path does not change.

FIG. 69 is a diagram illustrating one example of a global row decoder including a shift redundancy circuit.

As shown in FIG. 66, if a global row decoder 4 is provided in a center portion of a chip CH, global word lines exist on left and right sides of global row decoder 4.

In FIG. 69, row redundancy control circuit 50 includes a switch circuit SW10 including switches S11–S13. Outputs of global row decoder 4 are respectively connected to left global word lines WL1–WL3 and right global word lines WR–WR3 through switches S11–S13.

For example, if a defect exists in the third global word line WL3 from left, switch S13 is switched to the side of redundant global word lines REL, RER. The third global word lines WL3 and WR3 are thus replaced by redundant global word lines REL and RER.

(3) Recitation of Prior Art Literatures

(a) Input Buffer Circuit

Japanese Patent Laying-Open No. 60-142618, Japanese Patent Laying-Open No. 62-230221 and Japanese Patent Laying-Open No. 2-237313 disclose input buffer circuits in which speed up is attempted by substantially removing difference in delay time between a non-inverted signal and an inverted signal.

(b) Output Buffer Circuit

Japanese Patent Laying-Open No. 60-68718 discloses an output buffer circuit shown in FIG. 58 of the present application.

Japanese Patent Laying-Open No. 61-125222 discloses a technique of turning on a plurality of output transistors with time delay.

Japanese Patent Laying-Open No. 62-48806 discloses an output buffer circuit in which timings of turn-off of respective transistors in a first circuit and a second circuit are simultaneous and having different amounts of delay to slightly deviate timings of turn-on.

(c) Bit Line Load Circuit

R. A. Kertis et al., "A 12-ns ECL I/O 256KX1-bit SRAM Using a 1-$\mu$m BiCMOS Technology", IEEE J. Solid-State Circuits, vol. 23, No. 5, pp. 1048–1053, October 1988 discloses to use bipolar in bit line load and charge write bit lines at high speed.

(d) Architecture of Semiconductor Integrated Circuit Device

Japanese Patent Laying-Open No. 61-283162 and Japanese Patent Laying-Open No. 2-2668 (U.S. Pat. No. 4,982, 372) disclose to arrange a plurality of decoders on both sides of a memory array block, connect decoders on one side to every other selection lines and connect decoders on the other side to the remaining alternative selection lines.

(e) Redundancy Circuit

Japanese Patent Publication No. 61-35636, Japanese Patent Laying-Open No. 61-61300 and Japanese Patent Application No. 1-142450 (corresponding U.S. application Ser. No. 500,965) disclose shift redundancies.

Japanese Patent Laying-Open No. 62-250600 discloses to arrange redundancy control circuits on left and write of a decoder.

A. Ohba et al., "A 7-ns 1-Mb BiCMOS ECL SRAM with Shift Redundancy", IEEE J. Solid-State Circuits, vol. 26, No. 4, pp. 507–512, April 1991 discloses a SRAM in which a shift redundancy is used.

(f) Japanese Patent Laying-Open No. 60-170090 Discloses a BiCMOS SRAM.

(4) Problems to be Solved by the Invention

(a) Input Buffer Circuit

In the input buffer circuit shown in FIG. 46, complementary outputs with the same speed cannot be obtained because an output signal B delays from an output signal $\overline{B}$ by one stage of CMOS inverter.

Accordingly, it has a problem that multiselection is likely to be caused in the next stage of decoder circuit. It is possible that erroneous writing may be applied to a non-selection memory cell, or erroneous read may be applied to a non-selection memory cell due to such multiselection.

(b) WE Buffer Circuit

In the structure shown in FIG. 47, it is necessary to separately waveform-shape an output signal of WE buffer 18$a$ by WE waveform shaping circuit 19$a$ and OE waveform shaping circuit 23$a$ in order to obtain an internal write enable signal $\overline{\text{IWE}}$ and an internal output enable signal $\overline{\text{IOE}}$ with the timings shown in FIG. 48.

If an internal write enable signal which responds slowly to address change coming into a write state and responds quickly to address change coming into a read state, and an internal output enable signal which responds quickly to address change coming into a write state and responds slowly to address change coming into a read state can be simultaneously realized, the operation speed can be increased.

(c) Gate Circuit

If the design rule becomes strict for speed up in the BICMOS gate circuit or the BiNMOS gate circuit shown in FIG. 50, some measures must be taken for the hot carriers.

(d) Decoder Circuit

In the decoder circuit shown in FIG. 52, if the design rule becomes strict for speed up, some measures must be taken for hot carriers.

(e) Output Buffer Circuit

In the output buffer circuits 300 shown in FIGS. 53 through 58, in order to quicken a fall of an output signal of output terminal O41, it is necessary to increase the current driving capability of transistors of pull-down circuit 302.

In output buffer circuits shown in FIGS. 53, 56($a$) and ($b$), 57 and 58, an increase of size of NMOS transistor N67 can increase the current driving capability. In the pull-down circuit 302 shown in FIGS. 55($a$) and ($b$), the current driving capability can be increased by increasing the size of NMOS transistor N31 and increasing collector current of bipolar transistor B10.

An increase in current driving capability of transistors of pull-down circuit 302, however, causes rapid change of potential of output terminal O41, resulting in so-called ringing in which potential of output terminal O41 or the ground terminal fluctuates about a ground potential (approximately 0V). Such ringing may cause malfunction of other circuits which are to always receive ground potential.

Furthermore, a time required until the potential of output terminal O41 is stabilized at ground potential becomes long, so that an access time for the semiconductor integrated circuit device is increased.

Furthermore, an increase in the size of a NMOS transistor increases charge/discharge current flowing in the transistor when gate potential of that transistor changes. As a result, a signal transmission time of NMOS transistor increases.

Since current driving capability of a bipolar transistor is larger than current driving capability of MOS transistor, according to the pull-down circuit 302 shown in FIGS. 55($a$)

and (b), it is possible to enhance a falling speed of an output signal without largely increasing the size of NMOS transistor N31. Accordingly, the degradation of operation velocity due to an increase in charge/discharge current of NMOS transistor can be suppressed.

However, in the pull-down circuit 302 shown in FIGS. 55(a) and (b), when the potential of output terminal O41 is at "L", the NMOS transistor N31 is ON. Accordingly, a base and a collector of bipolar transistor B10 are electrically connected. Accordingly, it results in a PN diode equivalently connected between output terminal O41 and the ground terminal.

Therefore, the potential of output terminal O41 becomes higher than 0V depending on the magnitude of current flowing through bipolar transistor B10 from output terminal O41 to the ground terminal. For example, if current of 8 mA flows to bipolar transistor B10, base/emitter voltage of bipolar transistor B10 becomes 0.8V. Accordingly, the potential of output terminal O41 becomes 0.8V.

In a SRAM of which input/output signals are of TTL level, output potential of an output buffer circuit driving output current of 8 mA must be equal to or lower than 0.4V. Therefore, in a TTL SRAM in which the pull-down circuit 302 of FIGS. 55(a) and (b) are used, data can be outputted at high speed, but such standard cannot be satisfied.

(f) Bit Line Load Circuit

In the bit line load circuit shown in FIG. 62, since pull-up transistors P29 and P30 turn off in writing operation, write current does not flow. However, since bit lines are charged through pull-up transistors P29, P30 controlled by a signal Yi·WE after the writing operation is finished, the velocity of charging bit lines is low.

In the bit line load circuit shown in FIG. 63, since pull-up transistors N79 and N80 do not turn off in writing operation, the velocity of charging bit lines after the end of writing operation is high. However, a large writing current flows in writing operation.

(g) Chip Layout

In the chip layout shown in FIG. 66, it is necessary to connect read data buses RB1 and RB2 provided on the other side of memory cell arrays 1a and 1b to output circuits 291a and 292a provided on one side of memory cell arrays 1a and 1b. Therefore, read data buses RB1 and RB2 are longer than read data buses RB3 and RB4 by a length of memory cell arrays 1a and 1b in the bit line direction. As a result, a delay occurs in accessing.

(h) Shift Redundancy Circuit

In the shift redundancy circuit shown in FIG. 67, defects of continuous two bits cannot be repaired. Defects of continuing two bits occur when a defect occurs over two memory cells. Such a defect relatively often occurs, so that a repairing rate is largely affected by whether a 2-bit defect can be made up or not.

In the shift redundancy circuit shown in FIG. 69, for example, when defects occur in the left third global word line WL3 and the right second global word line WR2, both of such defects cannot be repaired.

A redundancy system is desired in which defects in a left global word line and a right global word line can be separately repaired without increasing the number of redundant global word lines.

SUMMARY OF THE INVENTION

It is an object of the present invention to provide a semiconductor integrated circuit device capable of high speed operation.

It is another object of the present invention to provide an input buffer circuit capable of obtaining complementary outputs with the same speed and capable of high speed operation.

It is still another object of the present invention to provide an input buffer circuit capable of obtaining a first output signal which slowly responds to change of an input signal from a first logic level to a second logic level and quickly responds to change of an input signal from the second logic level to the first logic level and a second output signal which rapidly responds to change of an input signal from the first logic level to the second logic level and slowly responds to a change of an input signal from the second logic level to the first logic level, and capable of high speed operation.

It is yet another object of the present invention to provide a gate circuit having high hot carrier tolerance and capable of high speed operation.

It is still another object of the present invention to provide a decoder circuit having high hot carrier tolerance and a small layout area and capable of high speed operation.

It is yet another object of the present invention to provide an output buffer circuit in which ringing is not caused, output signals do not depart from predetermined standards, consumption power is low, and high speed operation can be performed.

It is still another object of the present invention to provide an output buffer circuit in which no ringing is caused, an output signal does not get out of a predetermined standard, the consumption power is low, and a rise and a fall of an output signal is quick.

It is yet another object of the present invention to provide a bit line load circuit in which write current does not flow and bit lines can be charged at high speed after writing is finished.

It is still another object of the present invention to provide architecture of a semiconductor integrated circuit capable of shortening interconnection and capable of high speed operation.

It is yet another object of the present invention to provide a shift redundancy circuit capable of repairing a continuous two-bit defect and also capable of high speed operation.

It is still another object of the present invention to provide a shift redundancy circuit capable of repairing separate defects in each of first and second blocks in a structure in which a selection circuit is provided between the first and second blocks and also capable of high speed operation.

(1) A semiconductor integrated circuit device according to the present invention includes a non-inversion circuit, an inversion circuit, a first push-pull circuit and a second push-pull circuit.

The non-inversion circuit includes a series connection of a first bipolar transistor and a first field effect transistor and is responsive to an input signal for supplying a first output signal from a common node of the first bipolar transistor and the first field effect transistor. The inversion circuit includes a series connection of second and third field effect transistors and is responsive to the input signal for supplying a second output signal from a common mode of the second and third field effect transistors. The first push-pull circuit includes a series connection of a second bipolar transistor and a fourth field effect transistor for supplying a third output signal from a common node of the second bipolar transistor and the fourth field effect transistor in response to the first and second output signals. The second push-pull circuit includes a series connection of a third bipolar transistor and a fifth field effect transistor for supplying a fourth output signal from a common node of the third bipolar transistor and the fifth field effect transistor in response to the first and second output signals. The fourth output signal is complementary to the third output signal.

In the semiconductor integrated circuit device, the number of stages from an input node for receiving the input signal to a first output node for supplying the first output signal is the same as the number of stages from the input node to a second output node for supplying the second output signal.

Also, the first and second push-pull circuits include bipolar transistors having high driving capability.

Accordingly, complementary outputs with the same speed can be obtained and high speed operation is possible.

As described above, an input buffer circuit capable of obtaining complementary outputs with the same speed and capable of high speed operation can be obtained.

(2) A semiconductor integrated circuit device according to another aspect of the present invention includes an input node receiving an input signal of a first or a second logic level, first and second output nodes, a non-inversion circuit, a first inversion circuit, a second inversion circuit, and a first push-pull circuit and a second push-pull circuit.

The non-inversion circuit includes a series connection of a first bipolar transistor and a first field effect transistor and is responsive to the input signal for supplying an output signal from a common node of the first bipolar transistor and the first field effect transistor. The first inversion circuit includes a series connection of second and third field effect transistors and is responsive to the input signal for supplying an output signal from a common node of the second and third field effect transistors. The second inversion circuit includes fourth and fifth field effect transistors and is responsive to the input signal for supplying an output signal from a common node of the fourth and fifth field effect transistors.

The first push-pull circuit includes a second bipolar transistor and a sixth field effect transistor and is responsive to the output signal from the non-inversion circuit and the output signal from the first inversion circuit for supplying a first output signal from a common node of the second bipolar transistor and the sixth field effect transistor. The second push-pull circuit includes a third bipolar transistor and a seventh field effect transistor and is responsive to the output signal from the second inversion circuit for supplying a second output signal from a common node of the third bipolar transistor and the seventh field effect transistor.

Logic threshold values of first to fifth field effect transistors are set so that the first output signal responds slowly to change of an input signal from a first logic level to a second logic level and responds rapidly to change of an input signal from the second logic level to the first logic level and a second output signal rapidly responds to change of an input signal from the first logic level to the second logic level and slowly responds to change of an input signal from the second logic level to the first logic level.

In the semiconductor integrated circuit device, by adjusting logic threshold values of field effect transistors included in the non-inversion circuit, the first and second inversion circuits, and the first and second push-pull circuits, a first output signal which responds slowly to change of an input signal from the first logic level to the second logic level and rapidly responds to change of an input signal from the second logic level to the first logic level, and a second output signal which rapidly responds to change of an input signal from the first logic level to the second logic level and slowly responds to change of an input signal from the second logic level to the first logic level can be simultaneously obtained.

Also, the first and second push-pull circuits include bipolar transistors with high driving capability. Accordingly, high speed operation can be implemented.

As described above, a write enable buffer circuit can be obtained in which erroneous writing is not caused, a read time is short and high speed operation is possible.

(3) A semiconductor integrated circuit device according to another aspect of the present invention includes a logic circuit, a push-pull circuit and a voltage setting circuit.

The logic circuit includes a first field effect transistor responsive to an input signal for setting a first node at a first potential and a second field effect transistor responsive to the input signal for setting the first node at a second potential. The push-pull circuit includes a pull-up circuit and a pull down circuit connected in series and for supplying an output signal to a second node. The pull-up circuit includes a first bipolar transistor responsive to a potential at the first node. The voltage setting circuit sets low a drain voltage of the first field effect transistor.

In the semiconductor integrated circuit device, the drain voltage of the first-field effect transistor is reduced by the voltage setting circuit. Accordingly, hot carrier resistance is improved and reliability is enhanced.

Also, the push-pull circuit includes a bipolar transistor with high driving capability. Accordingly, high speed operation can be realized.

As described above, a gate circuit with enhanced hot carrier resistance, high reliability and capable of high speed operation can be obtained.

(4) A semiconductor integrated circuit device according to another aspect of the present invention includes a plurality of input nodes respectively receiving input signals, a plurality of output nodes, a plurality of logic gate circuits provided corresponding to the plurality of output nodes, a plurality of push-pull circuits provided corresponding to the plurality of output nodes and a voltage setting circuit.

Each of the plurality of logic gate circuits includes a first field effect transistor responsive to any of the input signals for setting a predetermined node at a first potential and a second field effect transistor responsive to any of the input signals for setting the predetermined node at a second potential. Each of the plurality of push-pull circuits includes a pull-up circuit and a pull-down circuit connected in series and for supplying an output signal to a corresponding output node. The voltage setting circuit is provided in common to the plurality of logic gate circuits for setting low a drain voltage of the first field effect transistor in each of the plurality of logic gate circuits.

In the semiconductor integrated circuit device, the drain voltage of a first field effect transistor of each logic gate circuit is reduced by the voltage setting circuit. Accordingly, hot carrier resistance is enhanced and reliability is improved.

Also, the voltage setting circuit is provided in common for a plurality of logic gate circuits. Accordingly, an increase of layout area can be suppressed.

Furthermore, the plurality of push-pull circuits include bipolar transistors with high driving capability. Accordingly, high speed operation is possible.

As described above, a decoder circuit can be obtained in which hot carrier resistance is enhanced while suppressing an increase of layout area and also capable of high speed operation.

(5) A semiconductor integrated circuit device according to another aspect of the present invention includes an input node receiving an input signal of a first or a second logic level, an output node, a bipolar transistor, and a field effect transistor.

The bipolar transistor is responsive to switch of an input signal at an input node from a second logic level to a first logic level for flowing current for a predetermined time to a predetermined potential source from the output node. The field effect transistor operates to flow current from the output node to the predetermined potential source when a predetermined time has passed after start of operation of the bipolar transistor.

In the semiconductor integrated circuit device, the bipolar transistor flows current for a predetermined time to the predetermined potential source from the output node in response to switch of an input signal from the second logic level to the first logic level, and the field effect transistor flows current to the predetermined potential source from the output node after a predetermined time has passed from start of operation of the bipolar transistor. Accordingly, larger current flows to the bipolar transistor first, and subsequently, smaller current flows to the field effect transistor.

Therefore, the potential of the output node rapidly changes firstly, and it changes moderately thereafter. As a result, ringing occurring in an output signal is suppressed and consumption power is reduced.

Also, since a field effect transistor is provided, a level of output signal can be easily set to satisfy a predetermined standard.

Furthermore, since the push-pull circuit includes a bipolar transistor with high driving capability, high speed operation can be realized.

As described above, an output buffer circuit can be obtained by which an output which satisfies a standard of a TTL semiconductor integrated circuit device can be obtained and in which occurrence of ringing is suppressed, and capable of high speed operation with low consumption power.

(6) A semiconductor integrated circuit device according to another aspect of the present invention includes an input node receiving an input signal of a first or a second logic level, an output node, first and second potential sources, a push-pull circuit including first and second bipolar transistors, a field effect transistor, and a third bipolar transistor.

The first bipolar transistor is responsive to switching of an input signal at the input node from the second logic level to the first logic level for flowing current to the second potential source from the output node. The second bipolar transistor is responsive to switching of an input signal at an input node from the first logic level to the second logic level to flow current to the output node from the first potential source. The field effect transistor operates to flow current to the second potential source from the output node when a predetermined time has passed after start of operation of the first bipolar transistor. The third bipolar transistor operates to flow current to the output node from the first potential source when a predetermined time has passed after start of operation of the second bipolar transistor.

In the semiconductor integrated circuit device, the first bipolar transistor flows current from the output node to the second potential source in response to switching of an input signal from the second logic level to the first logic level, and after a predetermined time has passed, the field effect transistor flows current to the second potential source from the output node. Also, the second bipolar transistor flows current to the output node from the first potential source in response to switching of an input signal from the first logic level to the second logic level, and after a predetermined time has passed, the third bipolar transistor flows current from the first potential source to the output node. Accordingly, potential at the output node rapidly changes firstly, and subsequently, it changes moderately.

Therefore, the rate of change in time of current is reduced.

As a result, ringing occurring in a rise and a fall of an output signal is suppressed and consumption power is reduced.

Also, since a field effect transistor is provided, a level of an output signal can be easily set to satisfy a predetermined standard.

Furthermore, the push-pull circuit includes first and second bipolar transistors with high driving capability. Accordingly, high speed operation is possible in a rise and a fall of an output signal.

As described above, an output buffer circuit is obtained in which an output satisfying the standard of TTL semiconductor integrated circuit device can be obtained, occurrence of ringing is suppressed and high speed operation is possible in a rise and a fall of an output signal.

(7) The semiconductor integrated circuit device according to another aspect of the present invention includes a plurality of bit line pairs, a write data line pair receiving write data, a selection signal generating circuit, a plurality of bit line load circuits and a write signal generating circuit.

The selection signal generating circuit generates a plurality of selection signals respectively selecting a plurality of bit line pairs. The plurality of bit line load circuits are provided to the plurality of bit line pairs, respectively. The write signal generating circuit generates a write signal for designating write operation.

Each of the plurality of bit line load circuits includes a first charge circuit, a transmitting circuit and a second charge circuit. The first charge circuit is controlled by a write signal and a corresponding selection signal and charges a corresponding bit line pair to a predetermined potential. The transmitting circuit is controlled by a write signal and a corresponding selection signal and transfers write data of a write data line pair to a corresponding bit line pair. The second charge circuit is controlled by potential of a write data line pair and charges a corresponding bit line pair to a predetermined potential.

In the semiconductor integrated circuit device, the first charge circuit included in each bit line load circuit is controlled by a write signal and a corresponding selection signal, so that write current does not flow.

Also, the second charge circuit included in each bit line load circuit is controlled by potential of a write data line pair, so that a bit line pair can be rapidly charged after end of writing.

As described above, a bit line load circuit can be obtained in which write current does not flow, and capable of charging bit lines at high speed after end of writing operation.

(8) A semiconductor integrated circuit device according to another aspect of the present invention includes a plurality of bit line pairs, a plurality of first bit line control circuits provided on one of end sides of the plurality of bit line pairs, and a plurality of second bit line control circuits provided on the other one of end sides of the plurality of bit line pairs.

Each of the plurality of first bit line control circuits includes a charging circuit for charging bit line pairs to predetermined potential, a first transferring circuit for transferring write data to a bit line pair, and a second transferring circuit for transferring read data of bit line pair. Each of the plurality of second bit line control circuits includes a charging circuit for charging bit lien pairs to predetermined potential, a first transferring circuit for transferring write data to bit line pairs, and a second transferring circuit for transferring read data of bit line pairs. The plurality of bit line pairs are alternately connected to the first bit line control circuit and the second bit line control circuit.

In the semiconductor integrated circuit device, a plurality of first bit line control circuits are arranged on one of end sides of the plurality of bit line pairs, the plurality of second bit line control circuits are arranged on the other one of end sides of the plurality of bit line pairs, and the plurality of bit line pairs are alternately connected to the first bit line control circuits and the second bit line control circuits. Accordingly, a length of interconnection is reduced and access speed is enhanced.

As described above, architecture of a semiconductor integrated circuit device having shortened interconnection and capable of high speed operation is obtained.

(9) A semiconductor integrated circuit device according to another aspect of the present invention includes a plurality of selection lines, first and second spare selection lines provided adjacent the plurality of selection lines, a first selection circuit, a second selection circuit, a first defect repairing circuit, and a second defect repairing circuit.

The first selection circuit is provided on one end side of the plurality of selection lines and selects any of the plurality of selection lines. The second selection circuit is provided on the other end side of the plurality of selection lines and selects any of the plurality of selection lines. The plurality of selection lines are alternately connected to the first and second selection circuits.

The first defect repairing circuit couples the first spare selection line to the first selection circuit and changes coupling of the selection lines to the first selection circuit when there is a defect in one of the plurality of selection lines coupled to the first selection circuit. The second defect repairing circuit couples the second spare selection line to the second selection circuit and changes coupling of the selection lines to the second selection circuit when there is a defect in one of the plurality of selection lines coupled to the second selection circuit.

In the semiconductor integrated circuit device, the first selection circuit is provided on one end side of the plurality of selection lines, the second selection circuit is provided on the other end side of the plurality of selection lines, and the plurality of selection lines are alternately connected to first and second selection circuits. Also, coupling of the plurality of selection lines and a spare selection line with the first and second selection circuits can be shifted by the first and second defect repairing circuits. Therefore, a continuous 2-bit defect can also be repaired.

Even when a bit defect is repaired, a length of an access path is not changed, so that a delay is not caused in accessing. As a result, high speed operation is realized.

As described above, a shift redundancy circuit can be obtained in which a continuous 2-bit defect can be repaired and high speed operation is possible.

(10) A semiconductor integrated circuit device according to another aspect of the present invention includes a first block including a plurality of selection lines and a spare selection line, a second block including a plurality of selection lines and a spare selection line, a selection circuit, a first defect repairing circuit and a second defect repairing circuit.

The selection circuit is provided between the first block and the second block, and applies a selection signal to each selection line in the first block and each selection line in the second block.

The first defect repairing circuit applies any of selection signals of the selection circuit to an adjacent selection or spare selection line when there is a defect in one of the plurality of selection lines in the first block. The second defect repairing circuit applies any of selection signals of the selection circuit to an adjacent selection or spare selection line when there is a defect in one of the plurality of selection lines in the second block.

In the semiconductor integrated circuit device, a selection circuit is provided between the first block and the second block, and it is possible to individually shift coupling between each selection signal of the selection circuit and each selection line or spare selection line in the first block and coupling between each selection signal of the selection circuit and each selection line or spare selection line in the second block by the first and second defect repairing circuits. Therefore, defects can be independently repaired in each of the first and second blocks.

Also, since a length of an access path does not change when repairing a defect, a delay does not occur in access. Accordingly, high speed operation can be realized.

As described above, a shift redundancy circuit can be obtained capable of independently repairing a defect in each of the first and second blocks without increasing the number of redundant selection lines in a structure in which a selection circuit is provided between the first and second blocks, and also capable of high speed operation.

According to the above-described invention, a semiconductor integrated circuit device capable of high speed operation is obtained.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 54 is a diagram showing another example of a pull-up circuit.

FIG. 55 is a diagram showing another example of a pull-down circuit.

FIG. 67 is a diagram showing concept of a conventional shift redundancy circuit.

Figure 1:
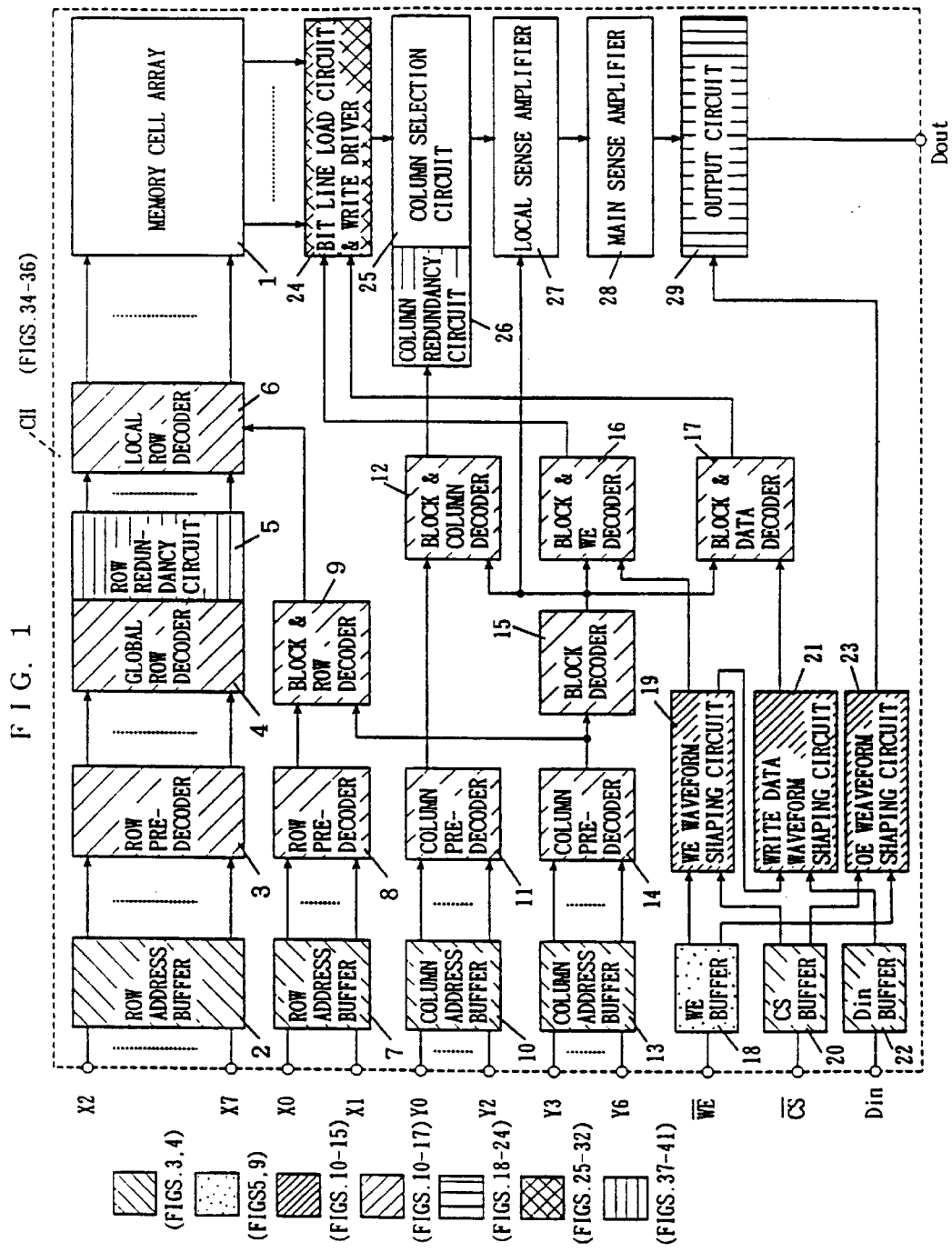
FIG. 1 is a diagram illustrating schematic structure of the entirety of a SRAM according to one embodiment of the present invention.
Figure 2:
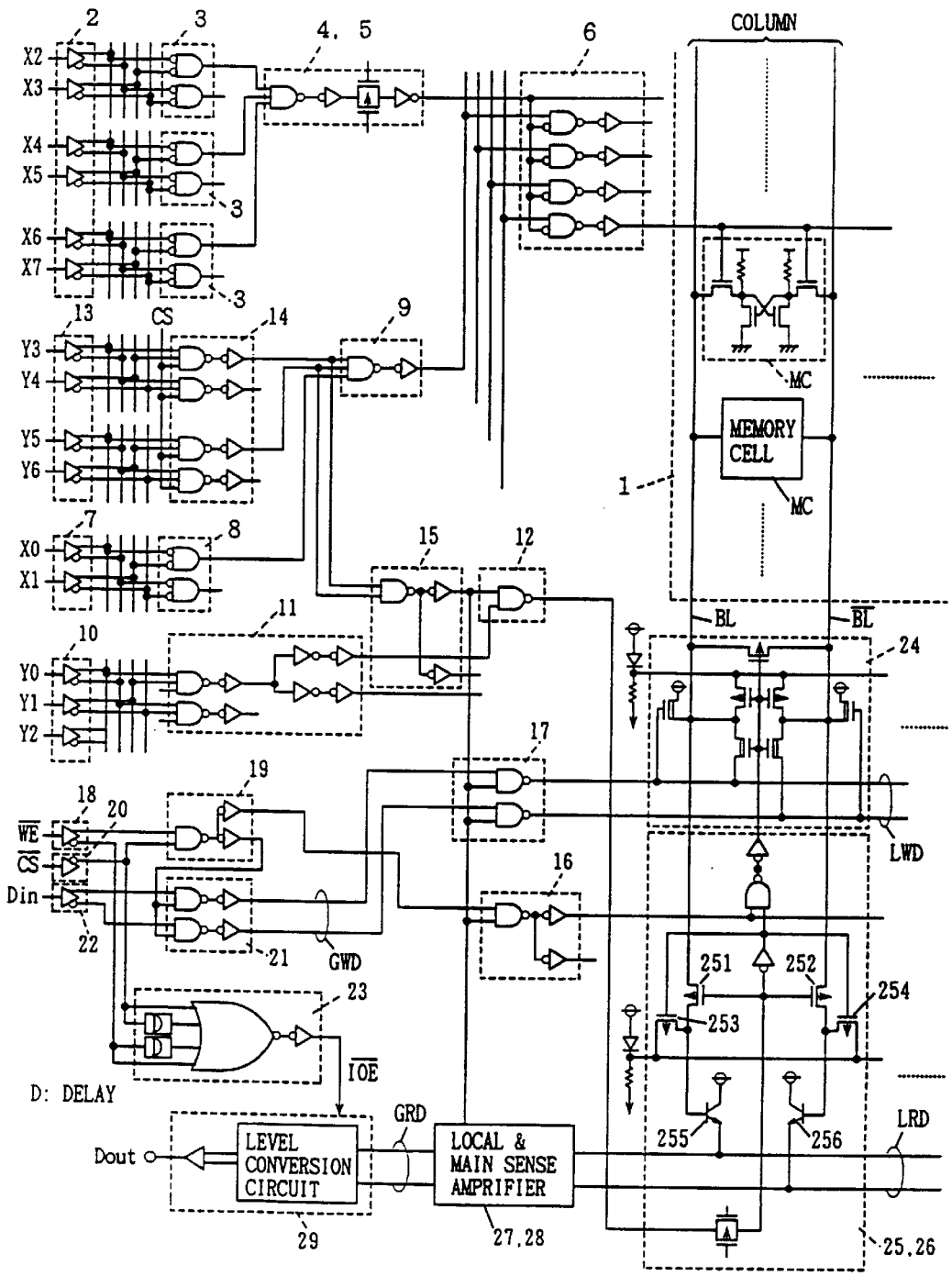
FIG. 2 is a diagram illustrating a structure of a main portion of the SRAM of FIG. 1.

DESCRIPTION OF THE PREFERRED EMBODIMENTS (1) Schematic structure of the entirety of SRAM of embodiment (FIGS. 1 and 2)

FIG. 1 is a block diagram showing a schematic structure of the entirety of a SRAM according to one embodiment of the present invention. FIG. 2 is a diagram showing in detail a structure of a main portion of the SRAM of FIG. 1.

A memory cell array 1 includes a plurality of memory cells provided in 256 columns and 128 rows. The memory cell array 1 is divided into 16 blocks, and each block includes memory cells arranged in 256 columns and 8 rows.

A divisional word line structure is used in the SRAM. 64 global word lines are provided in memory cell array 1, and a plurality of local word lines are provided corresponding to each global word line.

A row address buffer 2 receives row address signals X2–X7 and applies the same to a row predecoder 3. Row predecoder 3 predecodes the row address signals and applies the predecoded signals to a global row decoder 4. Global row decoder 4 selects any of a plurality of global word lines in memory cell array 1 in response to a predecoded signal.

A row redundancy circuit (row repairing circuit) 5 is connected to global row decoder 4. Local row decoder 6 selects any of a plurality of local word lines corresponding to a selected global word line.

Row address buffer 7 receives row address signals X0, X1 and applies the same to a row predecoder 8. Row predecoder 8 predecodes the row address signals and applies the same to a block & row decoder 9.

A column address buffer 10 receives column address signals Y0–Y2 and applies the same to a column predecoder 11. Column predecoder 11 predecodes the column address signals and applies the predecoded signals to a block & column decoder 12.

A column address buffer 13 receives column address signals Y3–Y6 and applies the same to a column predecoder 14. Column predecoder 14 predecodes the column address signals and applies a predecoded signal to block & row decoder 9 and a block decoder 15.

An output signal of block & row decoder 9 is applied to a local row decoder 6. Block decoder 15 decodes a predecoded signal and applies a decoded signal to block & column decoder 12, a block & WE decoder 16, a block & data decoder 17 and a local sense amplifier 27.

A WE buffer 18 receives a write enable signal $\overline{WE}$ and applies the same to a WE waveform shaping circuit 19 and an OE waveform shaping circuit 28. A CS buffer 20 receives a chip select signal $\overline{CS}$ and applies the same to WE waveform shaping circuit 19 and OE waveform shaping circuit 23. A Din buffer 22 receives input data Din and applies the same to a write data waveform shaping circuit 21. An output signal of WE waveform shaping circuit 19 is applied to block & WE decoder 16 and write data waveform shaping circuit 21. An output signal of write data waveform shaping circuit 21 is applied to block & data decoder 17.

An output signal of block & WE decoder 16 and an output signal of block & data decoder 17 are applied to a bit line load circuit & write driver 24. An output signal of block & column decoder 12 is applied to a column selection circuit 25 through a column redundancy circuit (column repairing circuit) 26. Local sense amplifier 27 is connected to an output circuit 29 through a main sense amplifier 28. An output signal of OE waveform shaping circuit 23 is applied to output circuit 29. Output data Dout is obtained from an output circuit 29.

The above-described circuits 1 through 29 are formed on a semiconductor chip CH.

Selection of global word lines inside memory cell array 1 is made by row address signals X2–X7. Selection of blocks in memory cell array 1 is made with column address signals Y3–Y6. Selection of columns in each block inside memory cell array 1 is made with logical product of a column selection signal produced from column address signals Y0–Y2 and a block selection signal. Selection of local word lines in each block in memory cell array 1 is made with logical product of a signal obtained from a block selection signal and row address signals X0, XY and a selection signal of global word line.

Each of write data buses and read data buses is divided into global data buses GWD, GRD and local data buses LWD, LRD. Respective local data buses LWD, LRD are provided corresponding to each block of memory cell array 1. Only local data buses LWD, LRD corresponding to a block selected with a block selection signal is activated.

Referring to FIG. 2, in reading operation, transistors 251, 252 inside column selection circuits & column redundancy circuits 25, 26 corresponding to a selected column turn on and transistors 253 and 254 turn off. Thus, voltage amplitude of a bit line pair BL, $\overline{BL}$ is transmitted to bases of transistors 255 and 256, and local read data bus LRD is driven by transistors 255 and 256. As a result, the voltage amplitude of bit lines is amplified by local & main sense amplifiers 27 and 28.

Transistors 251 and 252 in column selection circuit & column redundancy circuit 25 and 26 corresponding to an unselected column turn off and transistors 253 and 254 turn on. Thus, bases of transistors 255 and 256 are set to potential lower than the potential of bases of transistors 255 and 256 in a selected column.

Figure 3:
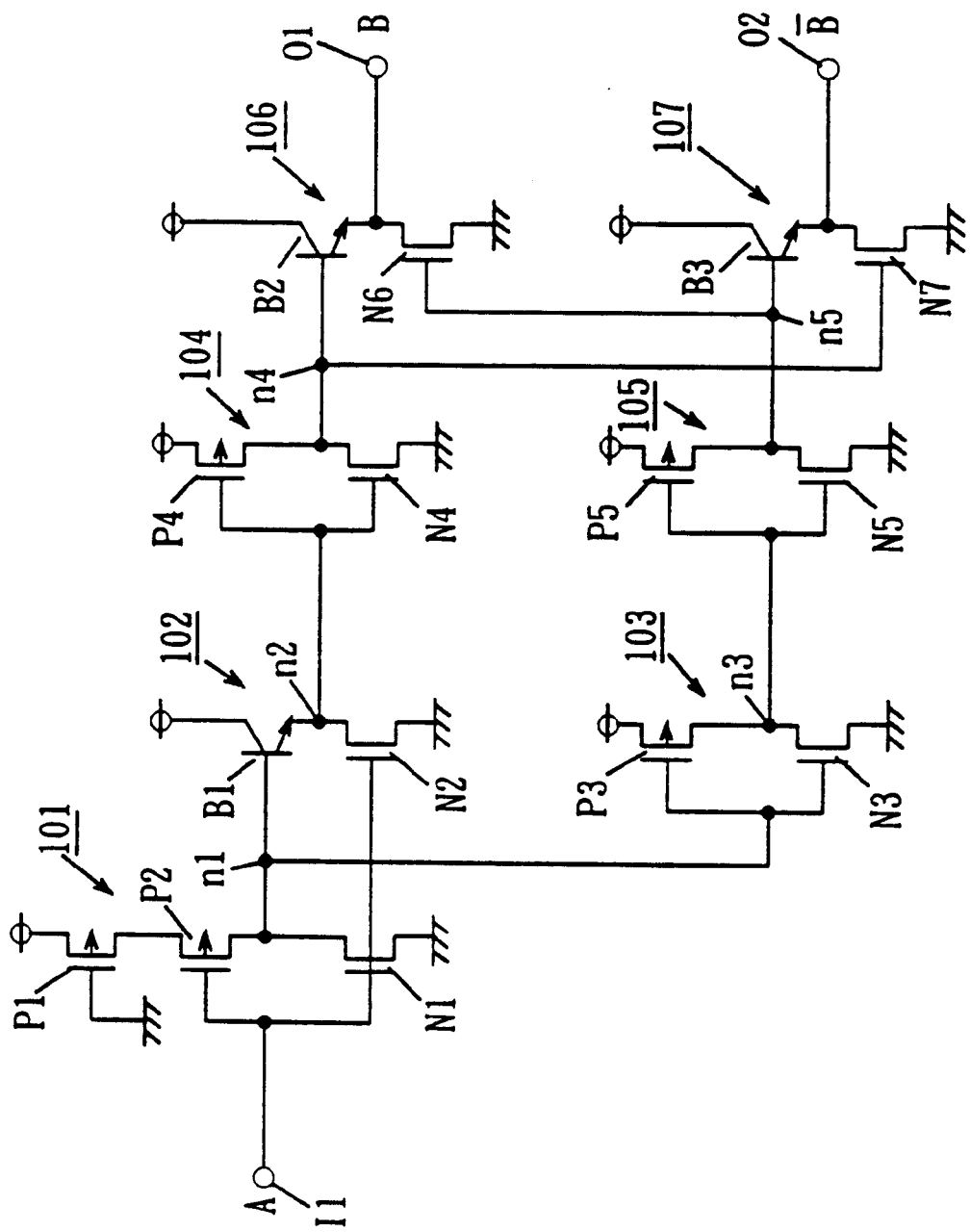
FIG. 3 is a diagram illustrating one example of an input buffer circuit.
Figure 4:
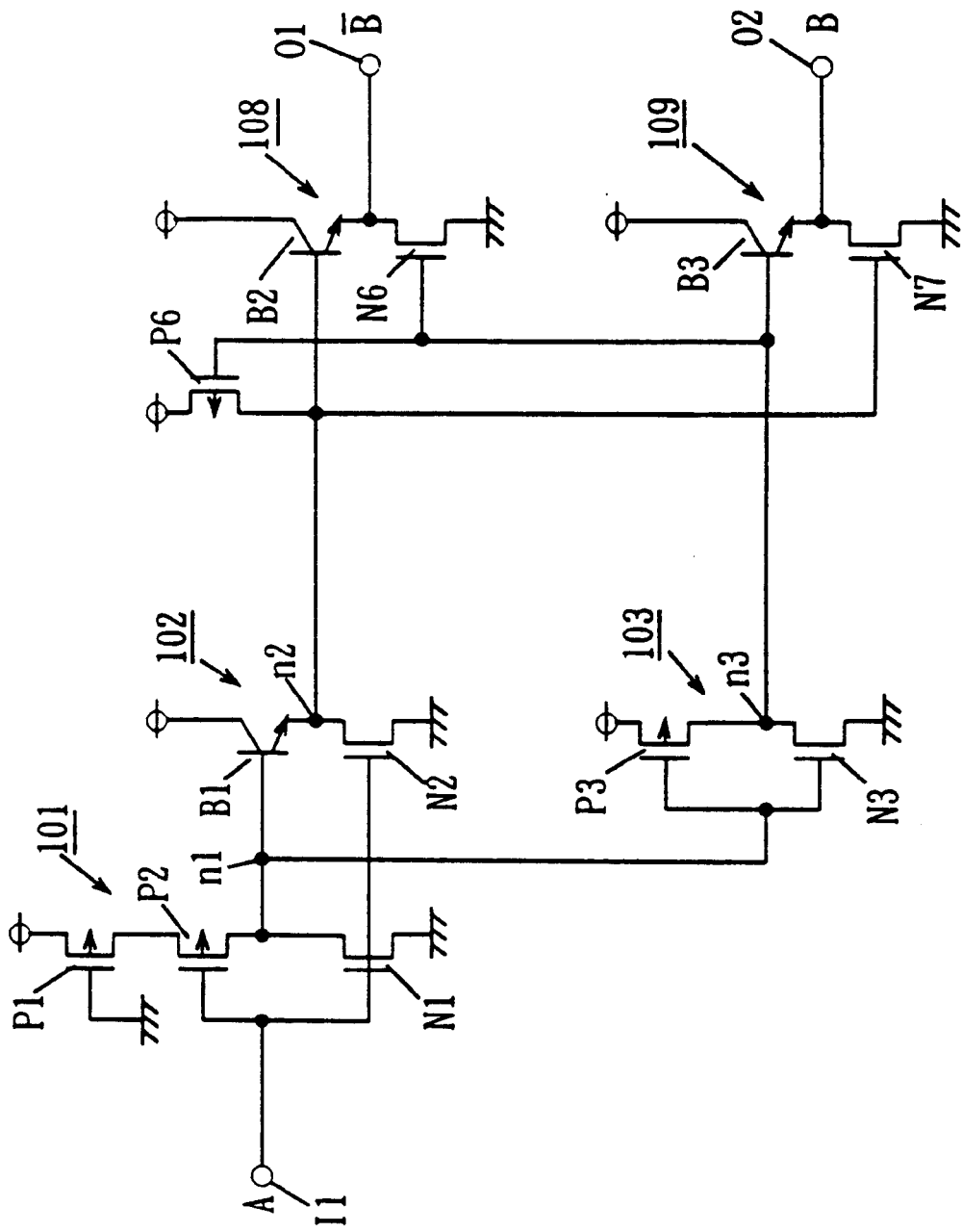
FIG. 4 is a diagram illustrating another example of an input buffer circuit.

(2) Detailed Structure of Each Portion of SRAM of Embodiment (a) Input Buffer Circuit (FIGS. 3 and 4)

Input buffer circuits shown in FIGS. 3 and 4 are used in row address buffers 2 and 7, column address buffers 10 and 13, CS buffer 20 and Din buffer 22 in FIG. 1.

First, the input buffer circuit of FIG. 3 will be described. An input terminal I1 receives an input signal A. A CMOS inverter including transistors P1, P2, N1 is connected between input terminal I1 and a node n1. A BiNMOS inverter 102 including transistors B1, N1 is connected between node n1 and a node n2 and a CMOS inverter 103 including transistors P3 and N3 is connected between node n1 and a node n3.

A CMOS inverter 104 including transistors P4, N4 is connected between node n2 and a node n4, and a CMOS inverter 105 including transistors P5 and N5 is connected between node n3 and a node n5. A BiNMOS push-pull circuit 106 including transistors B2 and N6 is connected between node n4 and an output terminal O1, and a BiNMOS push-pull circuit 107 including transistors B3 and N7 is connected between node n5 and an output terminal O2.

A base of transistor B2 and a gate of transistor N7 are connected to node n4, and a gate of transistor N6 and a base of transistor B3 are connected to node n5.

A power-supply terminal receives power-supply potential Vcc, and a ground terminal receives ground potential GND. In a semiconductor integrated circuit device of TTL interface, the power-supply potential Vcc is set to 5V, and the ground potential GND is set to 0V.

In CMOS inverter 101, a logical threshold value is adjusted by increasing a size of transistor N1.

BiNMOS non-inverter (driver) 102 transmits an output of CMOS inverter 101 as it is. CMOS inverter 103 inverts and transmits an output of CMOS inverter 101. BiNMOS push-pull circuits 106 and 107 act as driver circuits.

When an input signal A is at "H", transistor P2 turns off and transistors N1 and N2 turn on. Thus, potential at node n1 attains "L". Accordingly, potential at node n2 attains "L" and potential at node n3 attains "H". Thus, potential at node n4 attains "H" and potential at node n5 attains "L". As a result, an output signal B of output terminal O1 attains "H" and an output signal $\overline{B}$ of output terminal O2 attains "L".

When an input signal A is at "L", transistor P2 turns on and transistors N1 and N2 turn off. Thus, potential at node n1 attains "H". Accordingly, potential at node n2 attains "H" and potential at node n3 attains "L". Thus, potential at node n4 attains "L" and potential at node n5 attains "H". As a result, an output signal B of output terminal O1 attains "L", and an output signal $\overline{B}$ of output terminal O2 attains "H".

In the input buffer circuit of FIG. 3, the number of stages from input terminal A to output terminal O1 and the number of stages from input terminal A to output terminal O2 are both four, so that complementary outputs with the same speed can be obtained.

Also, since the last stage of the input buffer circuit is formed of BiNMOS push-pull circuits 106 and 107, high speed operation is accomplished by high driving capability of bipolar transistor.

Next, the input buffer circuit of FIG. 4 will be described. In the input buffer circuit of FIG. 4, CMOS inverters 104 and 105 in the input buffer circuit of FIG. 3 are removed, and a transistor P6 is connected instead.

Without transistor P6, a "H" level of base potential of a transistor B3 is Vcc–VBE. Now, VBE is base-emitter voltage of a bipolar transistor. By providing transistor P6, the "H" level of base potential of transistor B3 is set to Vcc. Operation of the input buffer circuit of FIG. 4 is the same as the operation of the input buffer circuit of FIG. 3.

(b) WE buffer Circuit (FIGS. 5–9)

WE buffer circuits shown in FIGS. 5 through 9 are used in WE buffer 18 in FIG. 1.

First, the WE buffer circuit of FIG. 5 will be described. An input terminal I11 receives a write enable signal $\overline{WE}$. A CMOS inverter 101 including transistors P7, P8 and N8 is connected between input terminal I11 and a node n11.

A BiNMOS non-inverter 102 including transistors B4, N10 is connected between a node n11 and a node n12, a CMOS inverter 110 including transistors P9, N12 is connected between node n11 and node n12, and a CMOS inverter 111 including transistors P10, N13 is connected between node n11 and a node n14.

A transistor N9 is connected between node n11 and a ground terminal and a transistor N11 is connected between node n12 and the ground terminal. A signal ncsa is applied to gates of transistors P7, N9, and N11.

A BiNMOS push-pull circuit 112 including transistors B5 and N11 is connected between node n12 and an output terminal O11, and a BiCMOS push-pull circuit 113 including transistors P12, N15, B6, N16 is connected between node n14 and an output terminal O12. A transistor P11 is connected between node n12 and a power-supply terminal. A gate of transistor P11 and a gate of transistor N14 are connected to a node n13.

An output signal WEA1 is obtained from output terminal O11 and an output signal WEA2 is obtained from output terminal O12.

By increasing a size of transistor P9 of CMOS inverter 110 (increasing driving capability) and decreasing a size of transistor N12 (decreasing driving capability), a rise point of output signal WEA1 is made late and a fall point is made early.

For example, a gate width of transistor P9 is set to 40 µm and a gate width of transistor N12 is set to 5 µm.

Also, by reducing a size of transistor P10 of CMOS inverter 112 (decreasing driving capability), increasing a size of transistor N13 (increasing driving capability), and further increasing a size of transistor P12 of BiCMOS push-pull circuit 113 (increasing driving capability) and decreasing sizes of transistors N15 and N16 (decreasing driving capability), a rise point of an output signal WEA2 is made early and a fall point is made late.

For example, a gate width of transistor P10 is set to 5 µm, a gate width of transistor N13 is set to 25 µm, a gate width of transistor P12 is set to 40 µm, and gate width of transistors N15 and N16 are respectively set to 5 µm and 10 µm.

Waveforms of a write enable signal $\overline{WE}$, nodes nil, n12, n13, n14 and output signals WEA1 and WEA2 with the sizes of transistors being set as described above are shown in FIG. 6.

Figure 6:
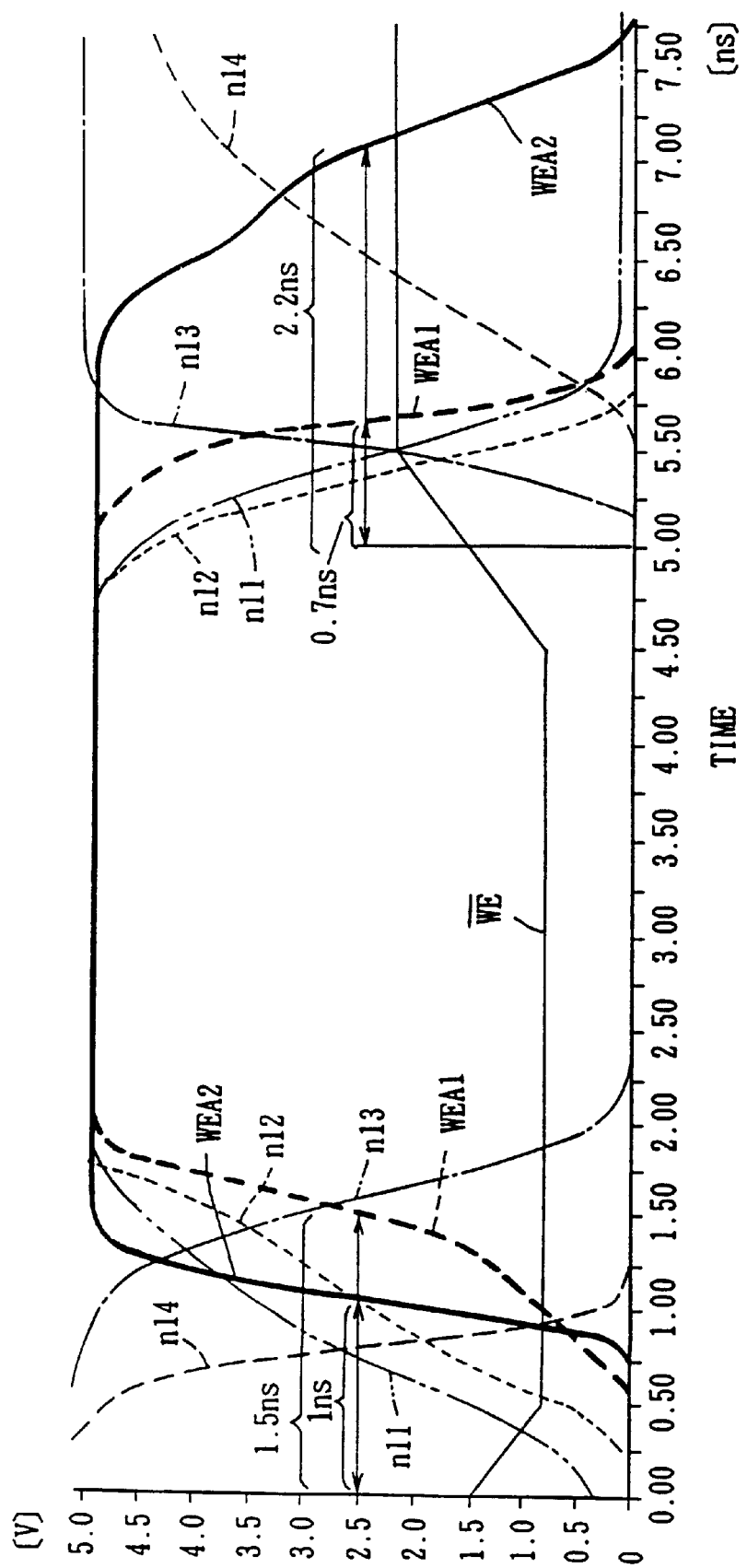
FIG. 6 is a diagram showing a voltage waveform of each portion of the WE buffer circuit.

As shown in FIG. 6, a time from a fall point of a write enable signal $\overline{WE}$ to a rise point of an output signal WEA1 is 1.5 ns, and a time from a fall point of a write enable $\overline{WE}$ to a rise point of an output signal WEA2 is 1 ns. Also, a time from a rise point of a write enable $\overline{WE}$ to a fall point of an output signal WEA1 is 0.7 ns and a time from a rise point of a write enable signal $\overline{WE}$ to a fall point of an output signal WEA2 is 2.2 ns.

Figure 5:
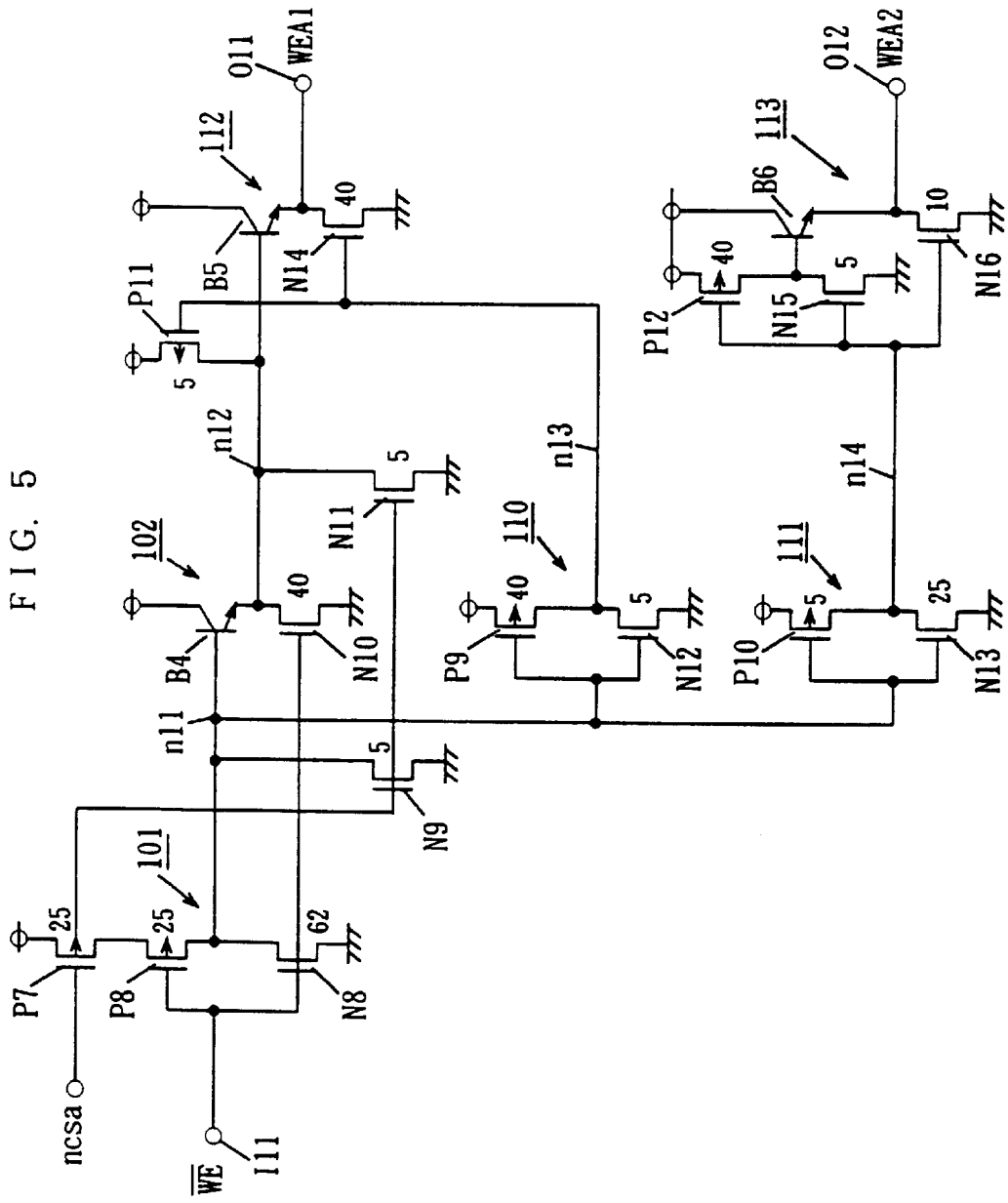
FIG. 5 is a diagram showing one example of a WE buffer circuit.
Figure 7:
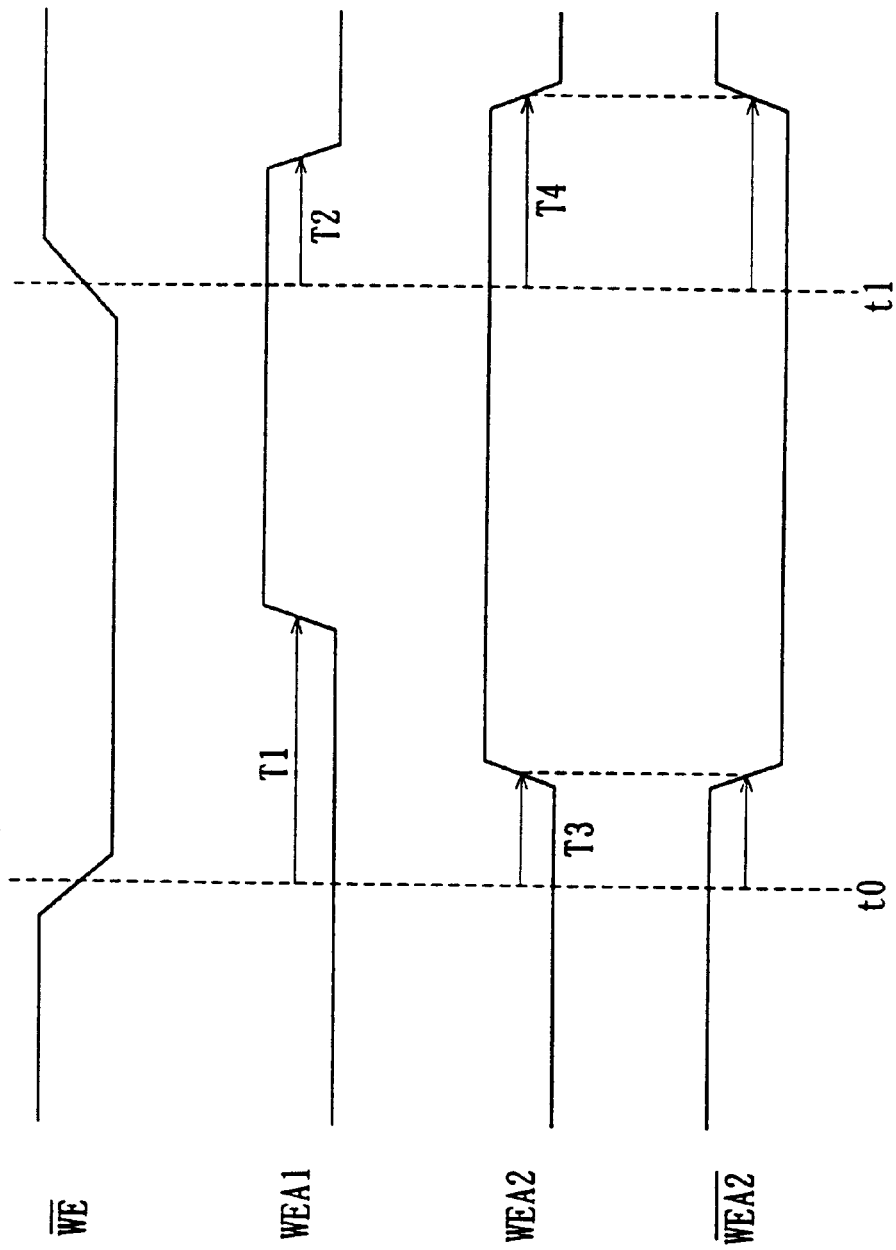
FIG. 7 is a diagram for use in describing timing of output signals of the WE buffer circuit.

According to the WE buffer circuit of FIG. 5, as shown in FIG. 7, a time T1 from a fall point t0 of a write enable signal $\overline{WE}$ to a rise point of an output signal WEA1 is long and a time T2 from a rise point t1 of a write enable signal $\overline{WE}$ to a fall point of an output signal WEA1 is short. Also, a time T3 from a fall point t0 of a write enable signal $\overline{WE}$ to a rise point of an output signal WEA2 is short, and a time T4 from a rise point t1 of a write enable signal $\overline{WE}$ to a fall point of an output signal WEA2 is long.

The WE buffer circuit of FIG. 5 is controlled in response to a chip select signal $\overline{CS}$. When a chip select signal $\overline{CS}$ is at "L", a signal ncsa is at "L", and the WE buffer circuit acts as an input buffer circuit.

That is to say, when a write enable signal $\overline{WE}$ falls, an output signal WEA1 and an output signal WEA2 rise. When a write enable signal $\overline{WE}$ rises, an output signal WEA1 and an output signal WEA2 fall. The timings of rising and falling of output signals WEA1 and WEA2 are shown in FIG. 7.

When a chip select signal $\overline{CS}$ is at "H", a signal ncsa attains "H". Thus, both of output signals WEA1 and WEA2 attain "L". In this case, the WE buffer circuit comes into a non-selection state.

Figure 8:
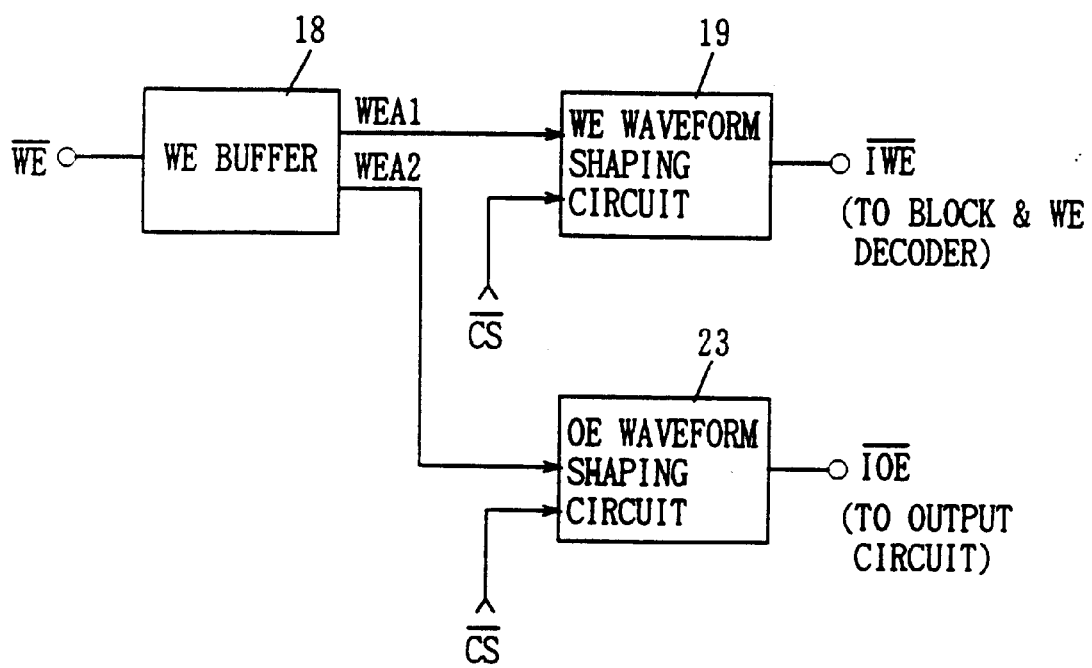
FIG. 8 is a diagram for use in describing a method of generating an internal write enable signal and an internal output enable signal.

FIG. 8 shows a WE buffer 18 realized with the WE buffer circuit of FIG. 5, WE waveform shaping circuit 19 and OE waveform shaping circuit 23.

In the structure of FIG. 8, output signals WEA1 and WEA2 with timing shown in FIG. 7 are obtained by WE buffer 18, and an output signal WEA1 is applied to WE waveform shaping circuit 19 and an output signal WEA2 is applied to OE waveform shaping circuit 23. An output signal of waveform shaping circuit 19 is applied to block & WE decoder 16 (FIG. 1) as an internal write enable signal $\overline{IWE}$, and an output signal of OE waveform shaping circuit 23 is applied to output circuit 29 (FIG. 1) as an internal output enable signal $\overline{IOE}$.

As described above, using the WE buffer circuit of FIG. 5, since output signals WEA1 and WEA2 shown in FIG. 7 are obtained in WE buffer 18, an access time can be shortened while preventing occurrence of erroneous writing.

Next, the WE buffer circuit of FIG. 9 will be described. In the WE buffer circuit of FIG. 9, transistors P12 and N15 in the WE buffer circuit of FIG. 5 are removed, a base of a transistor B6 is connected to a node n14 and a gate of a transistor N16 is connected to a node n12. An output signal $\overline{WEA2}$ obtained by inverting logic of an output signal WEA2 is obtained from an output terminal 012.

Figure 9:
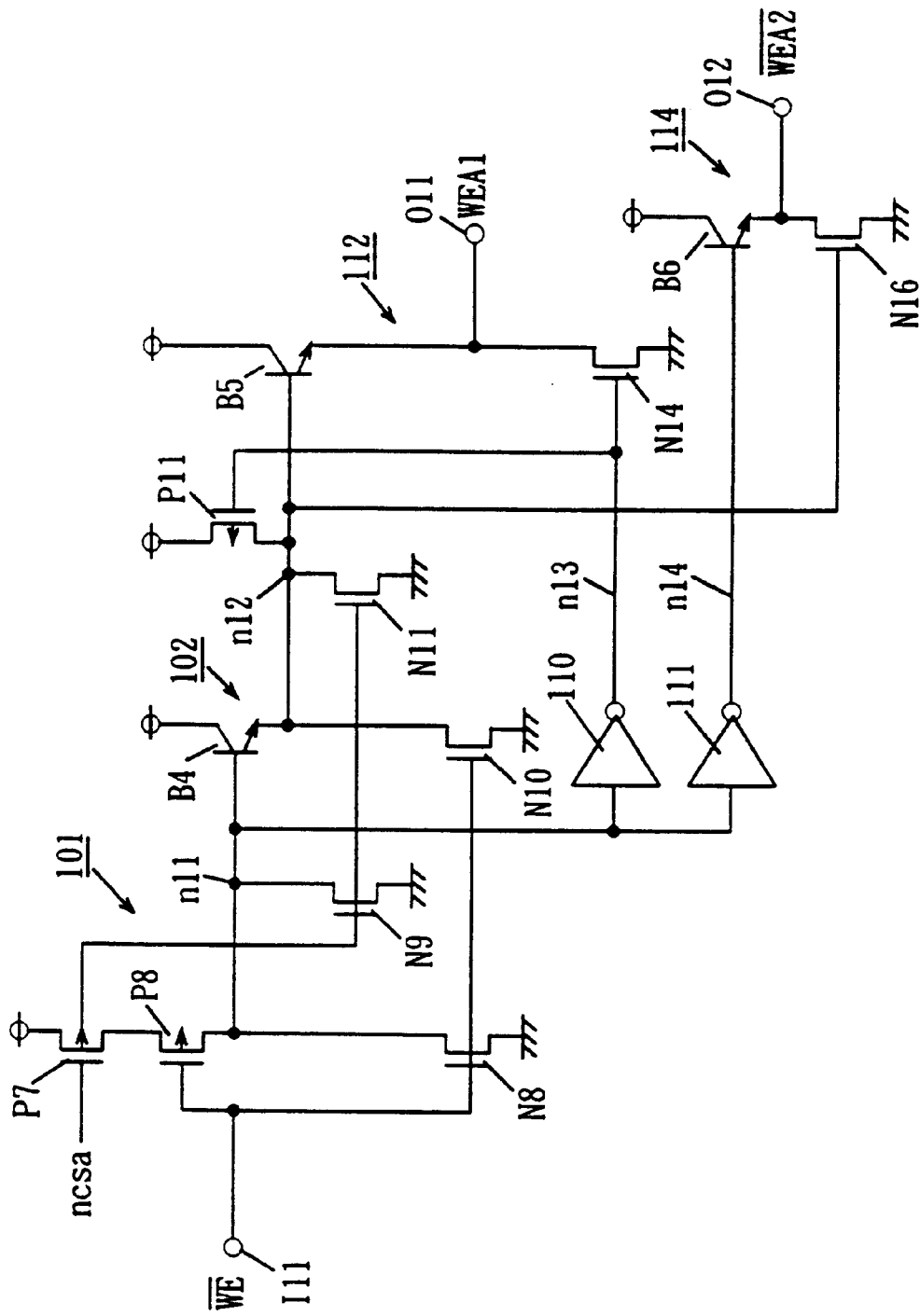
FIG. 9 is a diagram showing another example of a WE buffer circuit.

In the WE buffer circuit of FIG. 9, by decreasing a size of the PMOS transistor of CMOS transistor 11 (decreasing driving capability) and increasing a size of NMOS transistor (increasing driving capability), an output signal $\overline{WEA2}$ with the timing shown in FIG. 7 is obtained.

In the WE buffer circuit of FIG. 9, when a signal ncsa attains "H", an output signal WEA1 attains "L", and an output signal $\overline{WEA2}$ attains "H". In this case, the WE buffer circuit gets into a non-selection state.

(c) Gate Circuit (FIGS. 10–17)

Figure 10:
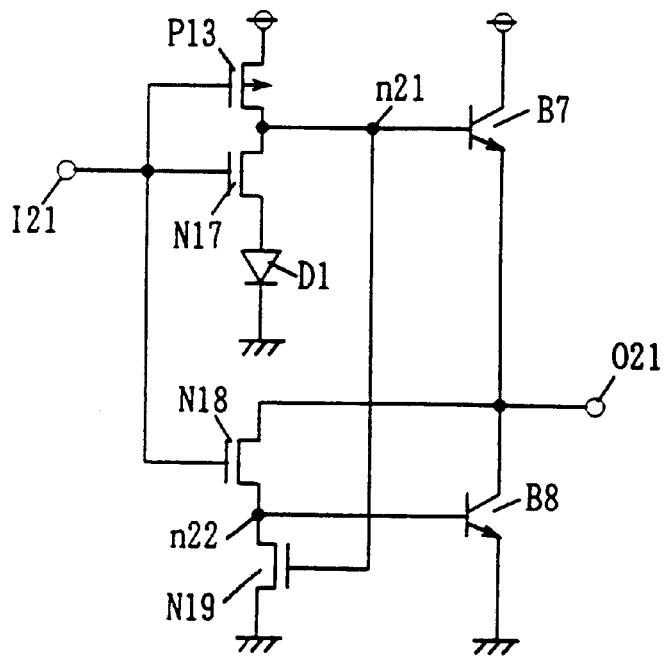
FIG. 10 is a diagram showing one example of a BiCMOS gate circuit.
Figure 11:
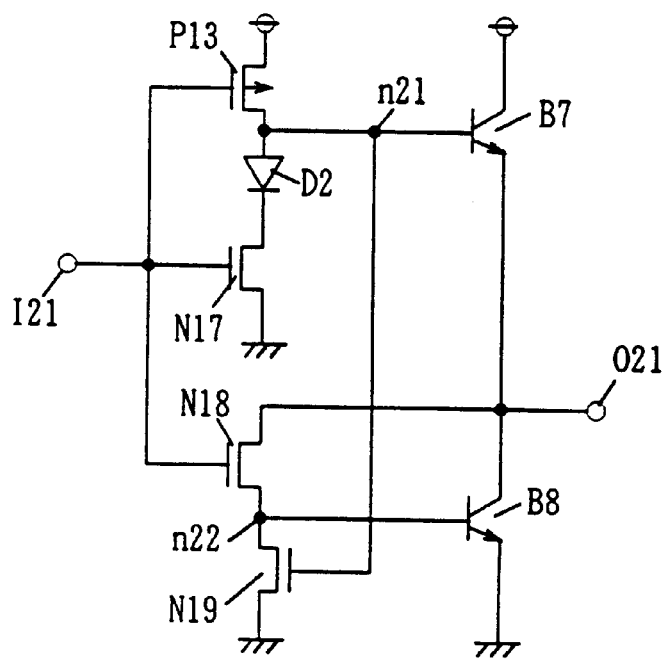
FIG. 11 is a diagram showing another example of a BiCMOS gate circuit.
Figure 12:
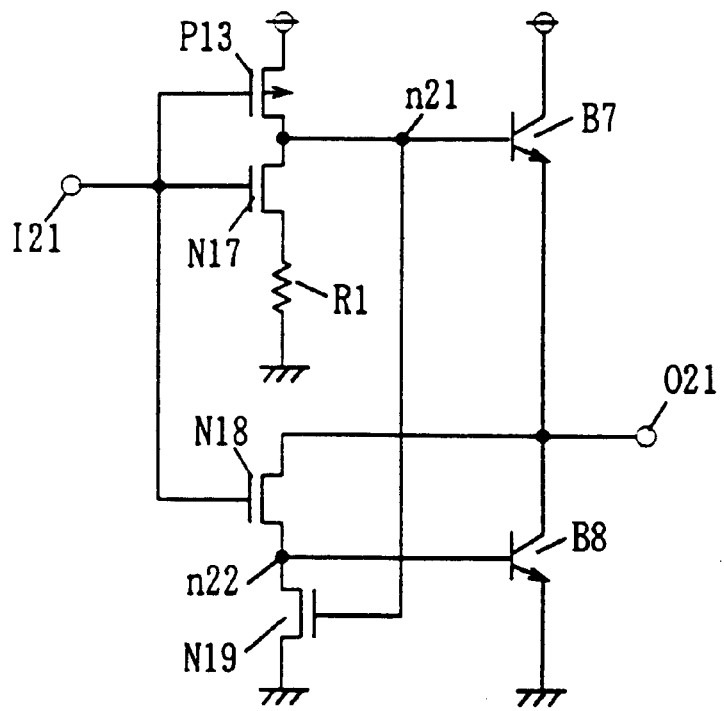
FIG. 12 is a diagram showing another example of a BiCMOS gate circuit.
Figure 13:
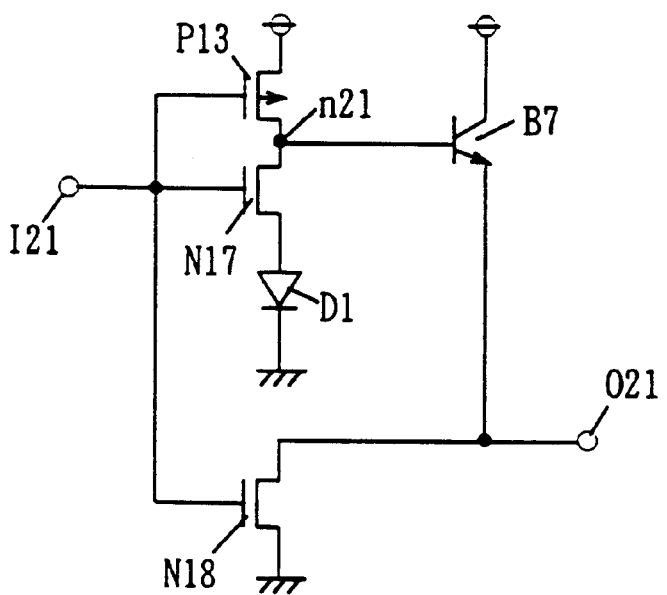
FIG. 13 is a diagram showing one example of a BiNMOS gate circuit.
Figure 14:
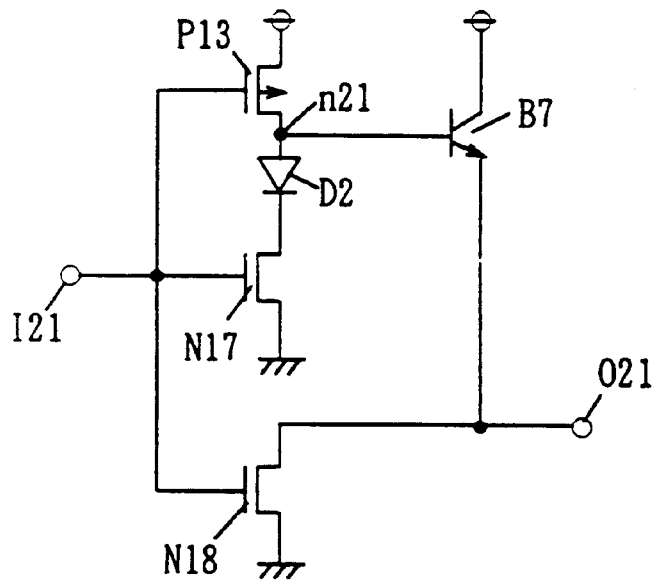
FIG. 14 is a diagram showing another example of a BiNMOS gate circuit.
Figure 15:
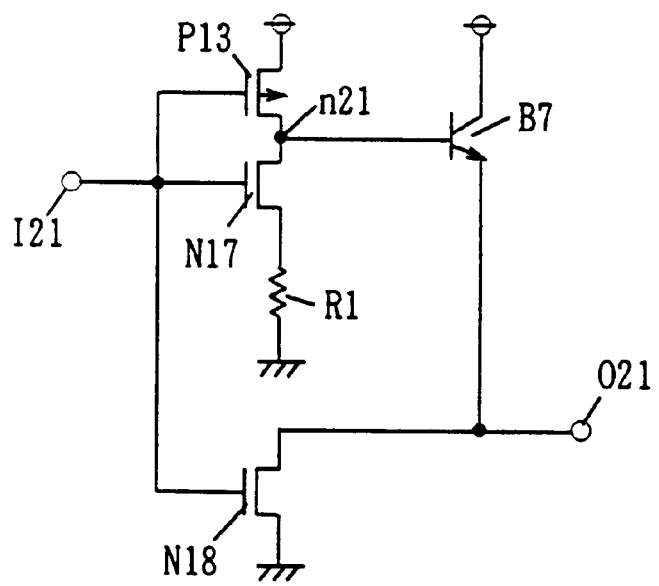
FIG. 15 is a diagram showing another example of a BiNMOS gate circuit.

BiCMOS gate circuits shown in FIGS. 10–12 and BiN-MOS gate circuits shown in FIGS. 13–15 are used in decoders 3, 4, 6, 8, 9, 11, 12, 14–17 and waveform shaping circuits 19, 21 and 23 of FIG. 1.

Figure 50:
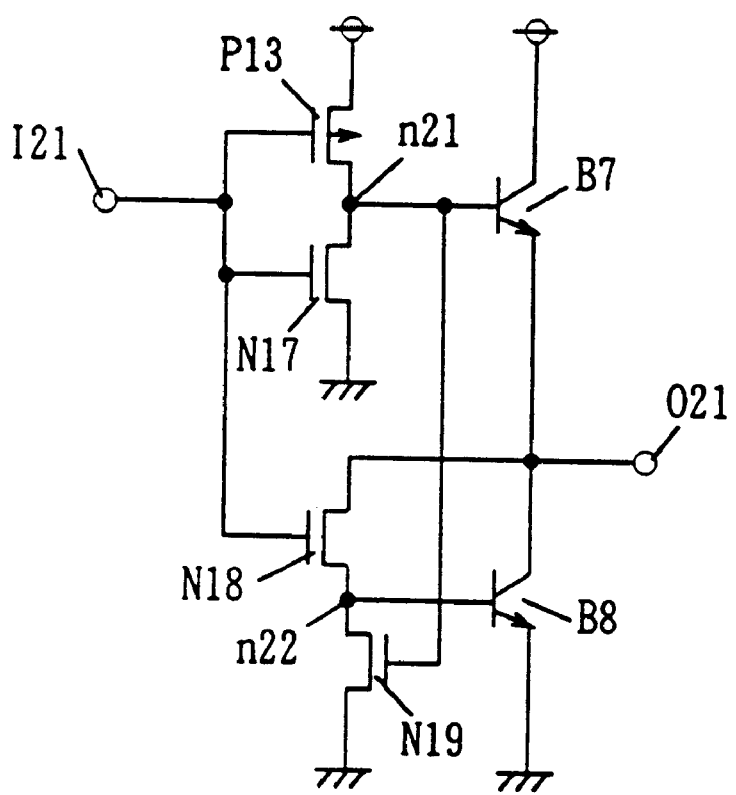
FIG. 50 is a diagram showing a conventional BiCMOS gate circuit.
Figure 51:
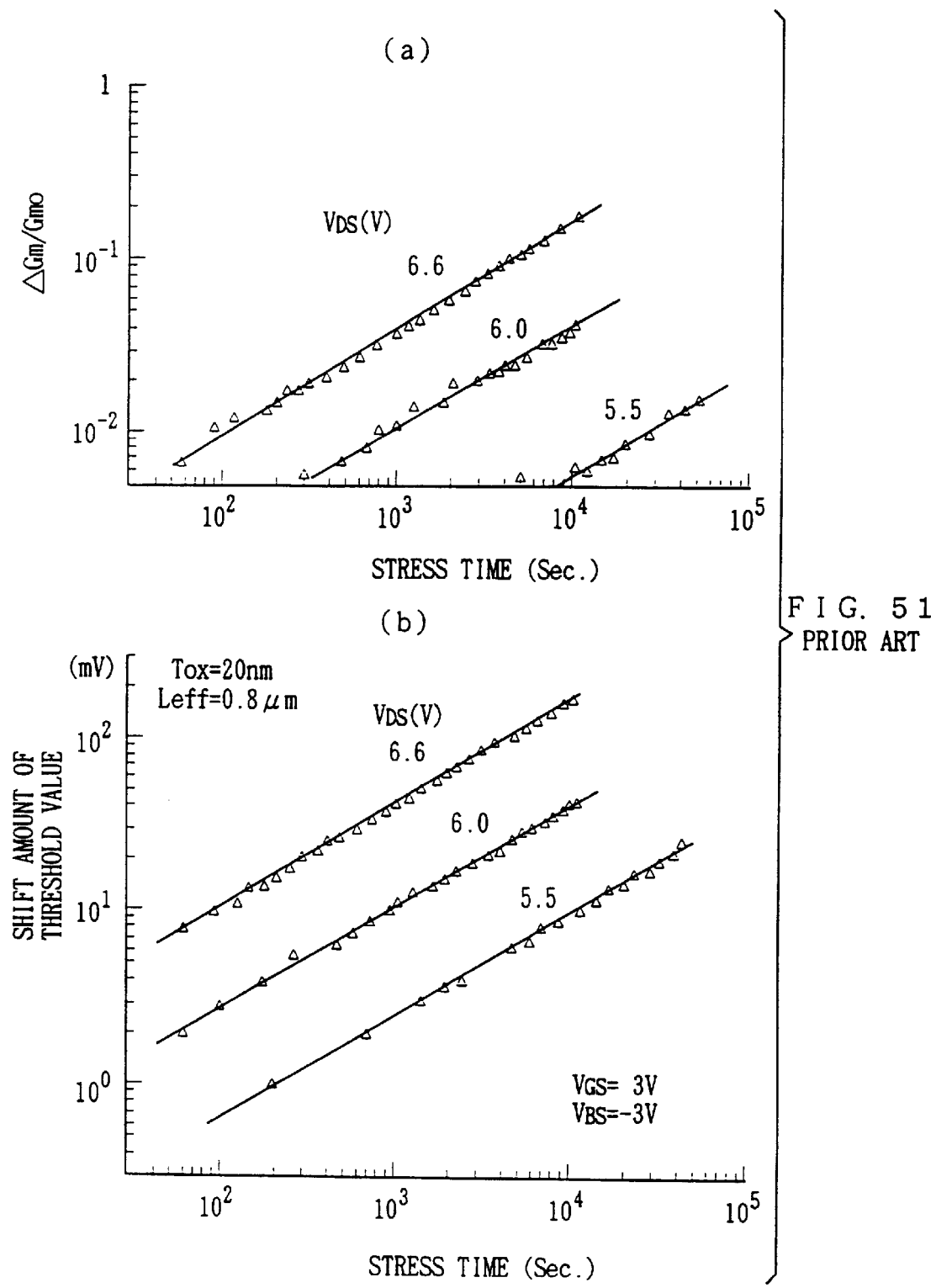
FIG. 51 is a diagram for use in describing degradation of a MOS transistor due to hot carriers.

The BiCMOS gate circuit of FIG. 10 is different from the BiCMOS gate circuit of FIG. 50 in that a diode D1 is connected between a source of NMOS transistor N17 configuring CMOS logic and a ground terminal.

In the BiCMOS gate circuit of FIG. 11, a diode D2 is connected between a node n21 and a drain of an NMOS transistor N17.

In the BiCMOS gate circuit of FIG. 12, a resistor R1 is connected between a source of NMOS transistor N17 and a ground terminal.

In the BiCMOS gate circuits of FIGS. 10–12, drain voltage of transistor N17 is reduced to enhance hot carrier tolerance.

Since source potential of transistor N17 is increased by a forward direction voltage Vf of diode D1 or D2, performance of transistor N17 somewhat goes down. However, since a role of the transistor N17 is only to extract base current of transistor B7, the speed performance of BiCMOS gate is not degraded.

The operational principle of BiCMOS gate circuits of FIGS. 10–12 is entirely the same as the operational principle of BiCMOS gate circuit of FIG. 50.

In the BiNMOS gate circuits of FIGS. 13–15, transistors N19 and B8 in the BiCMOS gate circuits of FIGS. 10–12 are removed.

In the BiNMOS gate circuit of FIG. 13, a diode D1 is connected between a source of transistor N17 and a ground terminal.

In the BiNMOS gate circuit of FIG. 14, a diode D2 is connected between a node n21 and a drain of transistor N17.

In the BiNMOS gate circuit of FIG. 15, a resistor R1 is connected between a source of a transistor N17 and a ground terminal.

The operational principle and effects of BiNMOS gate circuits of FIGS. 13–15 are entirely the same as the operational principle and effects of BiCMOS gate circuits of FIGS. 10–12.

Although gate circuits of FIGS. 10–15 are inverters, the same structure can also be applied to an NOR circuit and a NAND circuit, and the same effects can be obtained.

Figure 16:
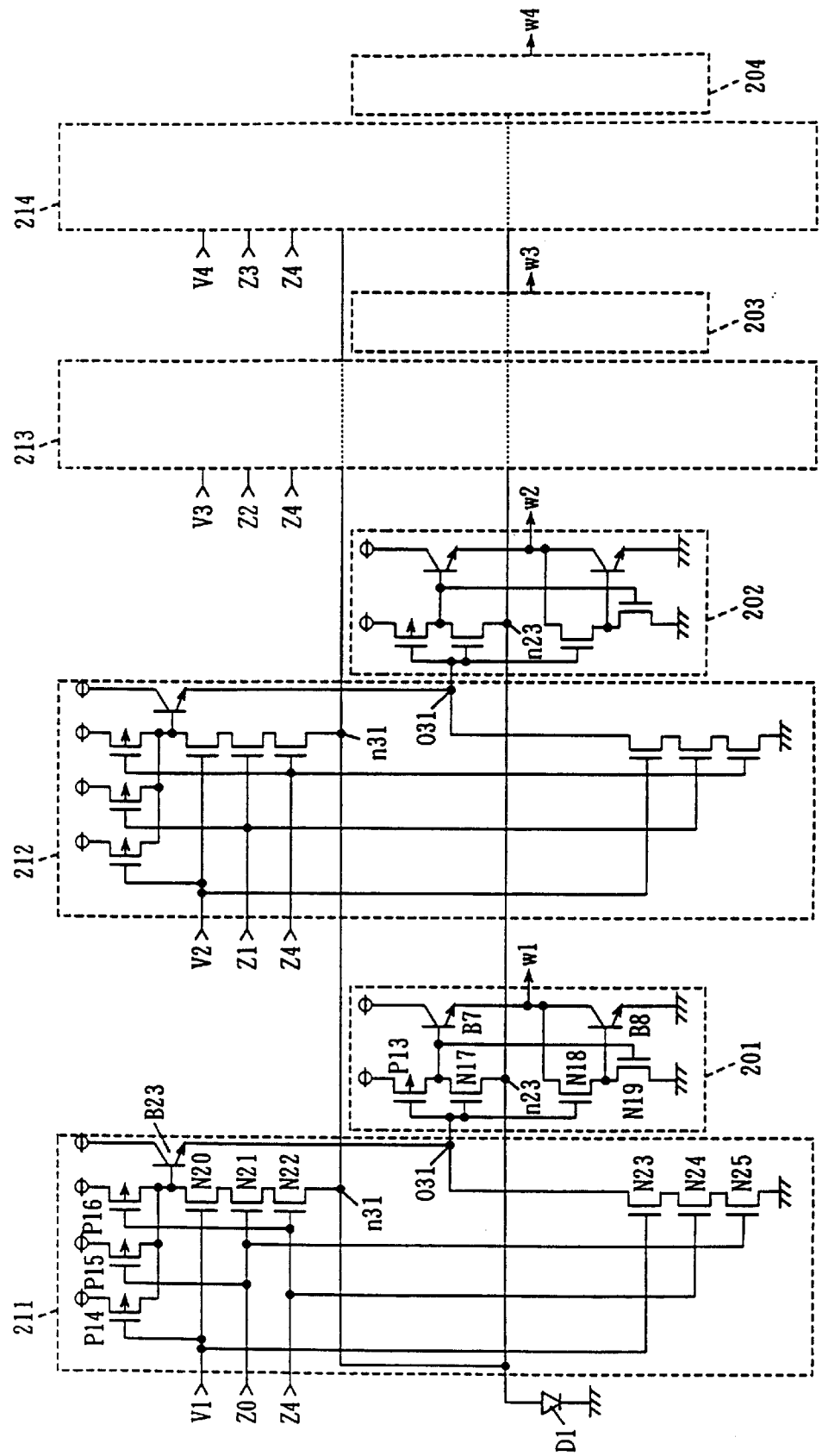
FIG. 16 is a diagram showing one example of a decoder circuit.
Figure 17:
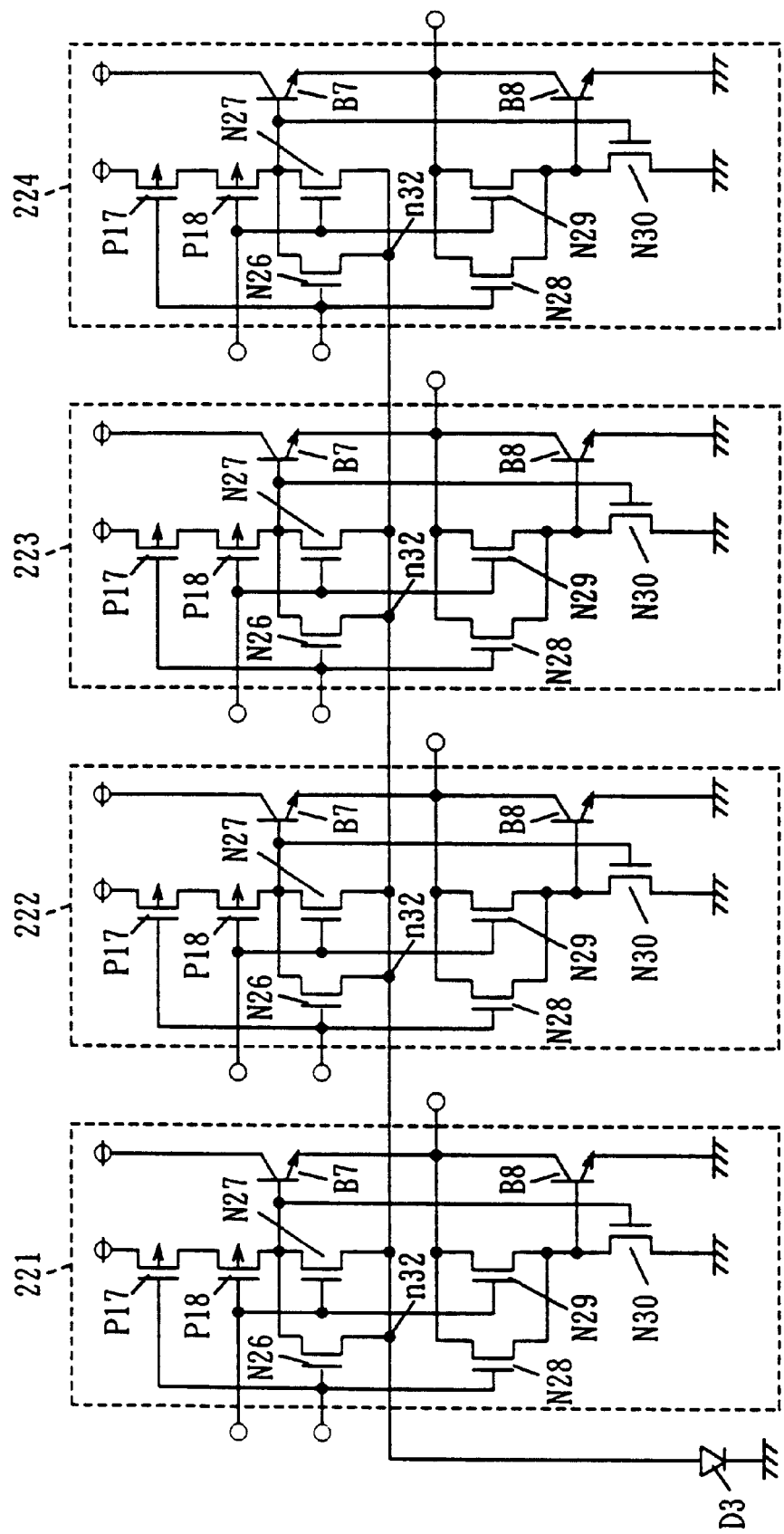
FIG. 17 is a diagram showing another example of a decoder circuit.

(d) Decoder Circuit (FIGS. 16 and 17)

The decoder circuits shown in FIGS. 16 and 17 are used in decoders 3, 4, 6, 8, 9, 11, 12, 14 through 17 of FIG. 1.

The decoder circuit in FIG. 16 includes CMOS·3NAND circuits 211–214 and BiCMOS gate circuits 201–204. The decoder circuit of FIG. 16 is different from the decoder circuit of FIG. 52 in that node n31 of CMOS·3NAND circuits 211–214 and node n23 of BiCMOS gate circuits 201–204 are connected to a ground terminal through a common diode D1.

Figure 52:
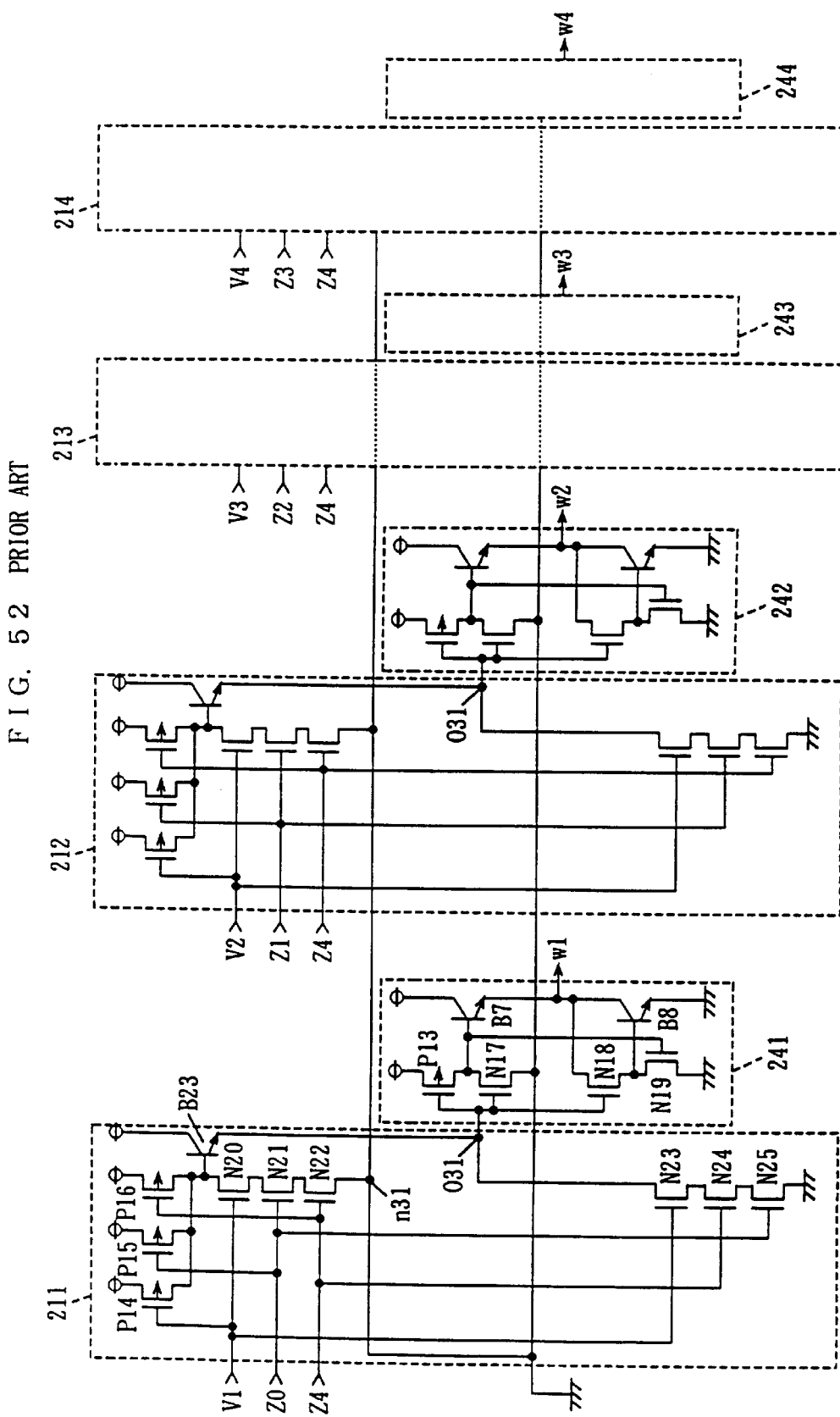
FIG. 52 is a diagram showing a conventional decoder circuit.

The operational principle of the decoder circuit of FIG. 16 is entirely the same as the operational principle of the decoder circuit of FIG. 52. For example, when all of three input signals V1, Z0 and Z4 applied to CMOS·3NAND circuit 211 attain "H", an output signal w1 of BiCMOS gate circuit 201 attains "H", and output signals w2, w3, w4 of remaining BiCMOS gate circuits 212–214 attain "L".

In the decoder circuit of FIG. 16, drain voltage of transistors N22 and N17 is reduced to enhance hot carrier resistance.

Also, since a diode D1 is provided in common to for four sets of CMOS·3NAND circuits 211–214 and four sets of BiCMOS gate circuits 201–204, an increase of layout area can be suppressed.

Also, high speed operation can be accomplished with high driving capability of bipolar transistors B7 and B8 of BiCMOS gate circuits 201–204.

The decoder circuit of FIG. 17 includes BiCMOS·2NOR circuits 221–224. Each of BiCMOS·2NOR circuits 221–224 includes transistors P17, P18, N26–N30, B7, B8.

In the decoder circuit of FIG. 17, node n32 of each BiCMOS·2NOR circuit 221-224 is also connected to a ground terminal through a common diode D3, so that drain voltages of NMOS transistors N26 and N27 can be reduced. Accordingly, it is possible to enhance hot carrier resistance.

Also, since a common diode D3 is used, an increase in layout area can be limited. Furthermore, with high driving capability of bipolar transistors B7 and B8, high speed operation is accomplished.

(e) Output Buffer Circuit (FIGS. 18–24)

Output buffer circuits shown in FIGS. 18–24 are used in output circuit 29 of FIG. 1.

Output buffer circuits 300 of FIGS. 18–22 include a pull-up circuit 301 and a pull-down circuit 302. Structure and operation of pull-up circuit 301 is the same as the structure and operation of the pull-up circuit 301 shown in FIG. 53.

Figure 18:
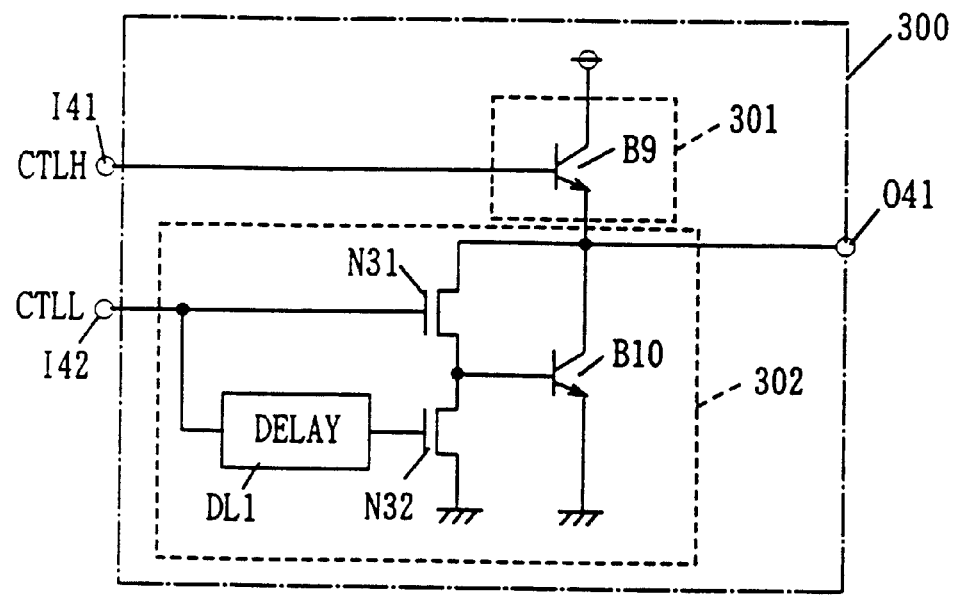
FIG. 18 is a diagram showing one example of an output buffer circuit.

In the output buffer circuit of FIG. 18, pull-down circuit 302 includes NMOS transistors N31, N32 a bipolar transistor B10 and a delay circuit D1. Transistor B10 is connected between an output terminal O41 and a ground terminal. Transistor N31 is connected between output terminal O41 and a base of transistor B10, and transistor N32 is connected between the base of transistor B10 and the ground terminal. A control signal CTLL is applied to a gate of transistor N31 and a control signal CTLL is applied to a gate of transistor N32 through delay circuit D1.

When a control signal CTLH is at "H" and a control signal CTLL is at "L", charge is supplied to output terminal O41 from a power-supply terminal by pull-up circuit 301. When a control signal CTLH changes from "H" to "L", and a control signal CTLL changes from "L" to "H", transistor N31 turns on first. Thus, charge is supplied from output terminal O41 to the base of transistor B10.

In a period in which a delay time in delay circuit DL1 has passed from a rise of control signal CTLL, transistor N32 is held in an off state. In such a period, all the current flowing into transistor N31 from output terminal O41 is supplied to the base of transistor B10. Accordingly, transistor B10 immediately turns on at a point of rise of a control signal CTLL. As a result, current rapidly flows to the ground terminal from output terminal O41 through transistor B10, and potential of output terminal O41 rapidly decreases.

It decreases base potential of transistor B10, and the base-emitter voltage of transistor B10 decreases. The decrease of base-emitter voltage gradually brings transistor B10 into an off state.

When a delay time in delay circuit DL1 has passed from a rise of a control signal CTLL, gate potential of transistor N32 attains "H". It turns on transistor N32. The delay time in delay circuit DL1 is set to a time required by the potential of output terminal O41 to decrease to a certain extent with turn-on of transistor B10.

As a result, charge of output terminal O41 is supplied to the ground terminal through transistors N31 and N32 instead of transistor B10.

Since the current driving capability of a MOS transistor is lower than the current driving capability of a bipolar transistor, the amount of charge discharged to the ground terminal from output terminal O41 through transistors N31 and N32 in a period after turn-off of transistor B10 is smaller than an amount of charge discharged to the ground terminal from output terminal O41 through transistor B10 which is in an on state.

Accordingly, when the delay time in delay circuit DL1 after a rise of control signal CTLL has passed, the amount of charge discharged to the ground terminal from output terminal O41 decreases, and the potential of output terminal O41 decreases more moderately than before.

Next, a control signal CTLH changes from "L" to "H", and a control signal CTLL changes from "H" to "L". It instantly turns off transistor N31. Since an output of delay circuit DL1 remains "H" for a while, transistor N32 stays in an on state. As a result, a current path between output terminal O41 and the ground terminal is instantly intercepted, and the potential of output terminal O41 is rapidly raised to "H" by pull-up circuit 301.

As described above, in the output buffer circuit 300 of FIG. 18, in response to a rise of a control signal CTLL, output terminal O41 is discharged through bipolar transistor B10 having large current driving capability. Accordingly, a fall of potential of output terminal O41 is sharp. Subsequently, when the potential of output terminal O41 gets closer to the ground potential to some extent, output terminal O41 is discharged through NMOS transistors N31 and N32 having small current driving capability. Accordingly, the potential change of output terminal O41 becomes moderate.

Accordingly, ringing which occurs at output terminal O41 or the ground terminal because of rapid and large change of potential of output terminal O41 is suppressed.

Also, since the output terminal is finally connected electrically to the ground terminal through NMOS transistors N31 and N32, the potential of output terminal O41 is held at potential sufficiently close to 0V.

The potential of output terminal O41 when 8mA of current which is the same as the current flowing to a bipolar transistor in a saturated state flows to the ground terminal from output terminal O41 through NMOS transistors N31 and N32 applies to a range (0.4V or lower) defined by standard of TTL SRAM. The characteristic is obtained by the property of MOS transistor that the current driving capability is small and the difference between drain potential and source potential is small in a conducting state.

Figure 53:
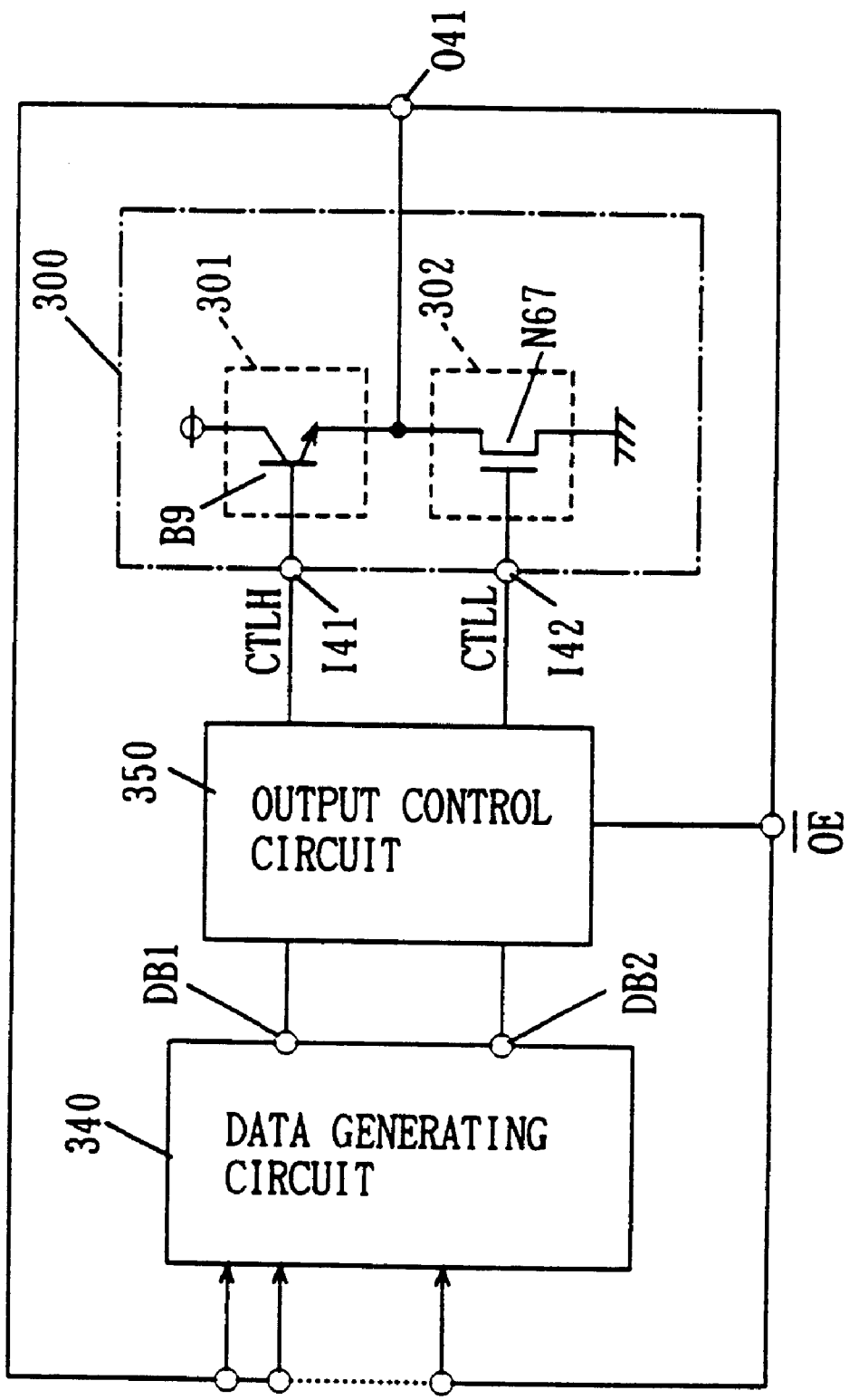
FIG. 53 is a diagram showing a conventional output buffer circuit.
Figure 56:
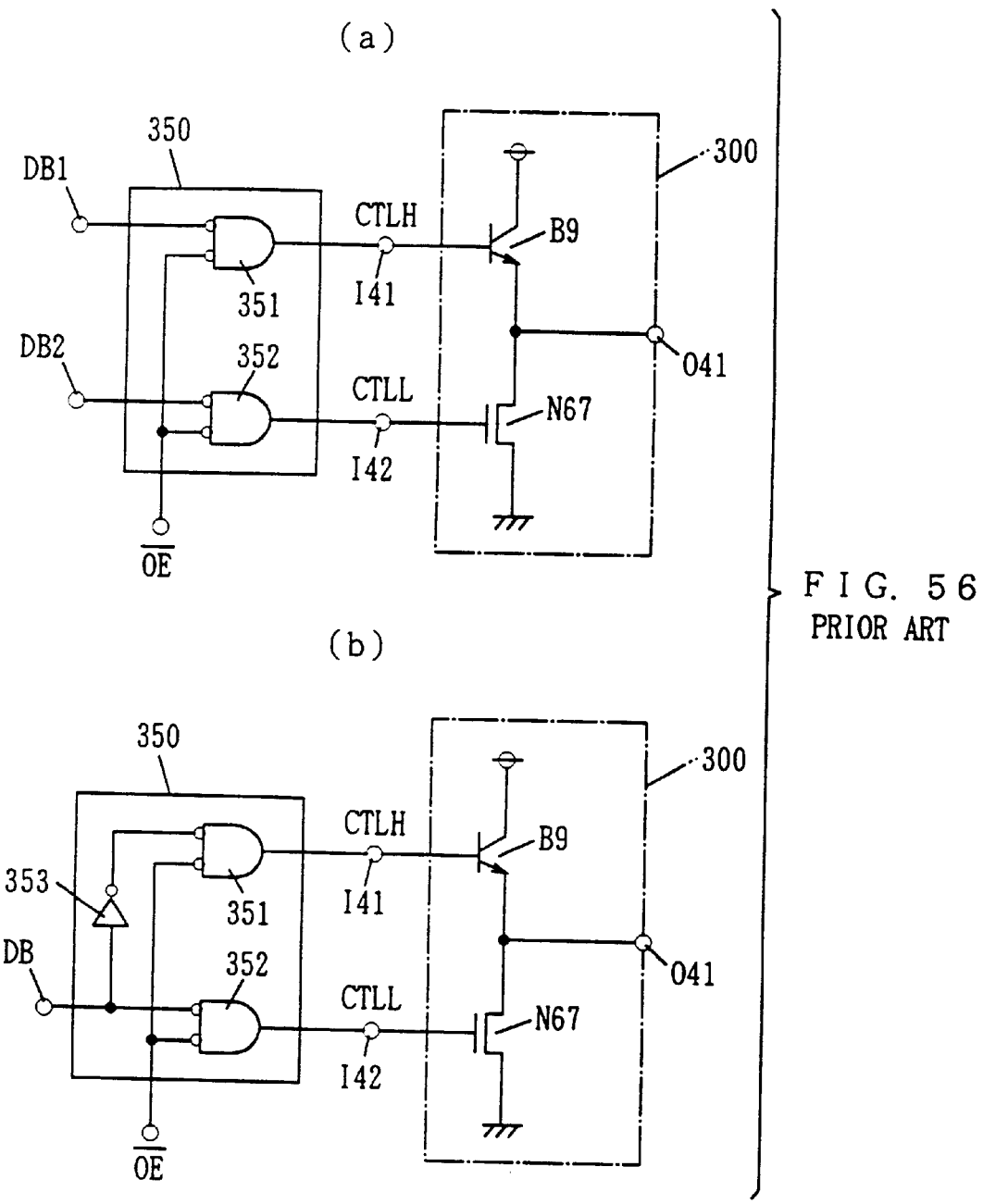
FIG. 56 is a diagram showing another example of an output control circuit.
Figure 57:
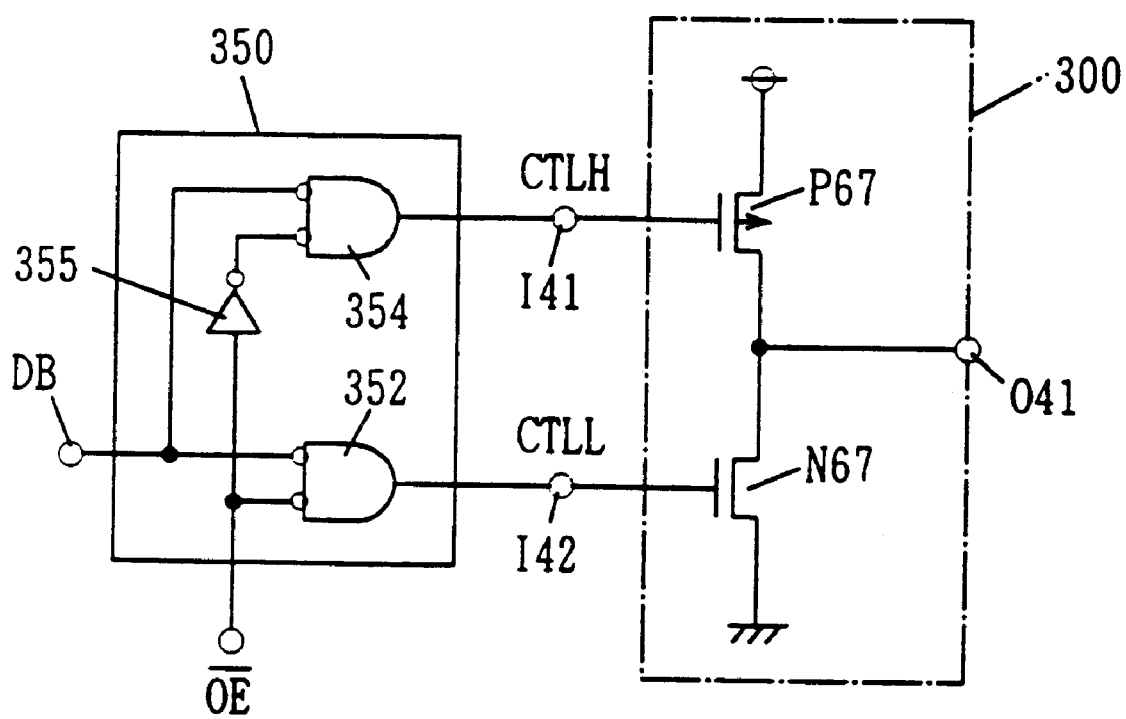
FIG. 57 is a diagram showing another example of an output control circuit and an output buffer circuit.
Figure 58:
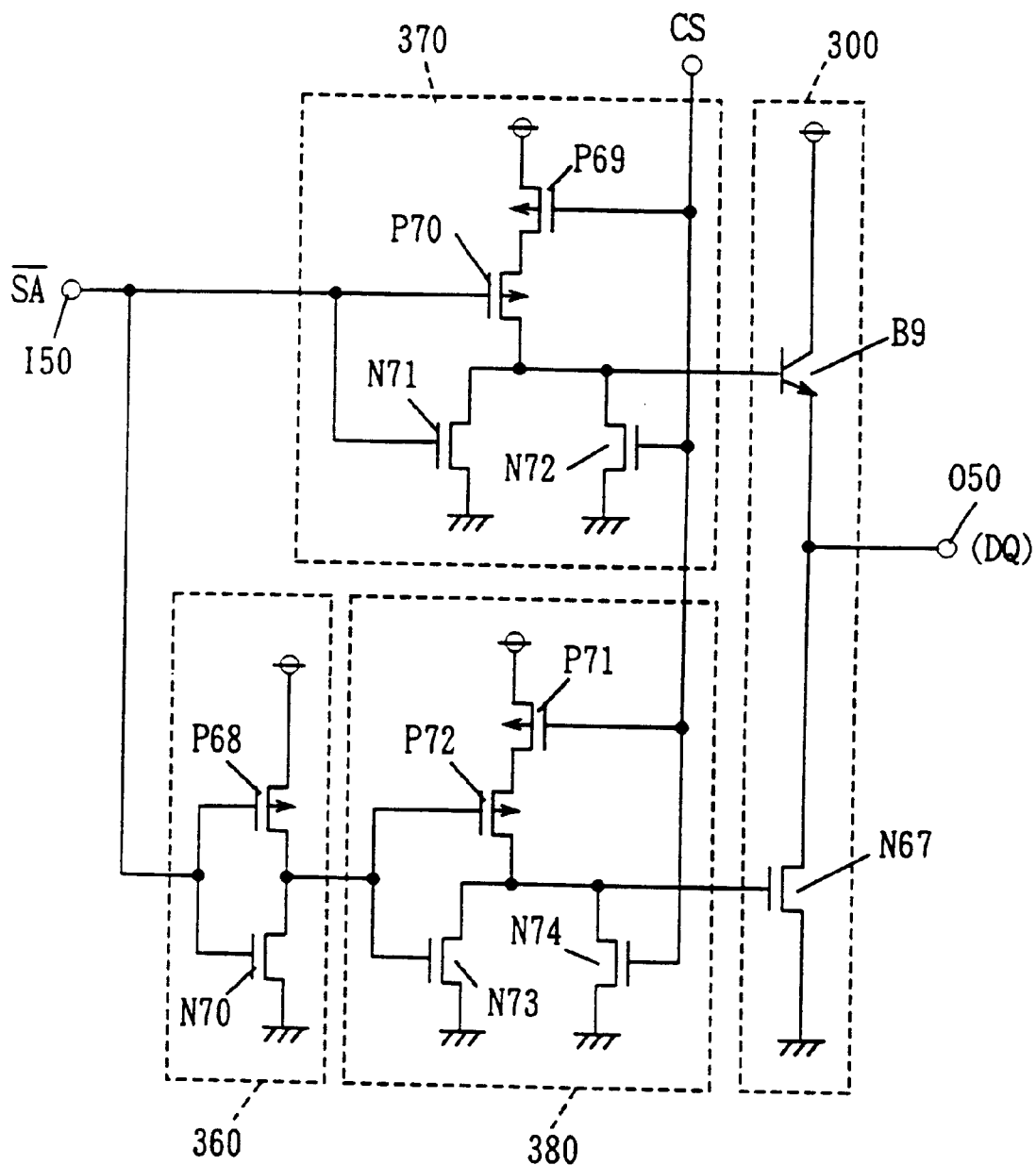
FIG. 58 is a diagram showing another example of a conventional output buffer circuit.
Figure 59:
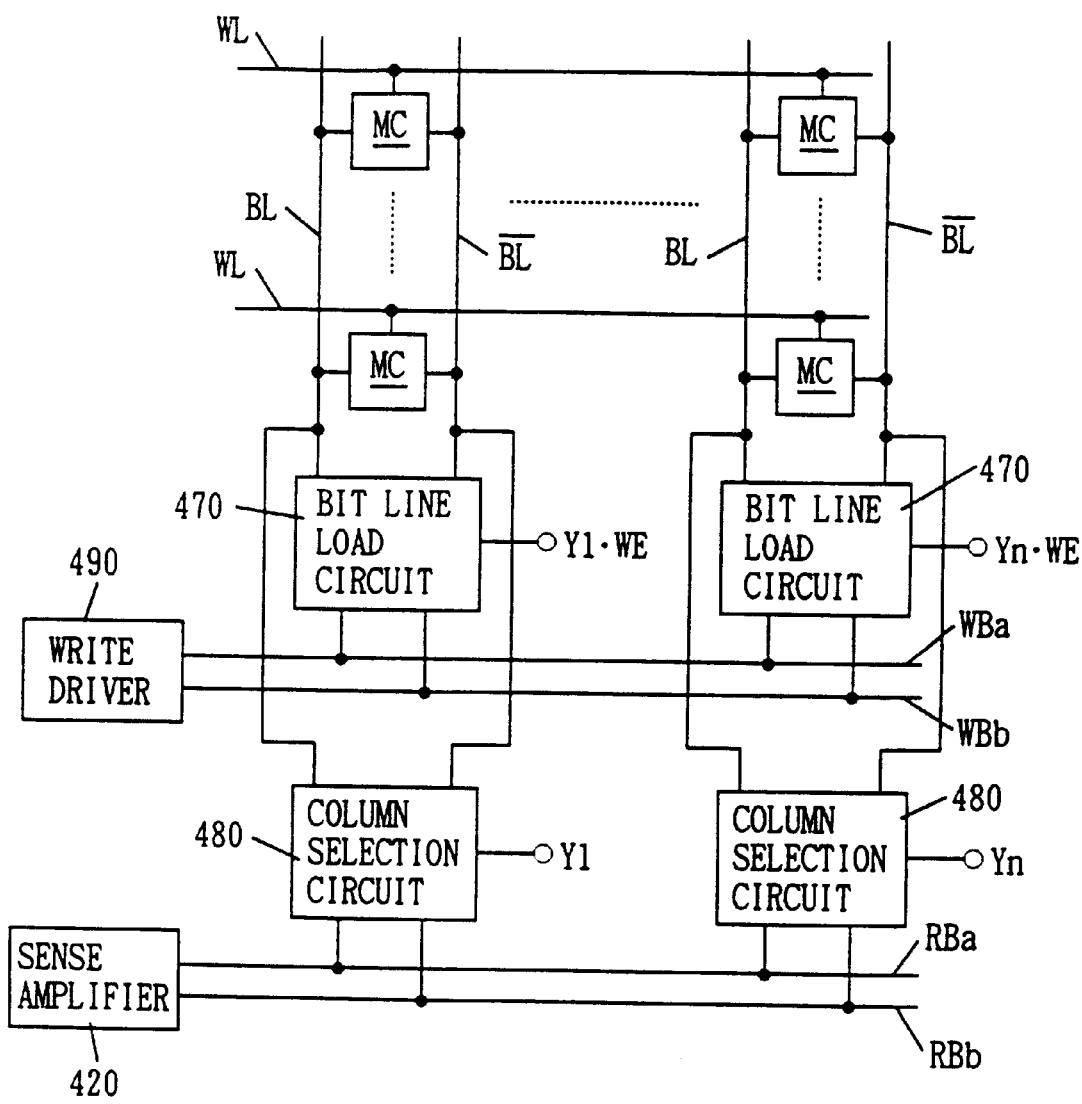
FIG. 59 is a diagram showing a memory cell array and a structure in the vicinity thereof.
Figure 60:
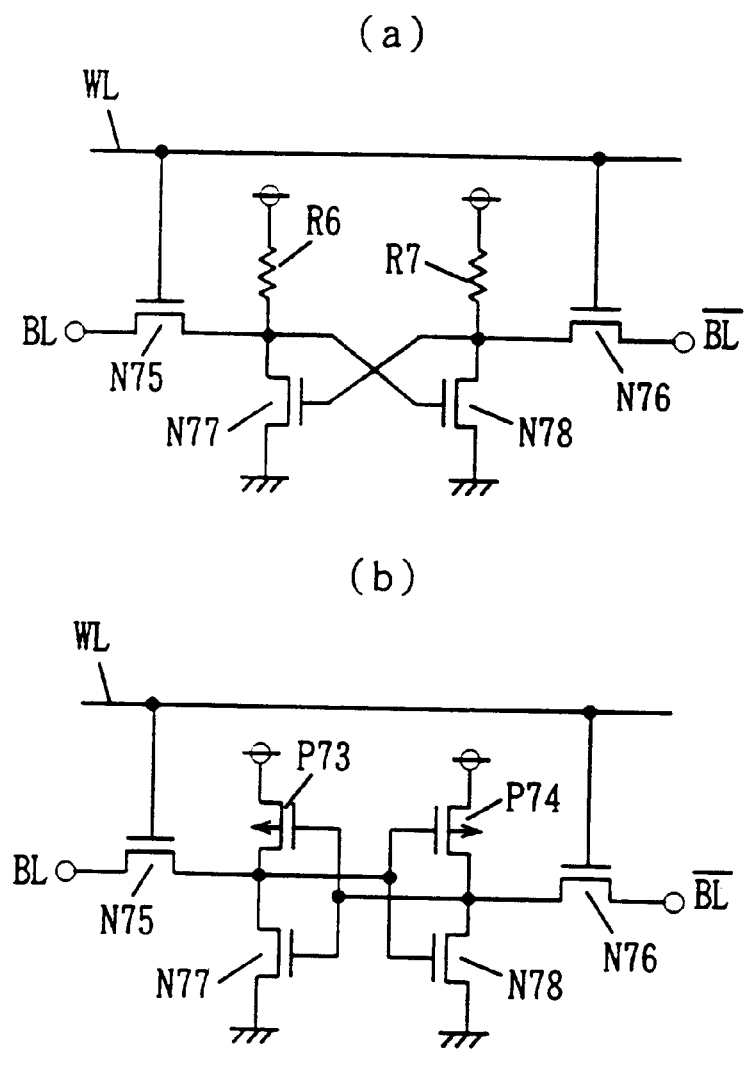
FIG. 60 is a diagram showing a structure of a memory cell.
Figure 61:
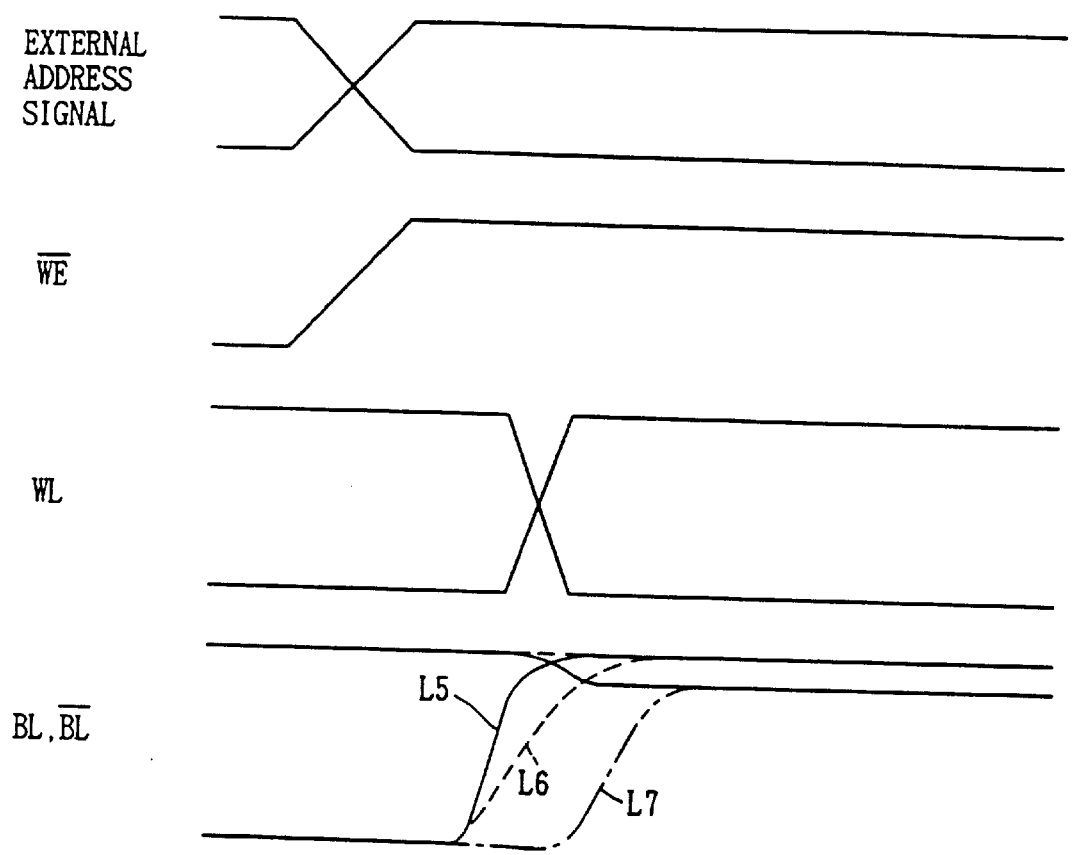
FIG. 61 is a diagram showing change of potential of a bit line.

Also, in a period in which an output enable signal $\overline{OE}$ applied to output control circuit 350 (refer to FIG. 53) controlling output buffer circuit 300 attains "H", and both of control signals CTLH and CTLL are at "L", similarly to the output buffer circuit of FIG. 53, output terminal O41 is electrically disconnected from the power-supply terminal and the ground terminal. Therefore, a data signal generated inside a semiconductor integrated circuit device is not outputted from output terminal O41.

Figure 19:
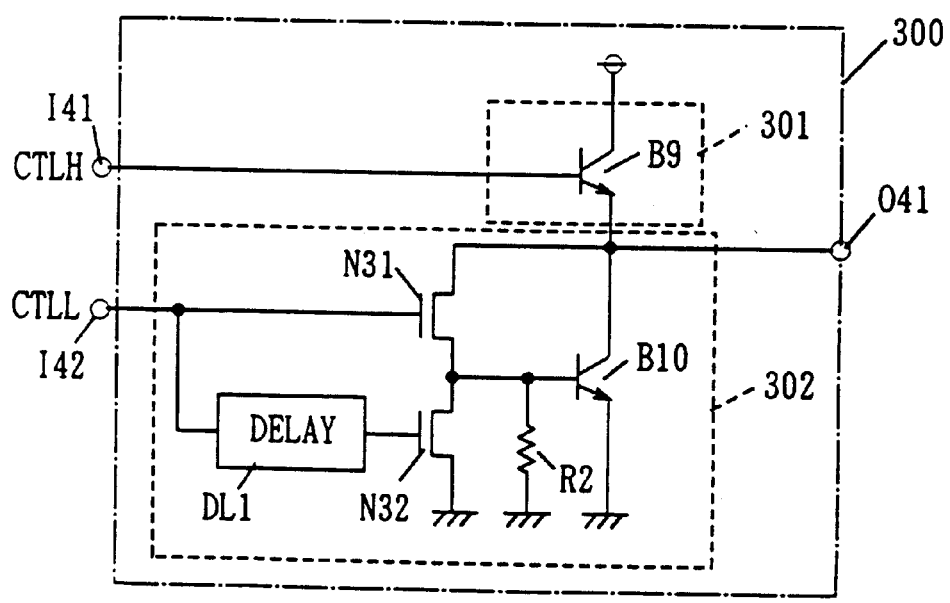
FIG. 19 is a diagram showing another example of an output buffer circuit.

In the output buffer circuit 300 of FIG. 19, a resistor R2 is connected between a transistor B10 and a ground terminal. A resistance value of resistor R2 is set to a relatively large value. The structure in other parts is the same as the structure of the output buffer circuit 300 of FIG. 18.

In the output buffer circuit 300 of FIG. 18, in a period in which a control signal CTLH is at "H" and a control signal CTLL is at "L", when leak current is supplied from a drain of transistor N31 to a base of transistor B10, transistor B10 is brought into a shallow on state. Accordingly, throughout current flows from the power-supply terminal to the ground terminal through transistors B9, B10. Such throughout current increases consumption power of output buffer circuit 300.

In the output buffer circuit 300 of FIG. 19, when a control signal CTLL rises to "H" and a transistor N31 turns on, a part of charge of output terminal O41 is supplied to the ground terminal through transistor N31 and resistor R2. However, the amount of charge is extremely small. Accordingly, almost all of current flowing to transistor N31 is supplied to a base of transistor B10. As a result, transistor B10 turns on.

Also in the output buffer circuit 300 of FIG. 19, after that, similarly to output buffer circuit 300 of FIG. 18, with operation of transistors B10, N31 and N32, the potential of output terminal O41 rapidly decreases first and slowly decreases thereafter.

If charge is supplied to the base of transistor B10 because of some reason when both of transistors N31 and N32 should be at an off state, the charge is gradually discharged to the ground terminal through resistor R2. Accordingly, even if current leaks from transistor N31 in a period in which a control signal CTLL is at "L", transistor B10 does not turn on. Therefore, throughout current does not flow from the power-supply terminal to the ground terminal in output buffer circuit 300.

Figure 20:
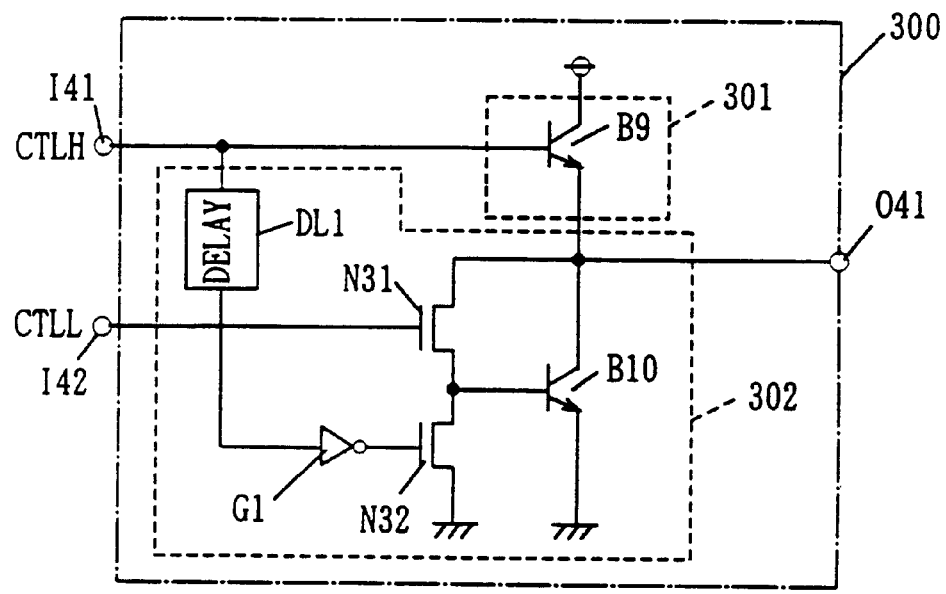
FIG. 20 is a diagram showing another example of an output buffer circuit.

In the output buffer circuit 300 of FIG. 20, a control signal CTLH is applied to a gate of a transistor N32 through a delay circuit DL1 and an inverter G1. Thus, transistor N32 is controlled with a control signal CTLH. The structure of other parts is the same as the structure of output buffer circuit 300 of FIG. 18.

A control signal CTLH and a control signal CTLL are signals complementary to each other. Therefore, an output of inverter G1 is the same as an output of delay circuit DL1 in the output buffer circuit 300 of FIG. 18. Accordingly, output buffer circuit 300 of FIG. 20 operates similarly to the output buffer circuit 300 of FIG. 18 and the same effects can be obtained.

Figure 21:
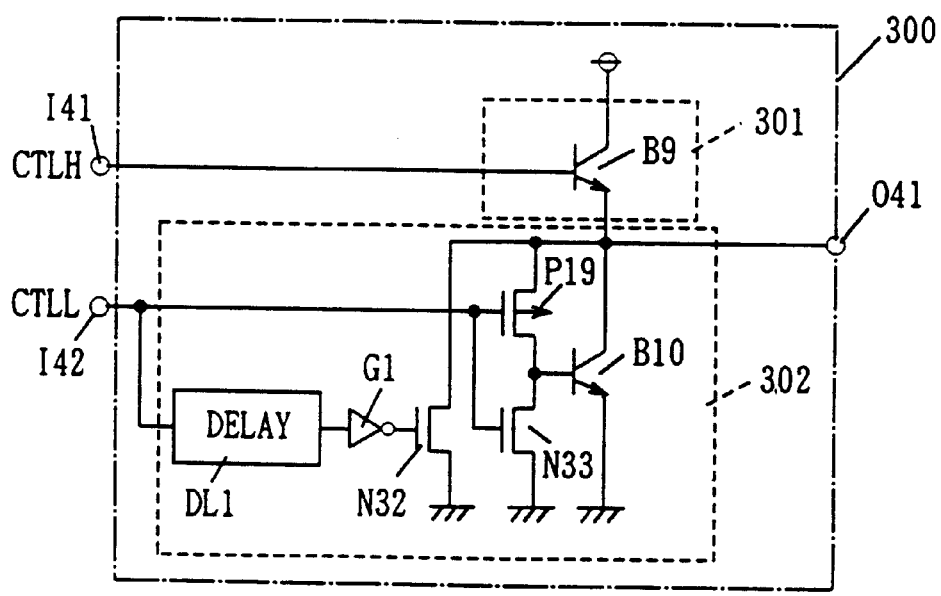
FIG. 21 is a diagram showing another example of an output buffer circuit.
Figure 22:
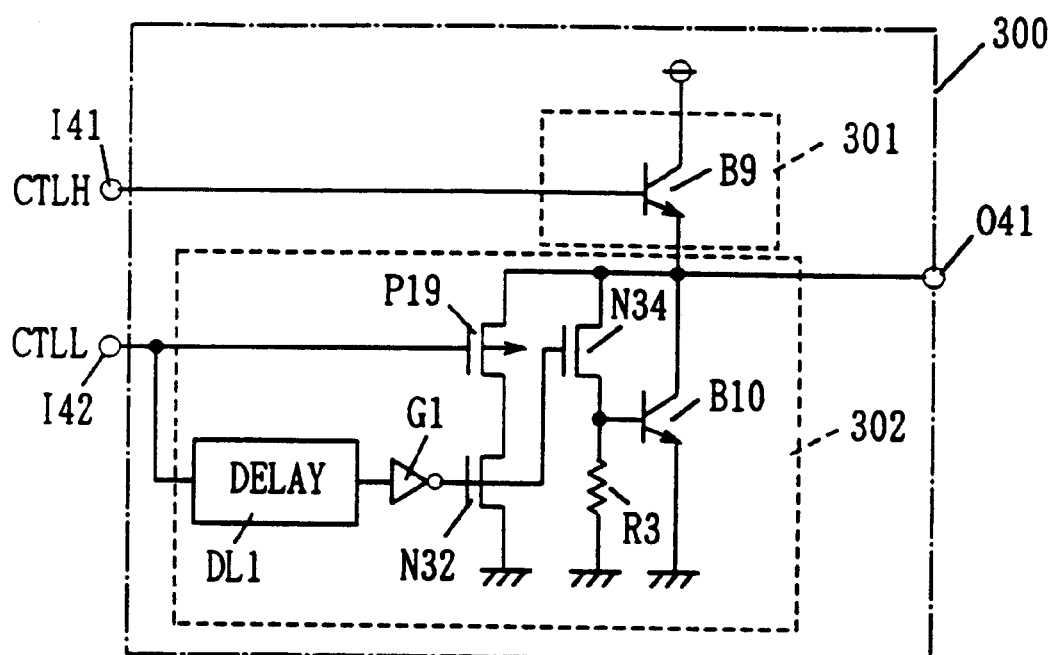
FIG. 22 is a diagram showing another example of an output buffer circuit.

In output buffer circuits 300 of FIGS. 21 and 22, when both of control signals CTLH and CTLL change from "H" to "L", potential of an output terminal O41 changes from "H"to "L". Also, when control signals CTLH and CTLL both change from "L" to "H", the potential of output terminal O41 changes from "L" to "H".

In the output buffer circuit 300 of FIG. 21, a pull-down circuit 302 includes a PMOS transistor P19, NMOS transistors N32 and N33, a bipolar transistor B10, a delay circuit DL1 and an inverter G1.

Transistor B10 is connected between an output terminal O41 and a ground terminal. Transistor P19 is connected between output terminal O41 and a base of transistor B10, and transistor N33 is connected between the base of transistor B10 and the ground terminal. Transistor N32 is connected between output terminal O41 and the ground terminal. A control signal CTLL is applied to gates of transistors P19, N33, and a control signal CTLL is applied to a gate of transistor N32 through delay circuit DL1 and inverter G1.

When control signals CTLH and CTLL both change from "H" to "L", transistor P19 turns on and transistor N33 turns off. Thus, current flows to the base of transistor B10 through transistor P19 from output terminal O41. As a result, transistor B10 attains an on state, and charge of output terminal O41 is supplied to the ground terminal. Accordingly, the potential of output terminal O41 rapidly decreases.

Immediately after a fall of control signal CTLL, an output of inverter G1 is at "L", so that transistor N32 stays in an off state. When a delay time in delay circuit DL1 has passed after a fall of control signal CTLL, an output of inverter G1 rises to "H", and transistor N32 turns on.

A sum of signal delay times in delay circuit DL1 and inverter G1 is set to about a time necessary for the potential of output terminal O41 to decrease to some extent with transistor B10 coming in an on state.

When the potential of output terminal O41 decreases to some extent, current flowing to transistor P19 decreases, and transistor B10 gradually gets closer to an off state due to a decrease in base current. When the source-gate voltage of transistor P19 becomes a threshold value voltage of transistor P19 or lower, transistor P19 turns off. Thus, transistor B10 completely turns off with disappearance of base current. When transistor B10 turns off, transistor N32 turns on instead. Accordingly, after that, potential of output terminal O41 is supplied to the ground terminal through transistor N32. As a result, the potential of output terminal O41 slowly decreases to 0.4V or lower.

When both of control signals CTLH and CTLL change from "L" to "H", transistor P19 turns off and transistor N33 turns on. Thus, base current is not supplied to transistor B2 and transistor B2 is brought into an off state.

Immediately after a rise of a control signal CTLL, an output of inverter G1 is still at "H", so that current somewhat flows to the ground terminal from output terminal O41 through transistor N32. However, pull-up circuit 31 supplies current sufficiently larger than current flowing to transistor N32 with bipolar transistor B9 from the power-supply terminal to the output terminal O41.

Accordingly, the potential of output terminal O41 rapidly rises to "H" substantially without being affected by transistor N32 in an on state.

When a control signal CTLH attains "L" and a control signal CTLL attains "H", transistor N33 turns on and transistors B9, N32 and P19 turn off. Thus, current is not supplied to a base of transistor B10 and transistor B10 is also in an off state. Accordingly, output of a data signal from output terminal O41 is inhibited.

As described above, in the output buffer circuit 300 of FIG. 21, the potential of output terminal O41 rapidly decreases until it gets somewhat closer to the ground potential and slowly decreases to 0.4V or lower thereafter. As a result, occurrence of ringing is prevented and the standard of TTL SRAM is satisfied.

In the output buffer circuit 300 of FIG. 22, pull-down circuit 302 includes a PMOS transistor P19, NMOS transistors N32 and N34, a bipolar transistor B10, a resistor R3, a delay circuit DL1 and an inverter G1.

Transistor B10 is connected between an output terminal O41 and a ground terminal. Transistor N34 is connected between output terminal O41 and a base of transistor B10 and resistor R3 is connected between the base of transistor B10 and the ground terminal. Transistor P19 is connected between output terminal O41 and the base of transistor B10 and transistor N32 is connected between the base of transistor B10 and the output terminal.

A control signal CTLL is applied to a gate of transistor P19 and a control signal CTLL is applied to gates of transistors N32 and N34 through delay circuit DL1 and inverter G1.

Also in the output circuit 300 of FIG. 22, when control signals CTLH and CTLL both change from "H" to "L", the potential of output terminal O41 changes from "H" to "L". Also, when both of control signals CTLH and CTLL change from "L" to "H", the potential of output terminal O41 changes from "L" to "H". Also, when a control signal CTLH attains "L" and a control signal CTLL attains "H", a data signal is not outputted from output terminal O41.

When a control signal CTLL changes from "H" to "L", transistor P19 turns on and current flows to the base of transistor B10 and resistor R3 from output terminal O41. Since a resistance value of resistor R3 is large, current flowing to the ground terminal through resistor R3 is small and almost all of current extracted from output terminal O41 by transistor P19 is supplied to the base of transistor B10.

Thus, transistor B10 turns on and charge of output terminal O41 is rapidly supplied to the ground terminal. As a result, the potential of output terminal O41 rapidly falls. When the potential of output terminal O41 attains a somewhat low value, by a decrease in source-gate voltage of transistor P19, current supplied to the base of transistor B10 decreases. Accordingly, an amount of charge supplied to the ground terminal from output terminal O41 by transistor B10 also decreases.

When the source-gate voltage of transistor P19 becomes its threshold value voltage or lower, transistor P19 turns off and current is not supplied to the base of transistor B10 anymore. Accordingly, transistor B10 also turns off.

Immediately after a fall of control signal CTLL, with operation of delay circuit DL1, both of transistors N32 and N34 are in an off state. Subsequently, however, when a time has passed corresponding to a sum of signal delay times in delay circuit DL1 and inverter G1, an output of inverter G1 attains "H" and both transistors N32 and N34 turn on.

A sum of signal delay times in delay circuit DL1 and inverter G1 is set to about a time required to decrease the potential of output terminal O41 to some extent to turn off transistors P19 and B10. Therefore, when transistor B10 turns off, transistors N32 and N34 turn on instead.

Thus, the charge of output terminal O41 is slowly supplied to the ground terminal through transistors N32 and N34 thereafter. As a result, the potential of output terminal O41 slowly decreases to attain 0.4V or lower.

When a control signal CTLL changes from "L" to "H", transistor P19 turns off. Thus, current is not supplied to the base of transistor B10.

Immediately after a rise of control signal CTLL, an output of inverter G1 still remains at "H", so that transistor N34 is held in an on state. However, since transistor N32 is also in an on state in a period in which transistor N34 is in an on state, current extracted by transistor N34 from output terminal O41 substantially all flows to the ground terminal through transistor N32 and not supplied to the base of transistor B10. Therefore, transistor B10 does not attain an on state.

When a time corresponding to a sum of signal delay times in delay circuit DL1 and inverter G1 from a rise of a control signal CTLL has passed, an output of inverter G1 attains "L". Thus, both of transistors N32 and N34 turn on, and a current path between the base of transistor B10 and output terminal O41 is completely intercepted.

Accordingly, the potential of output terminal O41 rapidly rises to "H" in response to a rise of a control signal CTLH.

In the output buffer circuit 300 of FIG. 22, if current leaks from transistors P19 and N34 in a period in which both control signals CTLH and CTLL are at "H", the leaking current flows to the ground terminal through resistor R3. Therefore, it is prevented that transistor B10 is slightly brought into an on state due to leakage of current.

In the output buffer circuits 300 of FIGS. 20 through 22, if the signal delay time of inverter G1 is approximately equal to a time required by the potential of output terminal O41 being reduced to somewhat low potential by transistor B10, the delay circuit D1 can be removed.

The structure of pull-up circuit 301 of the output buffer circuit 300 of FIGS. 18 through 22 can be another structure if it can electrically connect output terminal O41 to the power-supply terminal when a rise of potential of output terminal O41 is instructed by control signal CTLH. Also, the structure of output control circuit 350 shown in FIG. 53 can be arbitrarily selected corresponding to structures of pull-up circuit 301 and pull-down circuit 302.

Figure 23:
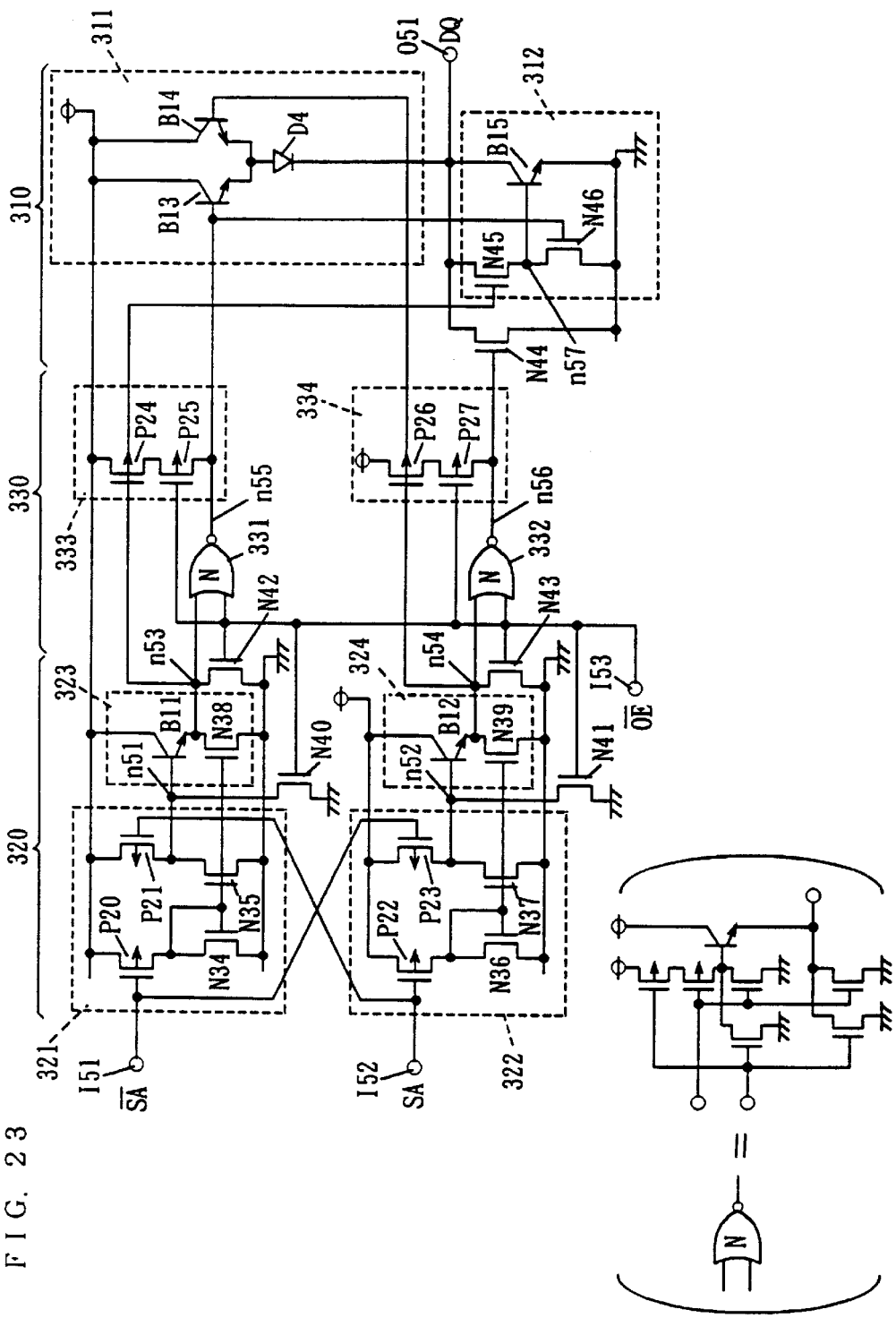
FIG. 23 is a diagram showing another example of an output buffer circuit.

The output buffer circuit of FIG. 23 includes a level conversion circuit 320, an output control circuit 330 and an output driver circuit 310. The level conversion circuit 320 includes CMOS current mirror circuits 321 and 322, BiNMOS drivers 323 and 324, and NMOS transistors N40 and N41. Output control circuit 330 includes BiMOS·2NOR circuits 331 and 332, NMOS transistors N42 and N43, and PMOS serial circuits 333 and 334. Output driver circuit 310 includes a bipolar pull-up circuit 311, a BiNMOS pull-down circuit 312 and an NMOS transistor N44.

Input terminals 151 and 152 receive input signals $\overline{SA}$, SA, respectively. CMOS current mirror circuit 321 includes transistors P20, P21, N34 and N35, and CMOS current mirror circuit 322 includes transistors P22, P23, N36 and N37. CMOS current mirror circuits 321 and 322 level-convert input signals (sense amplifier outputs) $\overline{SA}$, SA with small amplitude (approximately 0.8V–1.2V) into signals of MOS level (0–5V), and outputs the same to nodes n51, n52.

BiNMOS driver 323 includes transistors B11 and N38, and BiNMOS driver 324 includes transistors B12 and N39. BiNMOS drivers 323 and 324 act as drivers for operating at a high speed BiNMOS·2NOR circuits 331 and 332 at the next stage.

Transistors N40, N41, N42, N43 turn on when an output enable signal $\overline{OE}$ is at "H" (an output disable state), and bring, to "L", outputs of CMOS current mirror circuits 321 and 322, and BiNMOS drivers 323 and 324.

BiNMOS·2NOR circuits 331 and 332 are composed of BiNMOS gates for operating output driver circuit 310 at the next stage at a high speed. Also, they have 2-input NOR structure in order to bring an output into enable and disable states with an output enable signal $\overline{OE}$.

A CMOS·2NOR circuit or a BiCMOS·2NOR circuit may be employed in place of BiNMOS·2NOR circuits 331 and 332.

PMOS serial circuit 333 includes transistors P24 and P25, and PMOS serial circuit 334 includes transistors P26, P27. PMOS serial circuits 333 and 334 are provided for raising potential of "H" at nodes n55, n56 to power-supply potential Vcc.

The potential of "H" is raised to power-supply potential Vcc in order to bring potential ($V_{OH}$) of "H" 0 of an output signal of an output terminal O51 to 2.4V or higher. Without PMOS serial circuits 333, 334, when Vcc=4.5V, then $V_{OH}$=Vcc−3$V_{BE}$=4.5−3·0.8=2.1 [V]. Accordingly, the standard that $V_{OH}$ is equal to or higher than 2.4V is not satisfied.

Pull-up circuit 311 includes transistors B13 and B14 and a diode D4, and pull-down circuit 312 includes transistors N45, N46 and B15.

Bipolar transistor B14 on the pull-up side receives an output signal of node n54 to turn on or off. Bipolar transistor B13 on the pull-up side receives an output signal of node n55 to turn on or off. Accordingly, transistor B14 turns on earlier than transistor B13, and timings of turn-on of those transistors B13 and B14 deviate from each other accordingly.

As a result, the time change of current di/dt can be made small. As the noise voltage V can be expressed as V=L·di/dt, the noise voltage V can be reduced. L indicates inductance herein.

Diode D4 is used for reducing potential $V_{OH}$ of "H" of output terminal O51 by 1$V_{BE}$ (0.8V). If an output amplitude is made small, switching of an output signal from "H" to "L" is made quick.

NMOS transistor N45 on the pull-down side receives potential of node n53 to turn on and off, and bipolar transistor B15 on the pull-down side receives potential of node n57 to turn on or off. Transistor N46 is used for extracting base current of transistor B15.

Transistor N44 receives potential of node n56 and turns on or off. Accordingly, transistor B15 turns on earlier than transistor N44, so that timing of turn-on of transistors B15 and N44 deviates from each other. Accordingly, di/dt becomes smaller, and noise voltage can be reduced.

Transistor N44 is used for bringing potential VOL of "L" of output terminal O51 to 0.4V or lower. If there is no transistor N44 provided, the potential $V_{OL}$ of "L" becomes high by base-emitter voltage $V_{BE}$ (0.8V) of transistor B15. Accordingly, the potential $V_{OL}$ of "L" becomes larger than 0.4V, which does not satisfy the standard.

With the above-described structure, an output buffer circuit capable of high speed operation in which occurrence of output noise is suppressed is obtained.

Figure 24:
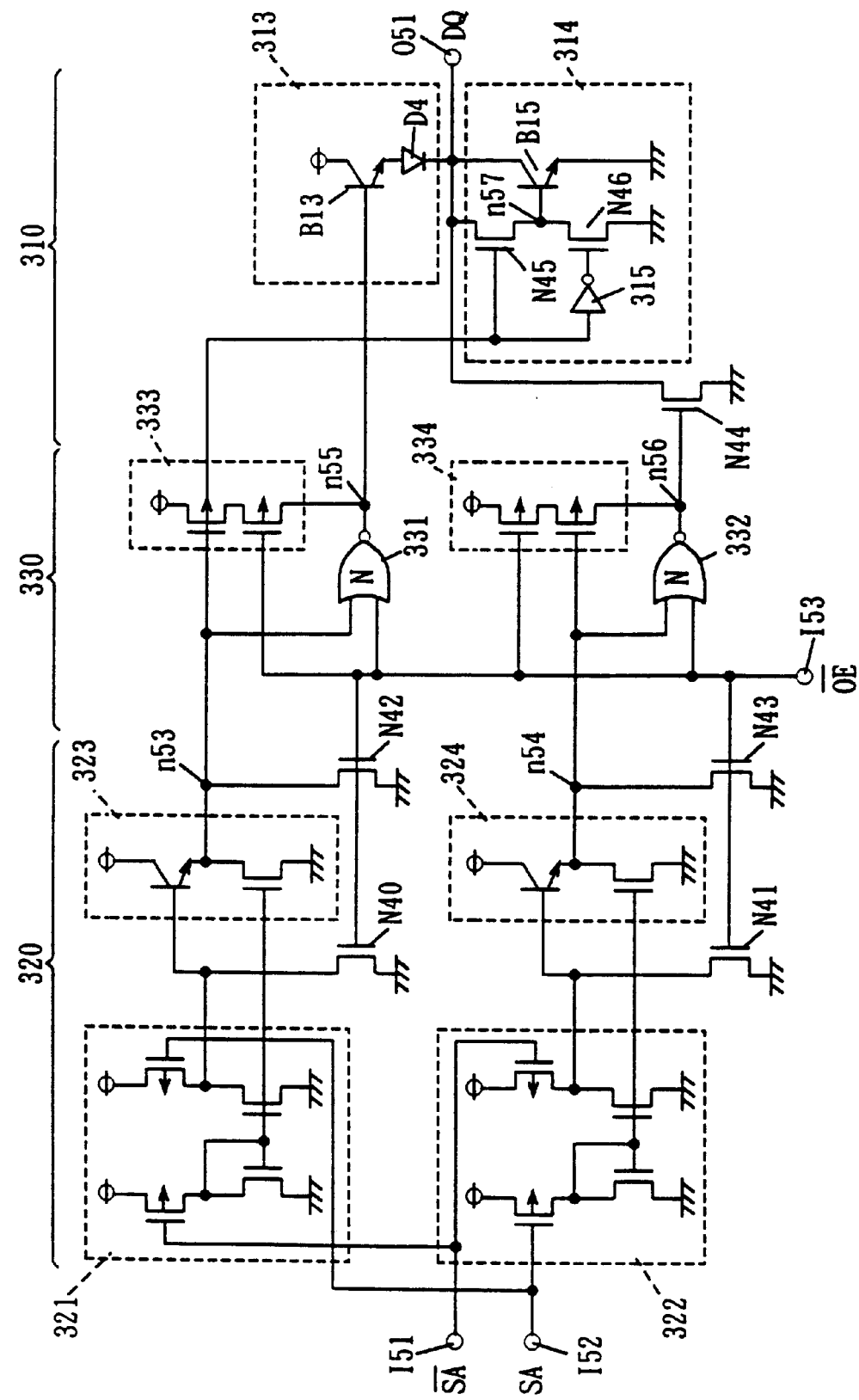
FIG. 24 is a diagram showing another example of an output buffer circuit.

In the output buffer circuit of FIG. 24, the bipolar transistor B14 on the pull-up side in the output buffer circuit of FIG. 23 is removed, and a transistor N46 is controlled by BiCMOS inverter 315. Operation and roles of respective circuits of the output buffer circuit of FIG. 24 are the same as those of output buffer circuit of FIG. 23.

(f) Bit Line Load Circuit (FIGS. 25 through 33)

The bit line load circuits of FIGS. 25 through 32 are used in the bit line load circuit & write driver 24 shown in FIG. 1.

Figure 25:
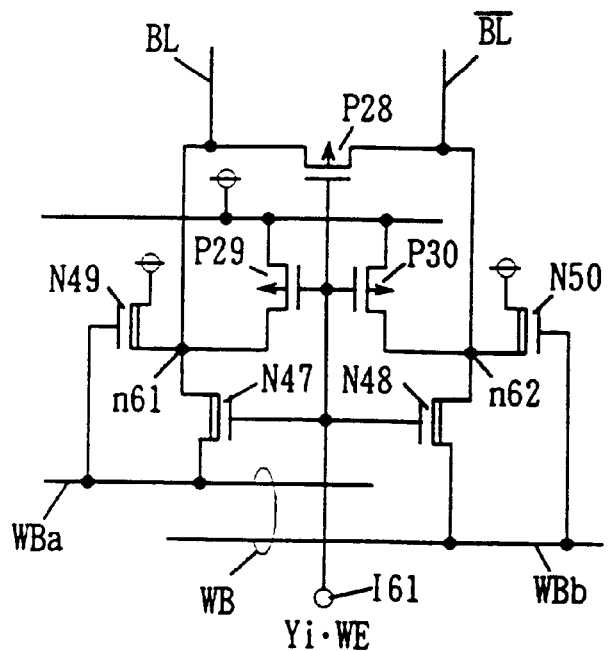
FIG. 25 is a diagram showing one example of a bit line load circuit.

The bit line load circuit of FIG. 25 includes an equalize transistor P28, pull-up transistors P29, P30, N49, N50, and transfer gate transistors N47 and N48.

Transistor P28 is connected between bit lines BL, $\overline{BL}$, transistor P29 is connected between a power-supply terminal and a node n61, and transistor P30 is connected between the power-supply terminal and a node n62. Transistor N47 is connected between node n61 and a write data bus WBa, and transistor N48 is connected between node n62 and a write data bus WBb. Transistor N49 is connected between the power-supply terminal and node n61, and transistor N50 is connected between the power-supply terminal and node n62.

Gates of transistors P28 through P30, N47, N48 are connected to an input terminal I61. A gate of transistor N49 is connected to write data bus WBa, and a gate of transistor N50 is connected to write data bus WBb.

In reading operation, a signal Yi·WE attains "L". It turns on transistors P28–P30, and turns off transistors N47 and N48. At this time, since both write data buses WBa and WBb are at "H", gate potential of transistors N49 and N50 are equal to power-supply voltage Vcc.

However, because bit lines BL, $\overline{BL}$ are charged close to the power-supply voltage Vcc by transistors P28–P30, source-drain voltages of transistors N49, N50 which are diode-connected become $V_{TH}$ or lower, and transistors N49, N50 are OFF. The $V_{TH}$ are threshold value voltages of transistors N49 and N50.

When cell current of a selected memory cell flows to transistors P28–P30, a potential difference occurs between bit lines BL, $\overline{BL}$, which is transmitted to a read data bus through column selection circuit 25 of FIG. 1. Equalize transistor P28 works to limit voltage amplitude between bit lines BL, $\overline{BL}$.

In writing operation, a signal Yi·WE attains "H". it turns off transistors P28–P30 and turns on transistors N47 and N48. In writing operation, potential of one of write data buses WBa and WBb attains "L", which is transmitted to bit line BL or $\overline{BL}$ through transistor N47 or N48. At this time, because transistors P28–P30 are OFF, and transistor N49 or N40 connected to a bit line which is to attain "L" is OFF, write current does not flow to the bit line load circuit.

When writing operation is finished, both of write data buses WBa and WBb attain "H". Thus, a bit line at "L" is charged by a write driver through transistor N47 or N48.

Also, since gate potential of transistors N49, N50 attain "H", bit lines are also charged through transistor N49 or N50.

Furthermore, a signal Yi·WE changes to "L" with the end of writing operation, and transistors P28–P30 turn on. Accordingly, bit lines are charged also by transistors P28–P30.

The above-described effects can be obtained also by setting a threshold value voltage $V_{TH}$ of NMOS transistor in the bit line load circuit to the same threshold value voltage as that of a peripheral circuit, but bit lines BL, $\overline{BL}$ can be charged more rapidly by setting the threshold value voltage VTH of NMOS transistor lower than that of a peripheral circuit.

When the NMOS transistor shown herein turns off, the source potential rises close to power-supply potential Vcc, so that there is no fear of current leakage even if the threshold value voltage $V_{TH}$ is low.

Figure 62:
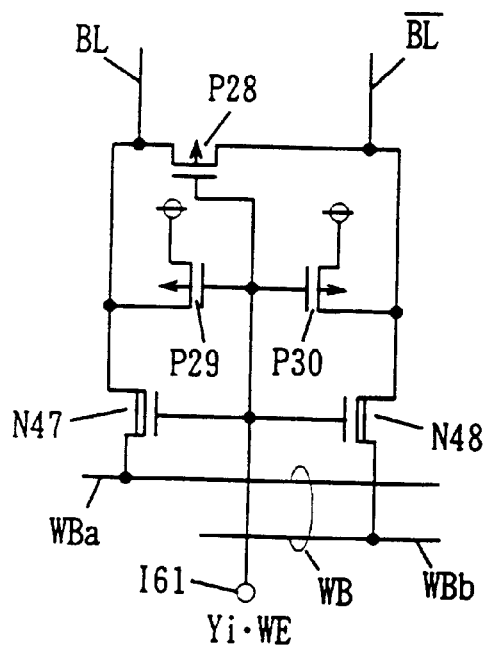
FIG. 62 is a diagram showing one example of a conventional bit line load circuit.
Figure 63:
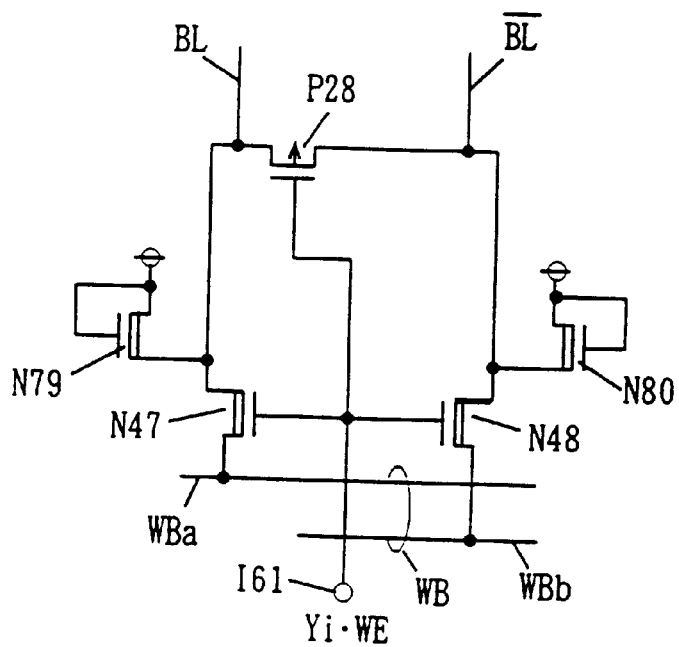
FIG. 63 is a diagram showing another example of a conventional bit line load circuit.
Figure 64:
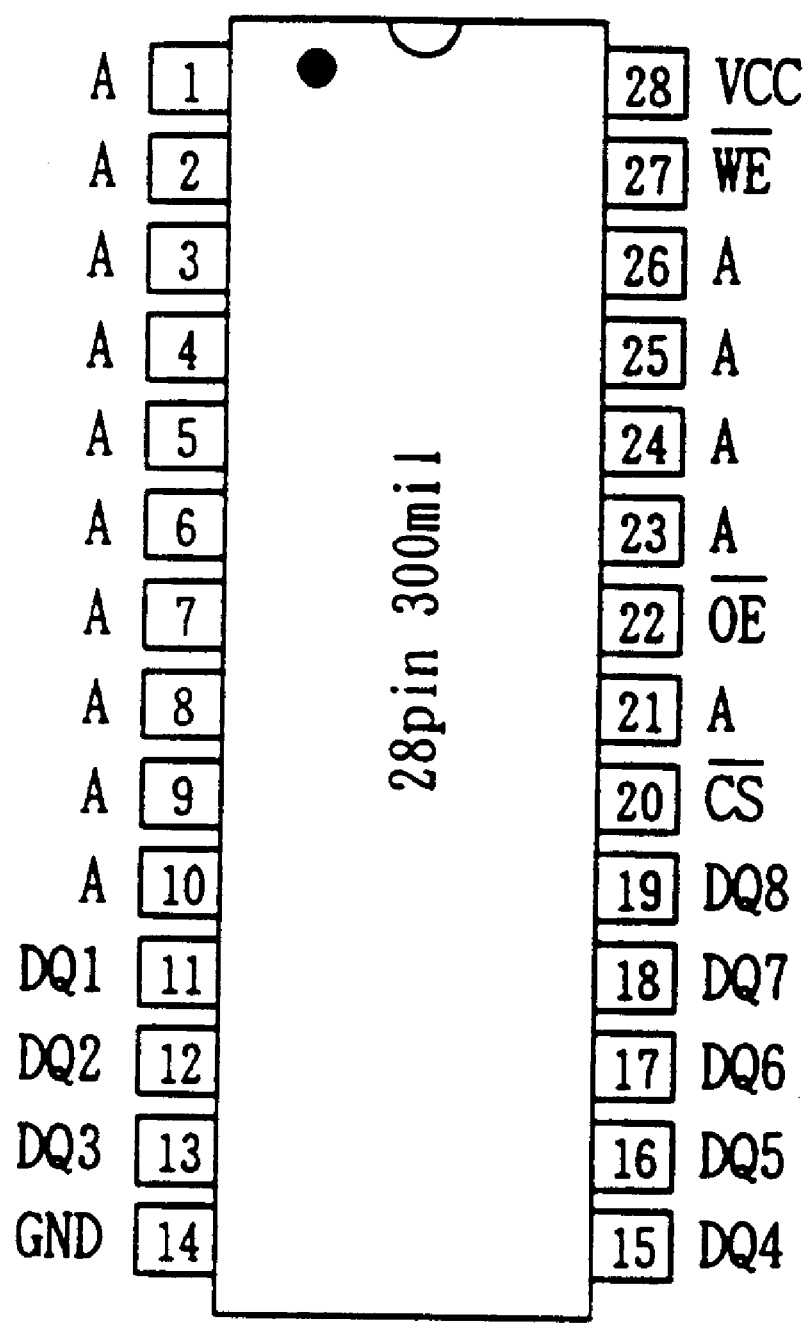
FIG. 64 is a diagram showing pin arrangement of the corner power pin type.
Figure 65:
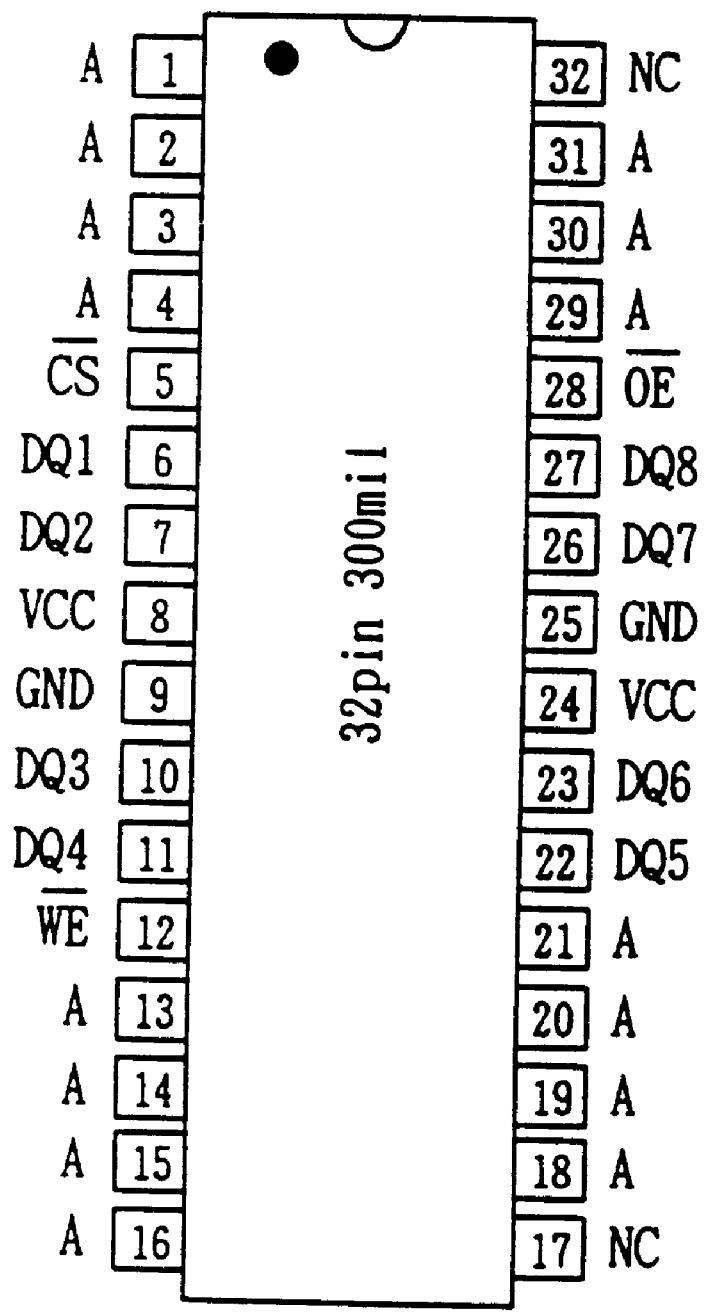
FIG. 65 is a diagram showing pin arrangement of the dual center power pin type.

Comparing the bit line load circuit of FIG. 25 with bit line load circuits of FIGS. 62 and 63, since bit lines BL, $\overline{BL}$ are charged by transistors N49, N50 after writing operation is finished, bit lines BL, $\overline{BL}$ can be charged at a high speed. Also, since transistor N49 or N50 connected to a write data bus attaining "L" turns off in writing operation, write current does not flow.

Figure 26:
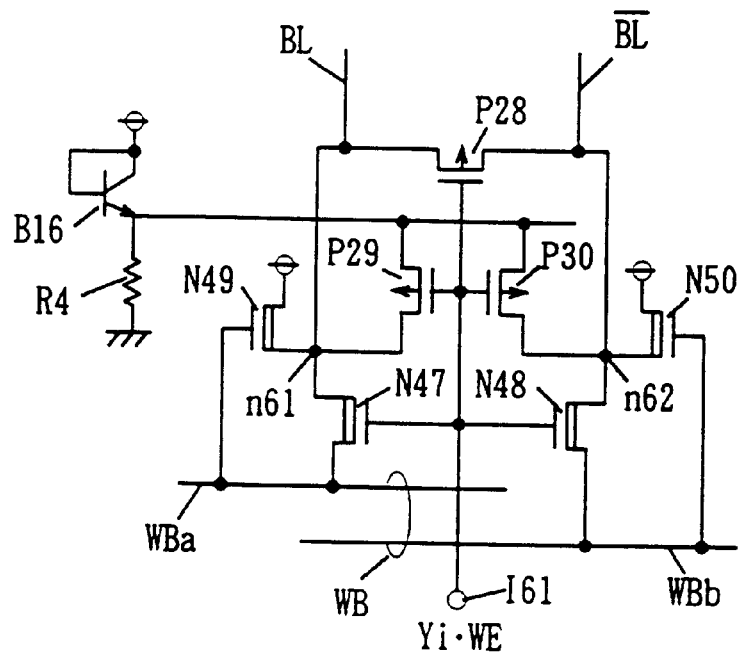
FIG. 26 is a diagram showing another example of a bit line load circuit.

In the bit line load circuit of FIG. 26, a transistor B16 and a resistor R4 are further provided. Sources of transistors P29 and P30 are connected to a connection point of transistor B16 and resistor R4 which are diode-connected. Thus, source potential of transistors P29 and P30 becomes lower than the power-supply potential Vcc by base-emitter voltage $V_{BE}$ of transistor B16. As a result, potentials of bit lines BL, $\overline{BL}$ attain VCC–$V_{BE}$.

Accordingly, a period in which bit lines BL, $\overline{BL}$ are charged only by transistors P28–P30 becomes short, and charging of bit lines BL, $\overline{BL}$ can be performed at a high speed.

Transistor B16 may be replaced by an NMOS transistor which is diode-connected. Also, transistor B16 may be replaced by a diode utilizing collector-base junction.

Resistor R4 is provided to keep the base-emitter voltage $V_{BE}$ of transistor B16 constant even when potentials of word lines connected to all memory cells attain "L" and cell current does not flow. Accordingly, in a structure in which constant cell current always flows to transistor B16, the same effects can be obtained without resistor R4. Resistor R4 can be made of ON-resistance of a transistor.

In the bit line load circuit of FIG. 25, bit lines BL, $\overline{BL}$ are charged to potential Vcc–$V_{TH}$ by transistors N47, N48, N49, N50, and bit lines BL, $\overline{BL}$ are charged to higher potential by transistors P28, P29, P30. Therefore, it has a disadvantage that charging of bit lines BL, $\overline{BL}$ is somewhat late.

Figure 27:
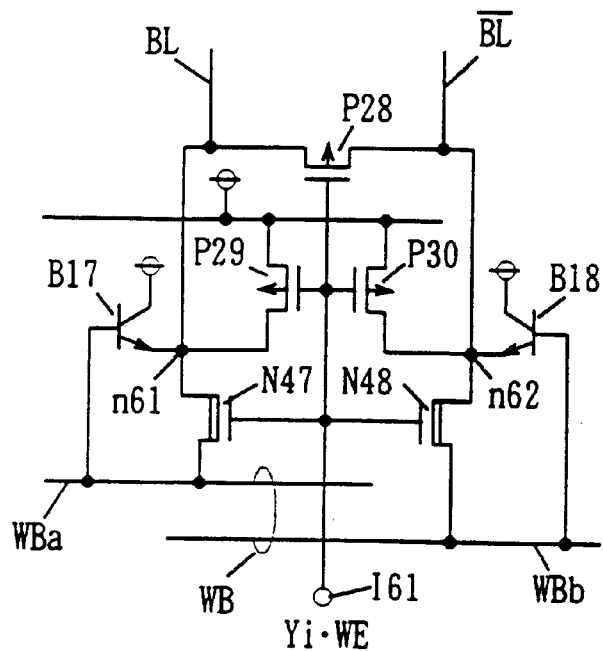
FIG. 27 is a diagram showing another example of a bit line load circuit.

In the bit line load circuit of FIG. 27, NMOS transistors N49 and N50 in the bit line load circuit of FIG. 25 are replaced by bipolar transistors B17 and B18. Bit lines BL, $\overline{BL}$ are charged by bipolar transistors B17 and B18 after writing operation, so that bit lines BL, $\overline{BL}$ can be charged to potential Vcc–$V_{BE}$ at an extremely high speed.

Figure 28:
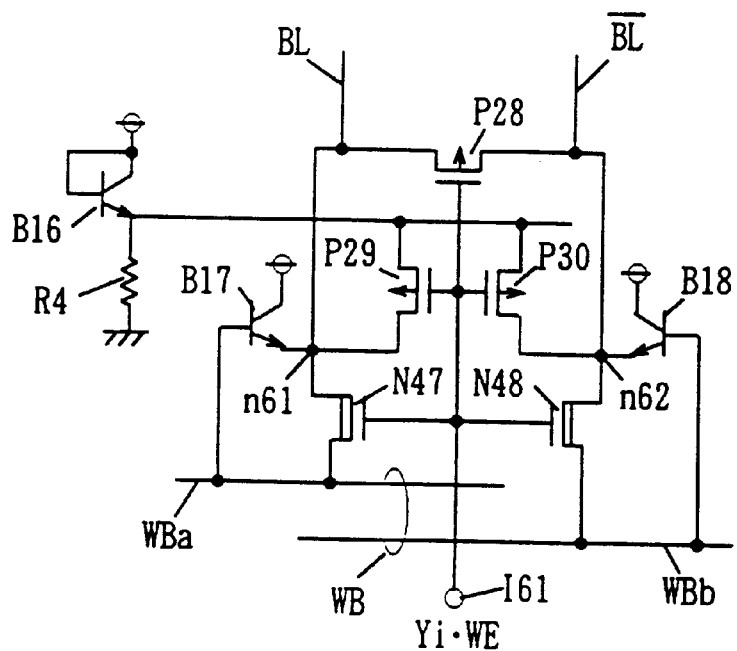
FIG. 28 is a diagram showing another example of a bit line load circuit.

In the bit line load circuit of FIG. 28, NMOS transistors N49, N50 in the bit line load circuit of FIG. 26 are replaced by bipolar transistors B17 and B18. Thus, the potential of bit lines BL, $\overline{BL}$ is set to Vcc–$V_{BE}$. Accordingly, it is not necessary to charge bit lines BL, $\overline{BL}$ to or higher than potential Vcc–$V_{BE}$ by transistors P28–P30, so that bit lines BL, $\overline{BL}$ can be charged at a higher speed.

Figure 29:
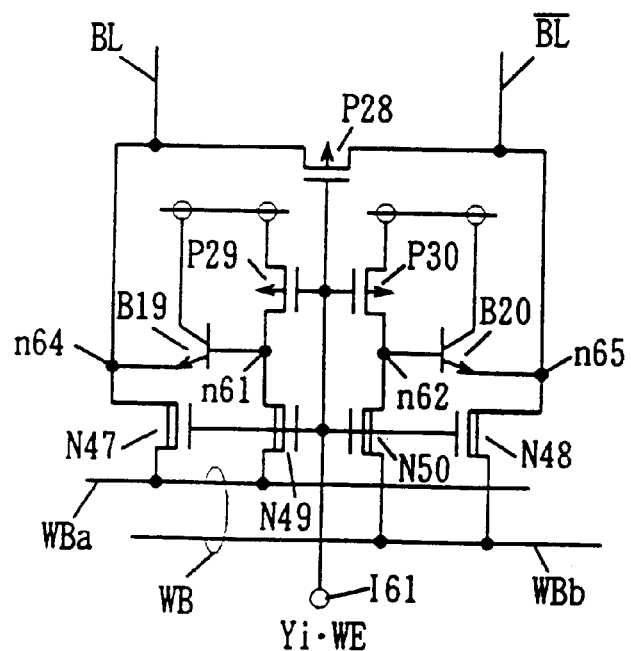
FIG. 29 is a diagram showing another example of a bit line load circuit.

The bit line load circuit of FIG. 29 includes an equalize transistor P28, pull-up transistors B19, B20, transfer gate transistors N47, N48, and control transistors P29, P30, N49, N50 for controlling transistors B19 and B20.

Pull-up transistor B19 is connected between a power-supply terminal and a node n64, and its base is connected to a node n61. Pull-up transistor B20 is connected between the power-supply terminal and a node n65 and has its base connected to a node n62.

In reading operation, a signal Yi·WE attains "L". Thus, transistors P28–P30 turn on and transistors N47–N50 turn off. Since transistors P29 and P30 are on and transistors N49 and N50 are off, base potentials of transistors B19 and B20 are raised to the power-supply potential Vcc the same as the collector potential. Accordingly, transistors B19 and B20 act as diodes.

When cell current of a selected memory cell flows to transistor P28 and diode-connected transistors B19 and B20, a potential difference occurs between bit lines BL $\overline{BL}$, which is transmitted to a read data bus through column selection circuit 25 (FIG. 1). Equalize transistor P28 works to limit voltage amplitude between bit lines BL, $\overline{BL}$.

In writing operation, a signal Yi·WE attains "H". Thus, transistors P28–P30 turn off and transistors N47–N50 turn on. Potential of one of write data buses WBa and WBb attains "L" in writing operation, and data of write data buses WBa and WBb are transmitted to bit lines BL, $\overline{BL}$ through transistors N47, N48. Also, potentials of write data buses WBa and WBb are transmitted to bases of transistors B19 and B20 through transistors N49 and N50.

Accordingly, base potential of transistor B19 or B20 connected to bit line BL or $\overline{BL}$ to be "L" attains "L", and that transistor turns off. Since transistor P28 is also OFF, write current does not flow to the bit line load circuit.

When writing operation is finished, write data buses WBa and WBb both attain "H". Thus, bit line BL or $\overline{BL}$ which has attained "L" is charged by a write driver through transistor N47 or N48.

Also, since a base of transistor B19 or B20 which was in an off state is charged by transistor N49 or N50, transistors B19 and B20 turn on. Accordingly, bit lines BL, $\overline{BL}$ are also charged by transistors B19 and B20.

Furthermore, with the end of writing operation, a signal Yi·WE changes to "L". Thus, transistors P28–P30 turn on and base potentials of transistors B19 and B20 are charged to power-supply potential Vcc through transistors P29 and P30.

Figure 30:
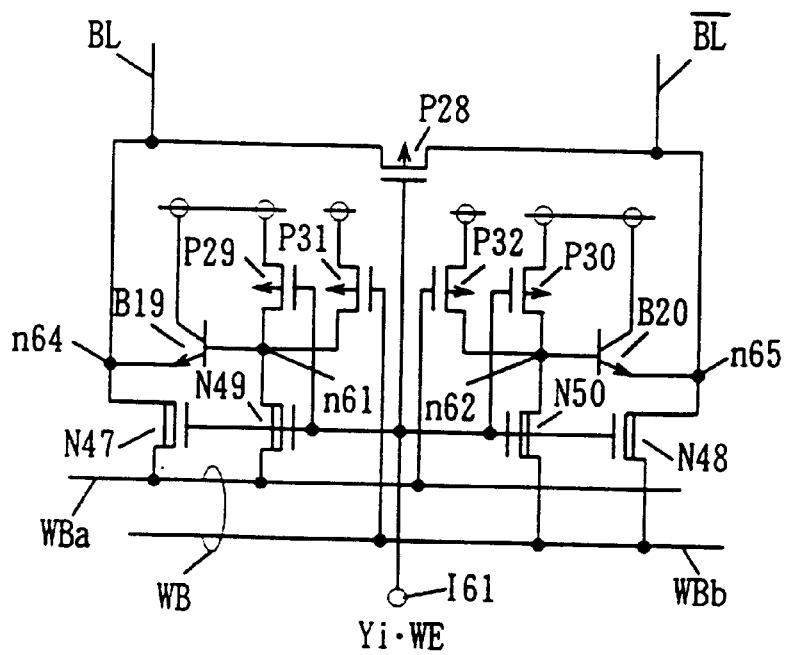
FIG. 30 is a diagram showing another example of a bit line load circuit.

In the bit line load circuit of FIG. 30, transistors P31 and P32 controlling transistors B19 and B20 are further added to the bit line load circuit of FIG. 29.

Figure 33:
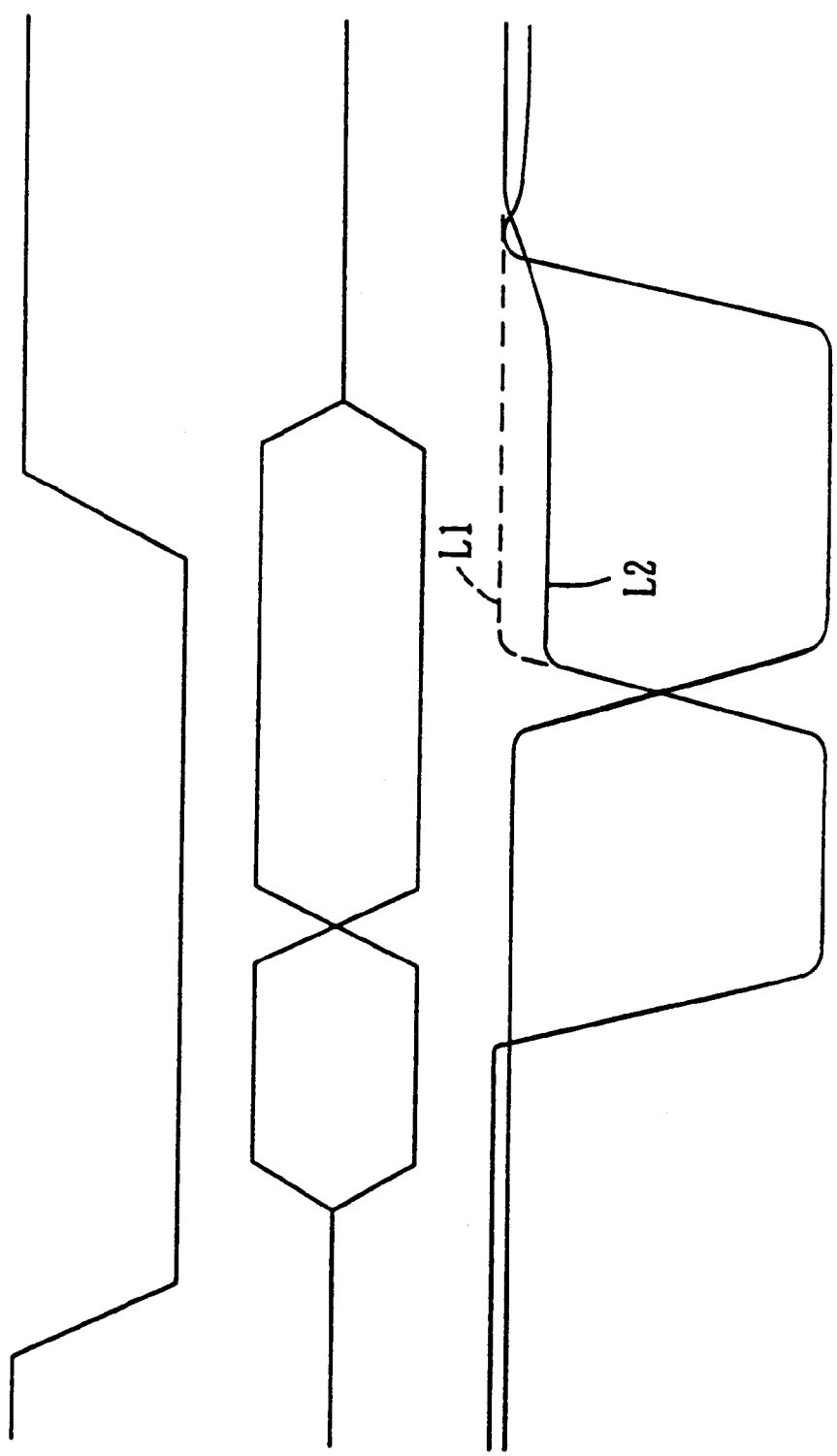
FIG. 33 is a diagram for use in describing characteristics of a bit line load circuit.

FIG. 33 shows change of bit line potential in writing operation. L1 indicates bit line potential in the bit line load circuit of FIG. 29, and L2 indicates potential of a bit line in the bit line load circuit of FIG. 30.

In the bit line load circuit of FIG. 29, potentials of write data buses WBa and WBb are transmitted to bit lines BL, $\overline{BL}$ through transistors N47 and N48, so that potential of "H" of bit line becomes potential lower than the potential of "H" of write data bus by a threshold value voltage $V_{TH}$ of transistors N47 and N48.

Accordingly, when a bit line of "L" is charged by transistor B19 or B20 after the end of writing operation, a phenomenon is likely to happen in which bit line potential of "L" becomes higher than the bit line potential of "H". In a BiCMOS SRAM having a sense amplifier with high sensitivity, opposite data are read out due to the phenomenon and access delay is also caused.

On the other hand, in the bit line load circuit of FIG. 30, by controlling base potentials of transistors B19, B20 with transistors P31 and P32 having gates connected to write data buses WBa and WBb, the bit line potential of "H" in writing operation can be made equal to the bit line potential of "H" in reading operation as shown by L2 in FIG. 33. The phenomenon in which the bit line potential of "L" becomes higher than the bit line potential of "H" can be thus prevented.

Figure 31:
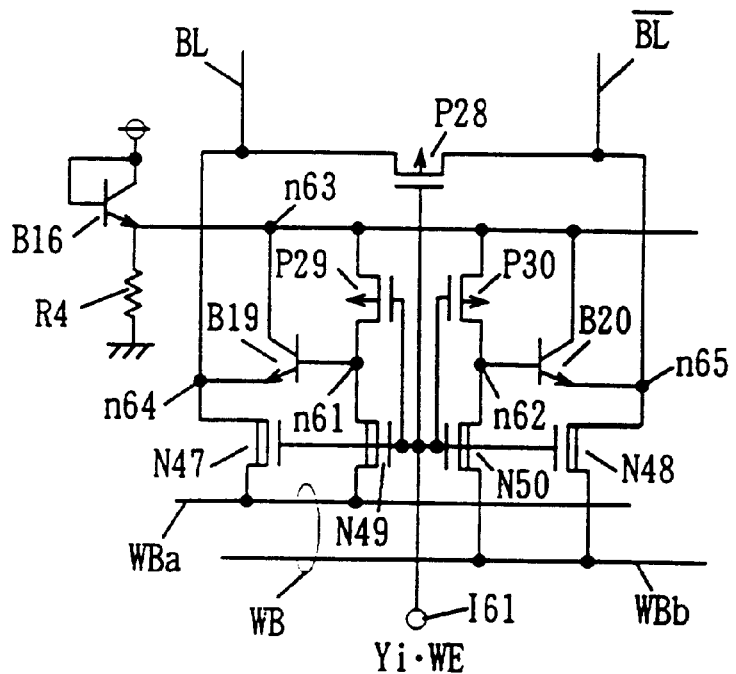
FIG. 31 is a diagram showing another example of a bit line load circuit.

In the bit line load circuit of FIG. 31, a transistor B16 and a resistor R4 are further added to the bit line load circuit of FIG. 29. Thus, read potentials of bit lines BL, $\overline{BL}$ are set to Vcc–2$V_{BE}$.

As a result, voltage amplitude of bit line load in writing operation becomes small, and bit lines BL, $\overline{BL}$ can be charged at a high speed.

Transistor B16 can be replaced by a diode-connected NMOS transistors. Also, transistor B16 may be replaced by a diode utilizing collector-base junction.

Resistor R4 is provided for holding base-emitter voltage $V_{BE}$ of transistor B16 even when potential of word lines connected to all memory cells attain "L" and cell current does not flow. Accordingly, in a structure in which constant cell current always flows, the same effects can be obtained without resistor R4. Also, resistor R4 can be composed of ON-resistance of a transistor.

Figure 32:
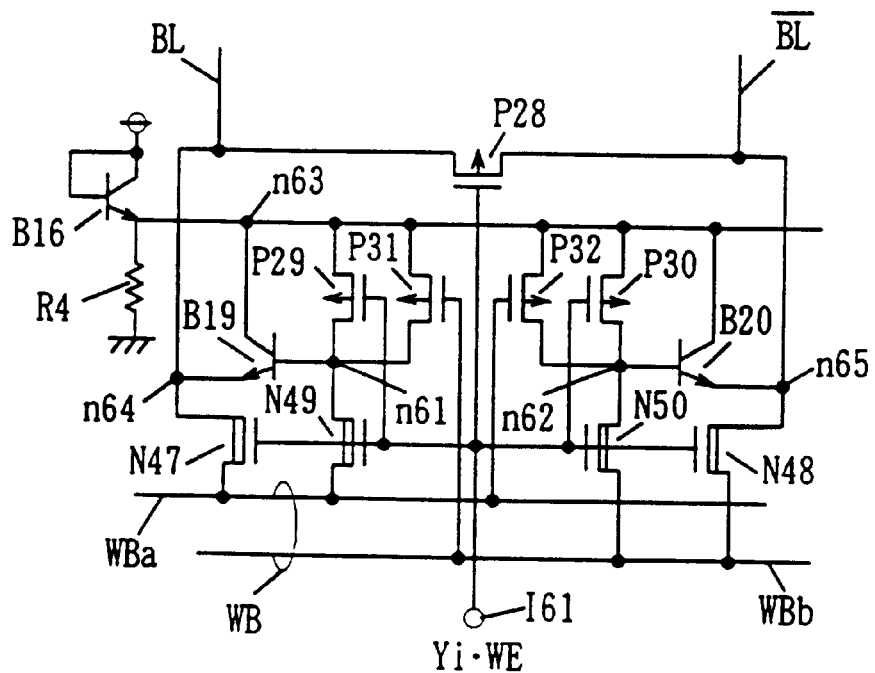
FIG. 32 is a diagram showing another example of a bit line load circuit.

In the bit line load circuit of FIG. 32, a transistor B16 and a resistor R4 are further added to the bit line load circuit of FIG. 30. Thus, similarly to the bit line load circuit of FIG. 31, read potential of bit lines BL, $\overline{BL}$ is set to Vcc–2$V_{BE}$.

According to the bit line load circuits of FIGS. 25 through 30, write current does not flow and also bit lines can be charged at a high speed after writing operation.

Figure 34:
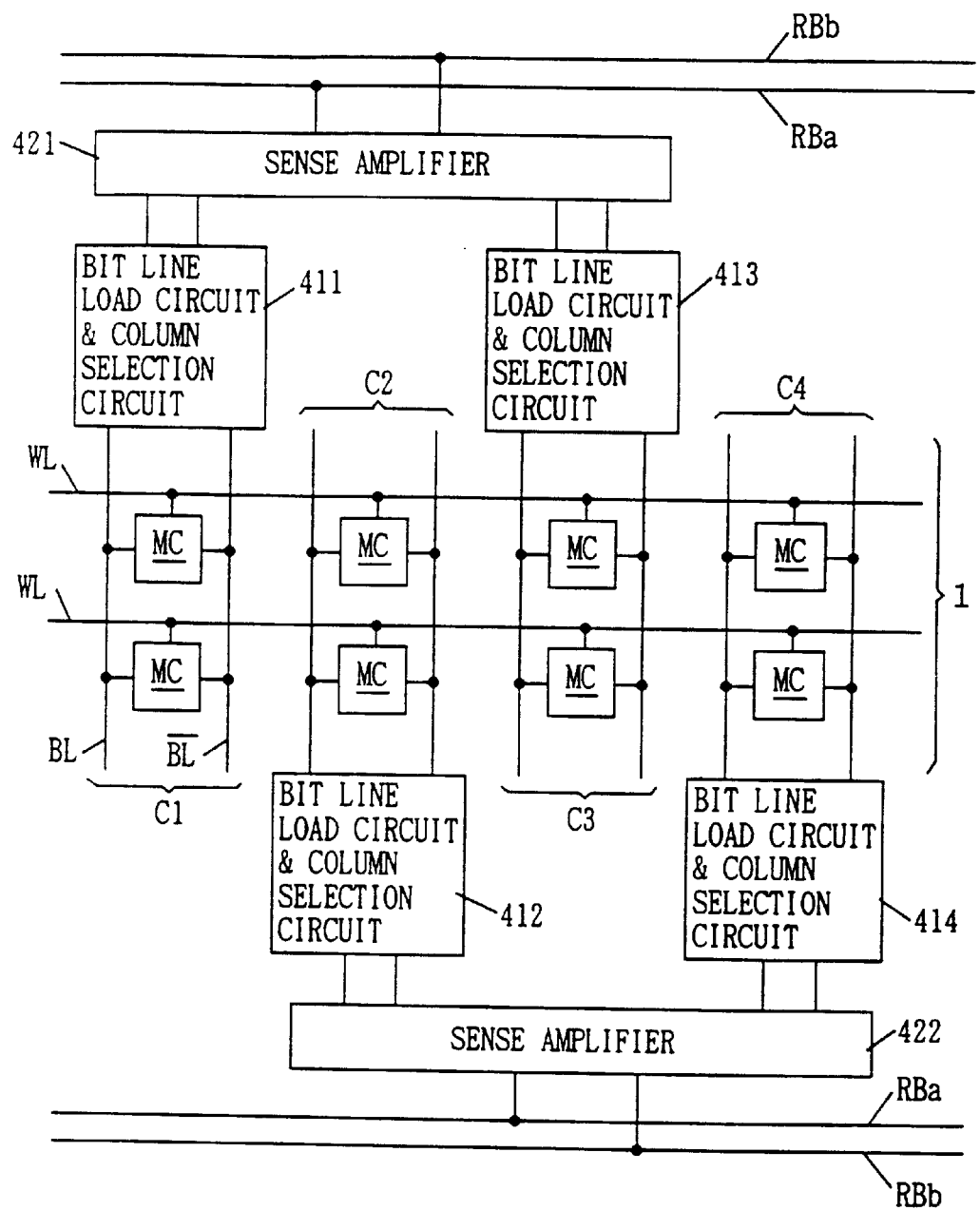
FIG. 34 is a diagram showing concept of a bit line load alternate arrangement.
Figure 35:
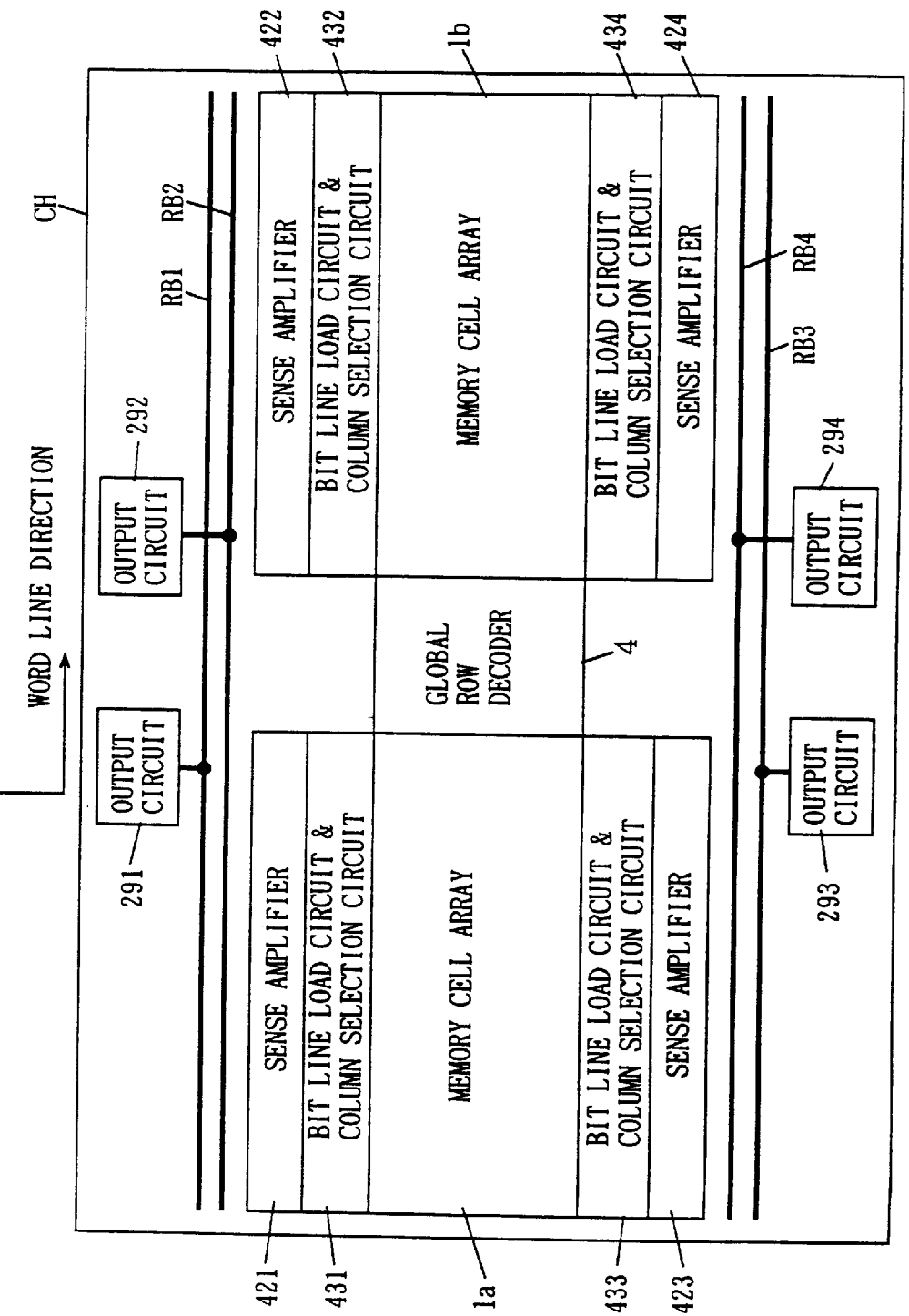
FIG. 35 is a diagram showing layout of a chip using a bit line load alternate arrangement.
Figure 36:
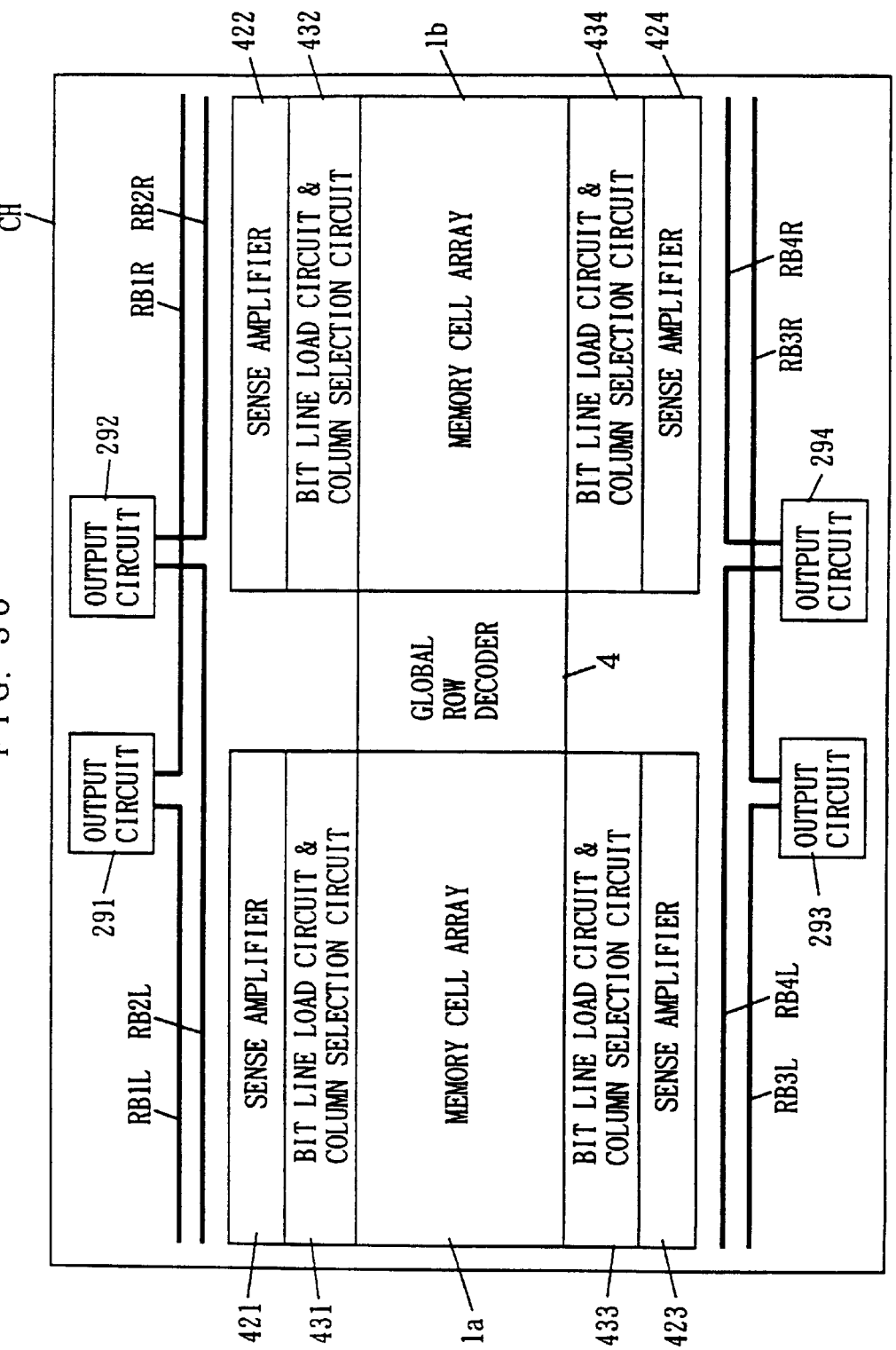
FIG. 36 is a diagram showing layout of a chip using a bit line load alternate arrangement.

(g) Bit Line Load Alternate Arrangement (FIGS. 34 through 36)

The bit line load alternate arrangement shown in FIGS. 34 through 36 are used for the SRAM of FIG. 1.

FIG. 34 is a conceptual diagram of bit line load alternate arrangement. Bit line load circuits & column selection circuits 411, 413, a sense amplifier 421 and read data buses RBa and RBb are provided on one end side of a plurality of columns C1 through C4 in a memory cell array 1, and bit line load circuits & column selection circuits 412 and 414, a sense amplifier 422 and read data buses RBa and RBb are provided on the other end side.

Column C1 is connected to bit line load circuit & column selection circuit 411 and column C3 is connected to bit line load circuit & column selection circuit 413. Column C2 is connected to bit line load circuit & column selection circuit 412 and column C4 is connected to bit line load circuit and column selection circuit 414.

Data of bit line pair BL, $\overline{BL}$ of columns C1 and C3 are applied to sense amplifier 421 through bit line load circuits & column selection circuits 411 and 413, and further applied to read data buses RBa and RBb. Data of bit line pair BL, $\overline{BL}$ of columns C2, C4 are applied to sense amplifier 422 through bit line load circuits & column selection circuits 412, 414, and further applied to read data buses RBa, RBb.

FIG. 35 is a diagram illustrating layout of the entirety of a chip CH of a SRAM using the bit line load alternate arrangement. In the SRAM, the center power pin arrangement is introduced.

A bit line load circuit and column selection circuit 431 and a sense amplifier 421 are provided on one side of memory cell array 1a and a bit line load circuit & column selection circuit 433 and a sense amplifier 423 are arranged on the other side. Bit line load circuit & column selection circuit 423 and a sense amplifier 422 are provided on one side of memory cell array 1b and bit line load circuit & column selection circuit 434 and a sense amplifier 424 are provided on the other side.

A global row decoder 4 is provided between memory cell arrays 1a and 1b. Read data buses RB1, RB2 and output circuits 291 and 292 are arranged on one side of memory cell arrays 1a, 1b and read data buses RB3, RB4 and output circuits 293, 294 are provided on the other side.

Data outputted from bit line load circuits & column selection circuits 431, 432 and sense amplifiers 421, 422 are applied to output circuits 291, 292 through read data buses RB1, RB2. Data outputted from bit line load circuits & column selection circuits 433, 434 and sense amplifiers 423, 424 are applied to output circuits 293, 294 through read data buses RB3, RB4.

Figure 66:
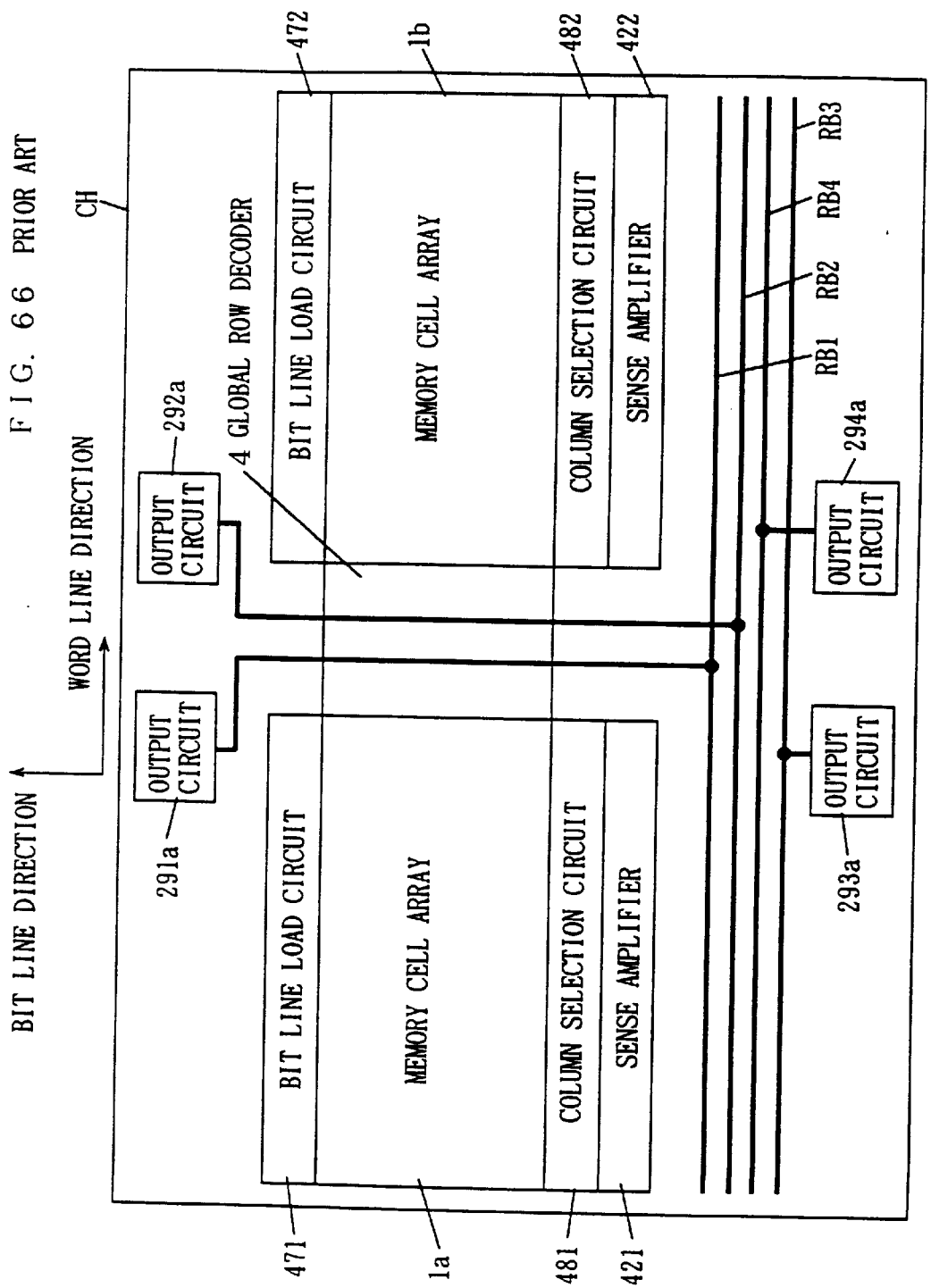
FIG. 66 is a diagram showing layout of the entirety of a chip of a conventional SRAM.

Comparing the layout of FIG. 35 with the layout of FIG. 66, lengths of read data buses RB1, RB2 connected to output circuits 291, 292 are the same as the lengths of read data buses RB3, RB4 connected to output circuits 293, 294, which shortens an access time.

In the layout of FIG. 36, read data buses RB1–RB4 are respectively divided into data buses RB1L–RB4L corresponding to left memory cell array 1a and data buses RB1R–RB4R corresponding to the right memory cell array 1b. Logical sum operation is performed with respect to data of left and write data buses connected to respective output circuits 291–294, and which is outputted.

According to the layout of FIG. 36, capacitance of each data bus becomes half, which enables higher speed of operation.

According to the bit line load alternate arrangement, the following advantages can be obtained.

(1) Respective bit line load circuits & column selection circuits can be laid out using pitches of 2 columns.

(2) A length of a data bus can be shortened even with the center power pin arrangement.

(3) By combination with a shift redundancy circuit, defects of continuing two columns can be easily repaired.

The advantage of (1) is extremely effective when actually using a circuit including a large number of elements as shown in FIG. 2 as a bit line load circuit & column selection circuit.

(h) Shift Redundancy Circuit (FIGS. 37 through 41)

Figure 37:
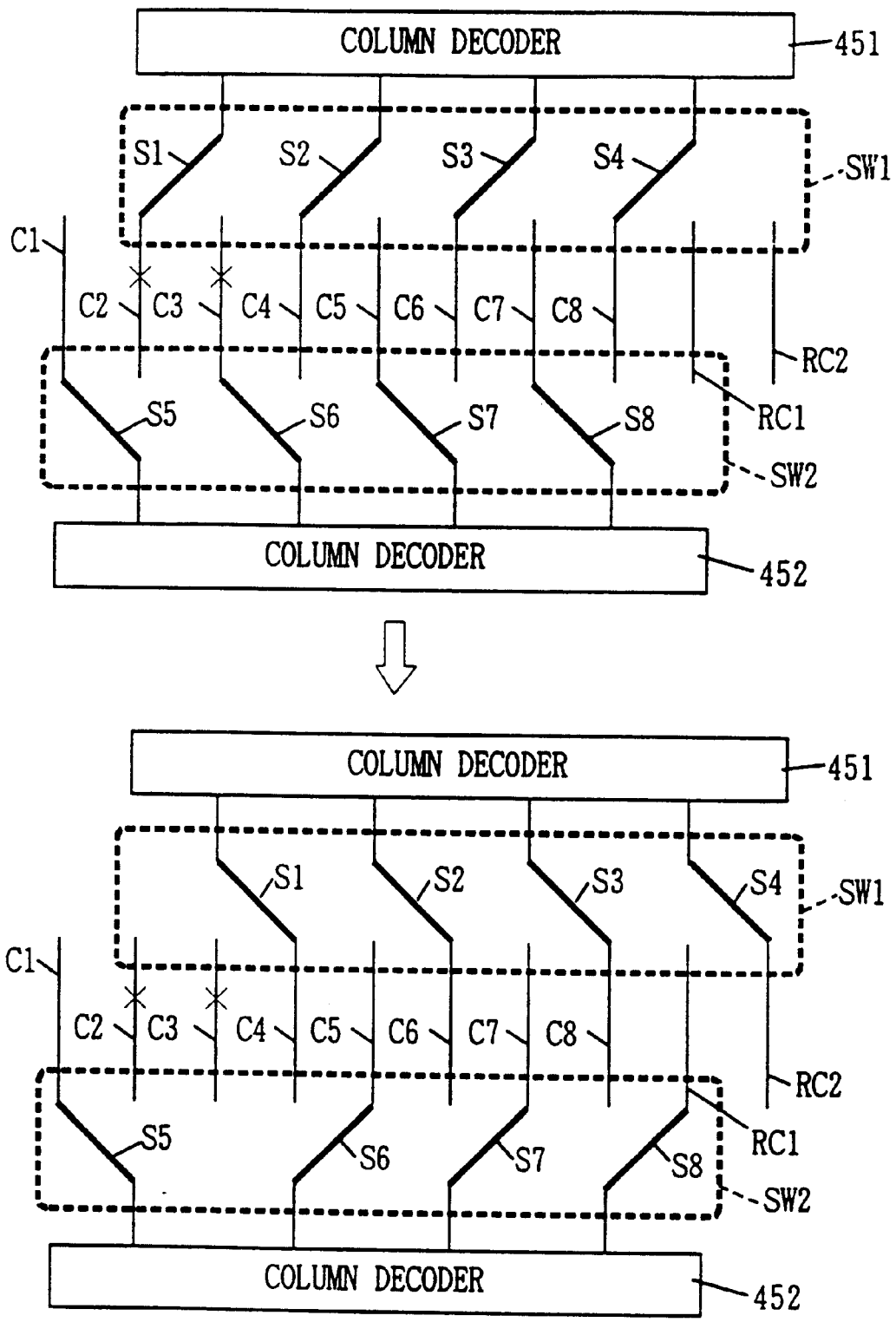
FIG. 37 is a diagram illustrating concept of a column redundancy circuit using a bit line load alternate arrangement.

FIG. 37 is a conceptual diagram of a combination of a bit line load alternate arrangement and a shift redundancy circuit.

A column redundancy control circuit SW1 is provided between a column decoder 451 and a bit line load circuit & column selection circuit, and a column redundancy control circuit SW2 is provided between a column decoder 452 and a bit line load circuit & column selection circuit. The column redundancy control circuit SW1 includes switches S1 through S4, and column redundancy control circuit SW2 includes switches S5 through S8. The column redundancy control circuits SW1 and SW2 are used for column redundancy circuit 26 of FIG. 1. When there is no defects in any of the columns, switches S1–S4 are respectively connected to columns C2, C4, C6, C8, and switches S5–S8 are respectively connected to columns C1, C3, C5, C7. When there are defects in columns C2, C3, switches S1–S4 are respectively connected to columns C4, C6, C8 and a redundant column RC2, and switches S5–S8 are respectively connected to columns C1, C5, C7, a redundant column RC1. Thus, defects of continuous two columns can be easily repaired.

Figure 68:
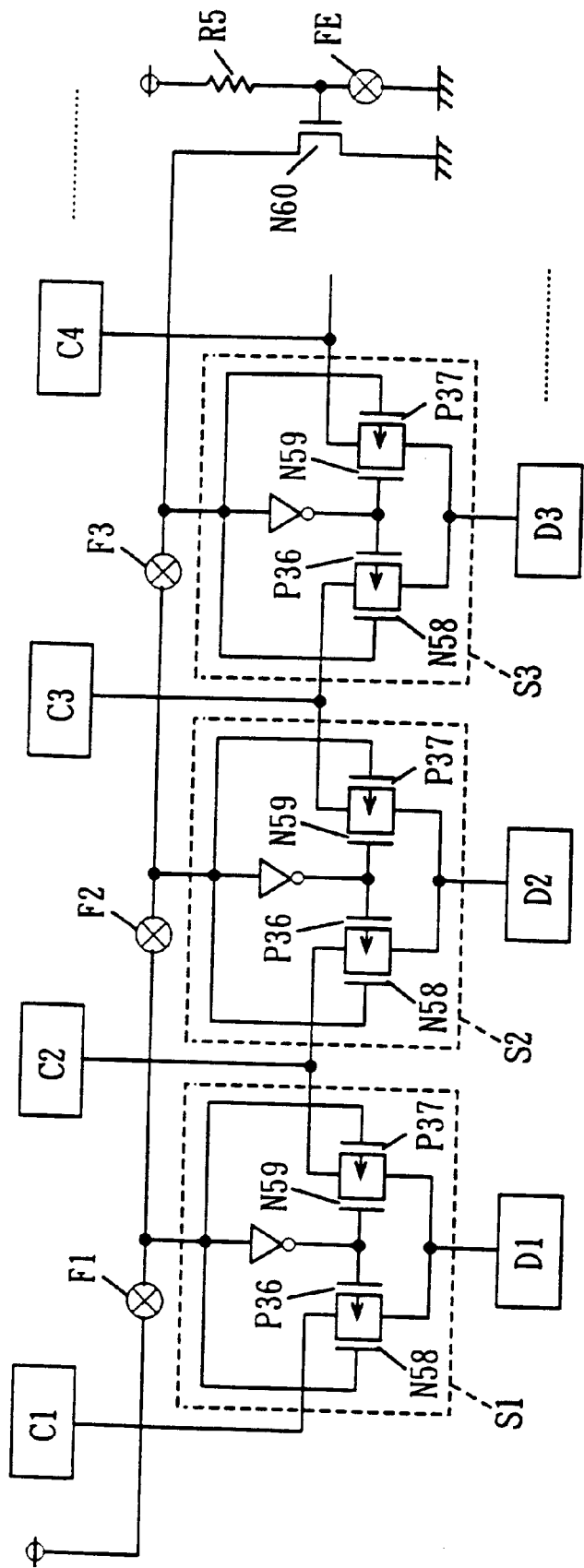
FIG. 68 is a diagram showing a detailed structure of a redundancy control circuit.

Column redundancy control circuits SW1 and SW2 have the structure shown in FIG. 68.

Although a description has been made about alternate arrangements of bit line load circuits herein, alternate arrangement of word line drivers also can implement easy remedy of defects of two continuous rows, similarly.

Figure 38:
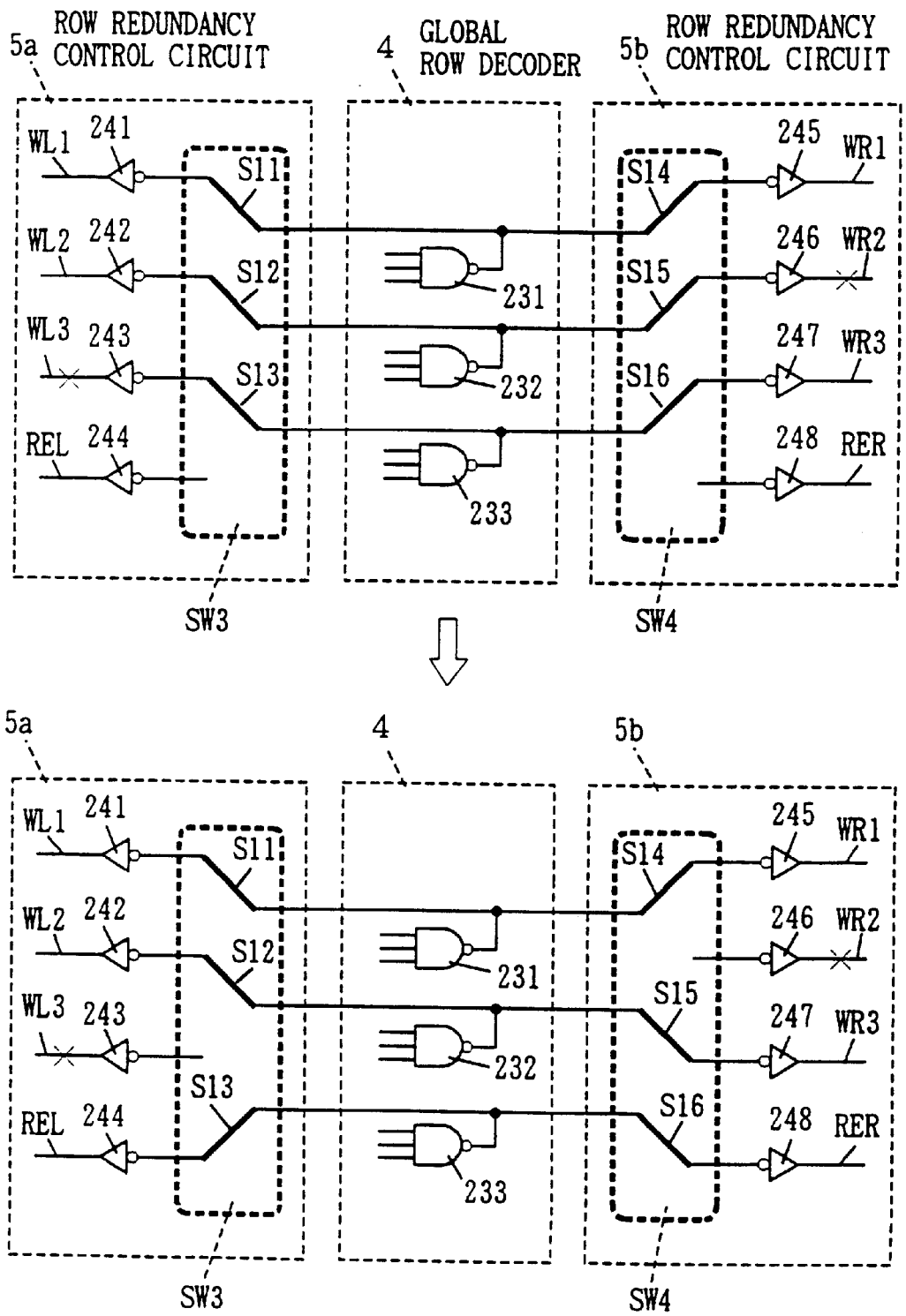
FIG. 38 is a diagram illustrating concept of a row redundancy circuit.

FIG. 38 is a conceptual diagram illustrating a row redundancy circuit. The row redundancy circuit is used in row redundancy circuit 5 shown in FIG. 1.

When global row decoder 4 is provided in the center of a chip CH as shown in FIG. 36, global word lines WL1–WL3 and global word lines WR1–WR3 exist on left and right of global row decoder 4. Also, a redundant global word line REL and a redundant global word line RER are provided on left and right of global row decoder 4.

As shown in FIG. 38, row redundancy circuits 5a, 5b are respectively arranged on both sides of global row decoder 4.

Row redundancy circuit 5a includes a switch circuit SW3 including switches S11–S13, and row redundancy control circuit 5b has a switch circuit SW4 including switches S14–S16.

When there is no defect existing in the global word line, switches S11–S13 are respectively connected to global word lines WL1–WL3, and switches S14–S16 are respectively control connected to global word lines WR1–WR3.

For example, if there is a defect existing in global word line WL3 and global word line WR2, switches S11–S13 are respectively connected to global word lines WR1, WL2 and redundant global word line WEL, and switches S14–S16 are respectively connected to global word lines WR1, WR3 and redundant global word line RER. Thus, defective global word lines can be replaced independently in left and right global word lines.

Figure 69:
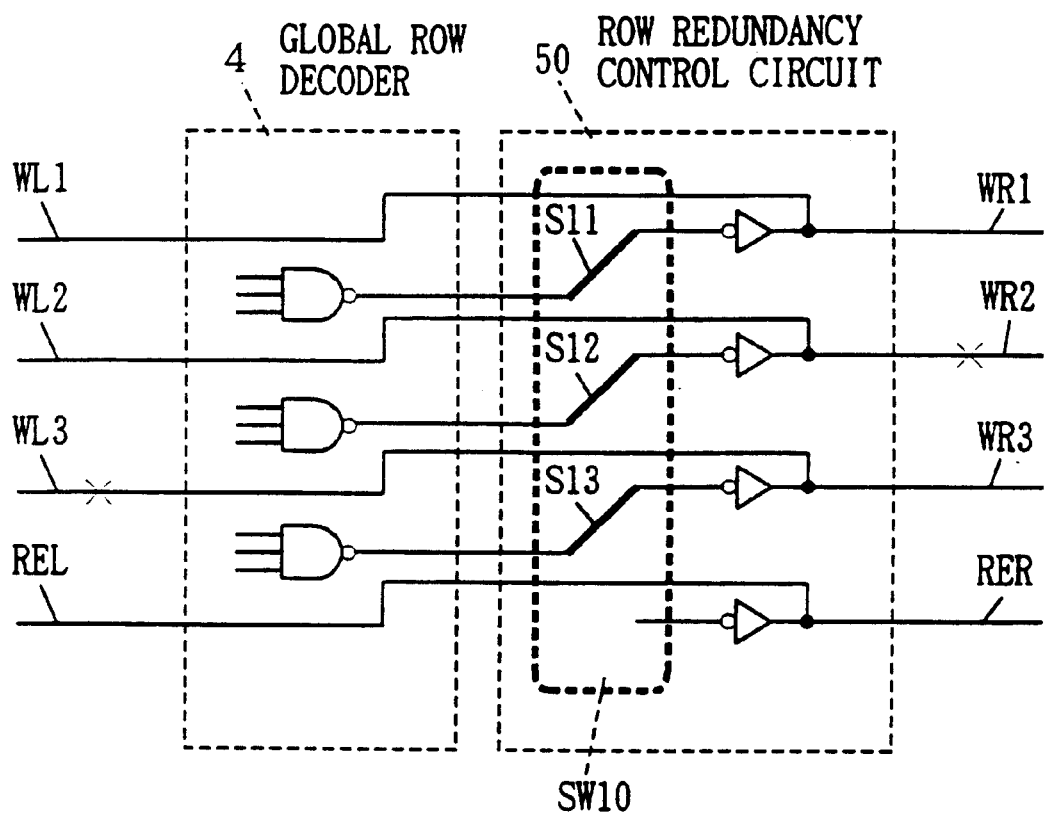
FIG. 69 is a diagram showing concept of a conventional row redundancy circuit.

As compared with the shift redundancy circuit of FIG. 69, the number of redundant global word lines is entirely the same, but a defect which can not be repaired in the shift redundancy circuit of FIG. 69 can be repaired in the shift redundancy circuit of FIG. 38, which enhances the repairing rate.

Although a description has been made about application of a shift redundancy circuit to global word lines, the shift redundancy circuit can also be applied to local word lines, which realizes the same effects.

Figure 39:
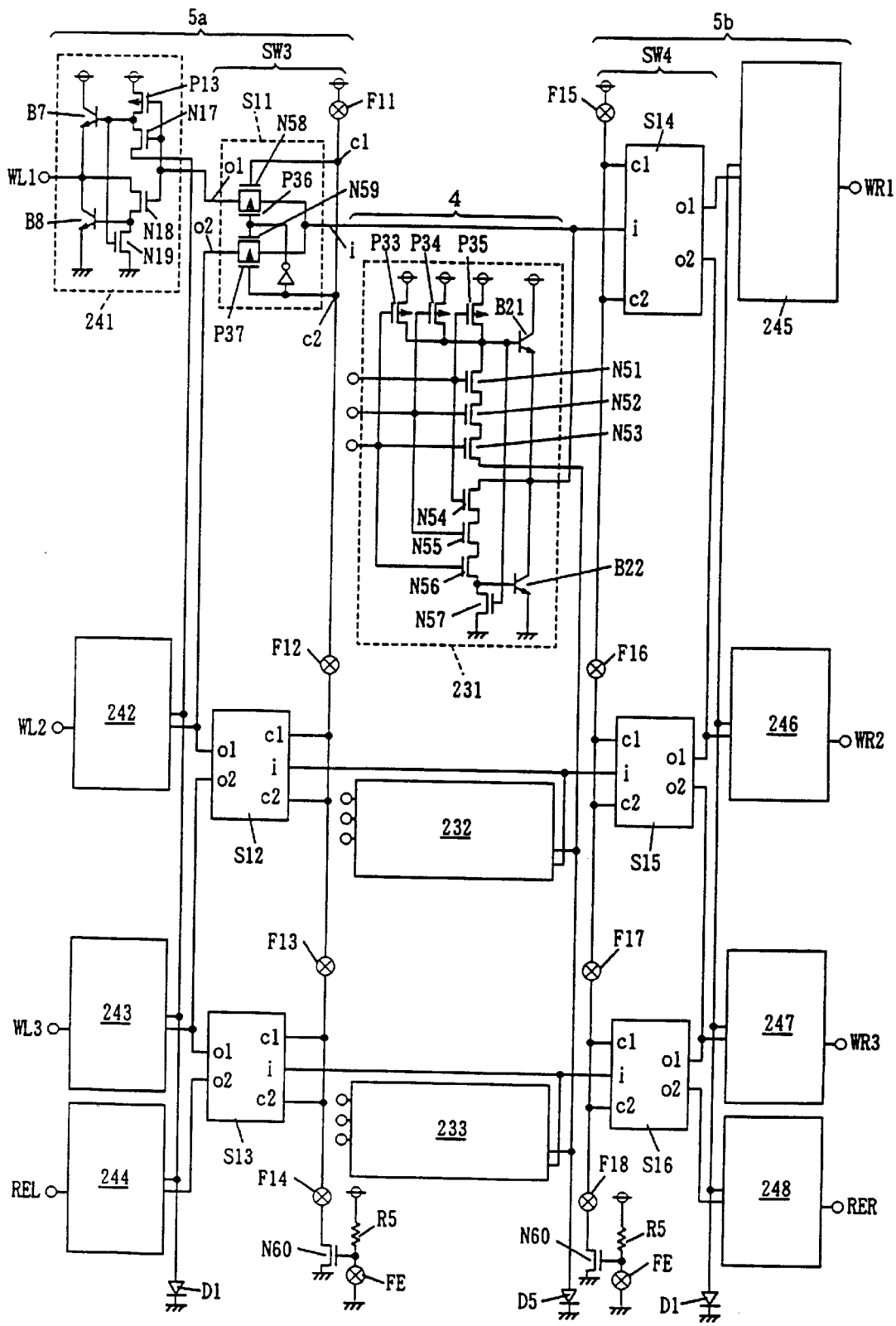
FIG. 39 is a diagram showing detailed structure of the row redundancy circuit of FIG. 38.

In FIG. 39, detailed structure of the row redundancy circuit of FIG. 38 is shown. Row redundancy control circuit 5a includes BiCMOS gate circuits 241–244 and switches S11–S13. Row redundancy control circuit 5b includes BiCMOS gate circuits 245–248 and switches S14–S16.

A structure of each of BiCMOS gate circuits 241–248 is the same as the structure shown in FIG. 10. A structure of each of switches S11–S18 is the same as the structure of each of switches S1–S3 shown in FIG. 68.

Global row decoder 4 includes BiCMOS·3NAND circuits 231–233. Each of NAND circuits 231–233 includes transistors P33–P35, N51–N57, B21 and B22.

Figure 40:
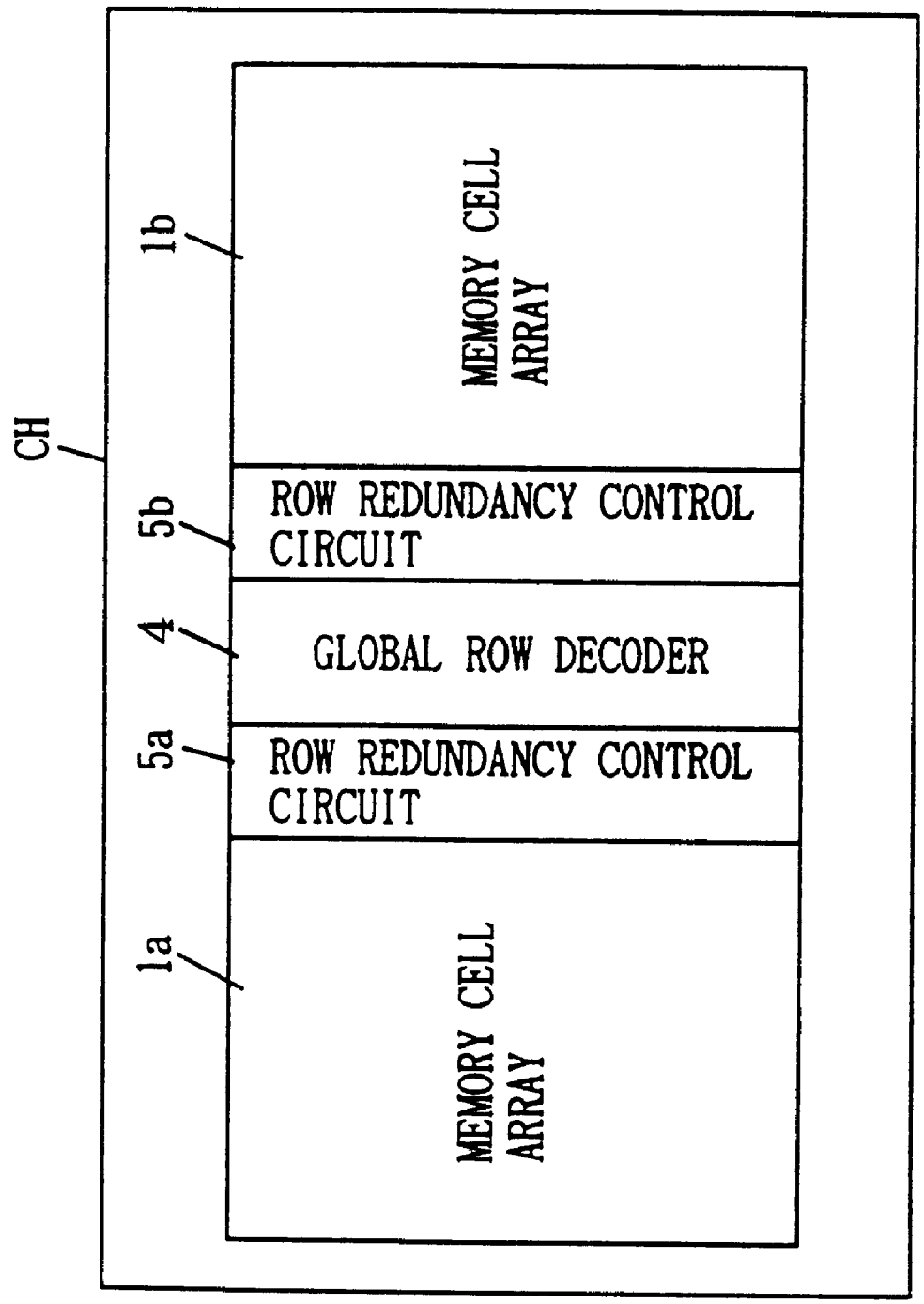
FIG. 40 is a diagram showing layout of a chip using a row redundancy circuit.

FIG. 40 is a diagram illustrating an example of layout on a chip CH of the shift redundancy circuit of FIG. 38. A row redundancy control circuit 5a is provided between a memory cell array 1a and a global row decoder 4, and a row redundancy control circuit 5b is provided between memory cell array 1b and a global row decoder 4.

Figure 41:
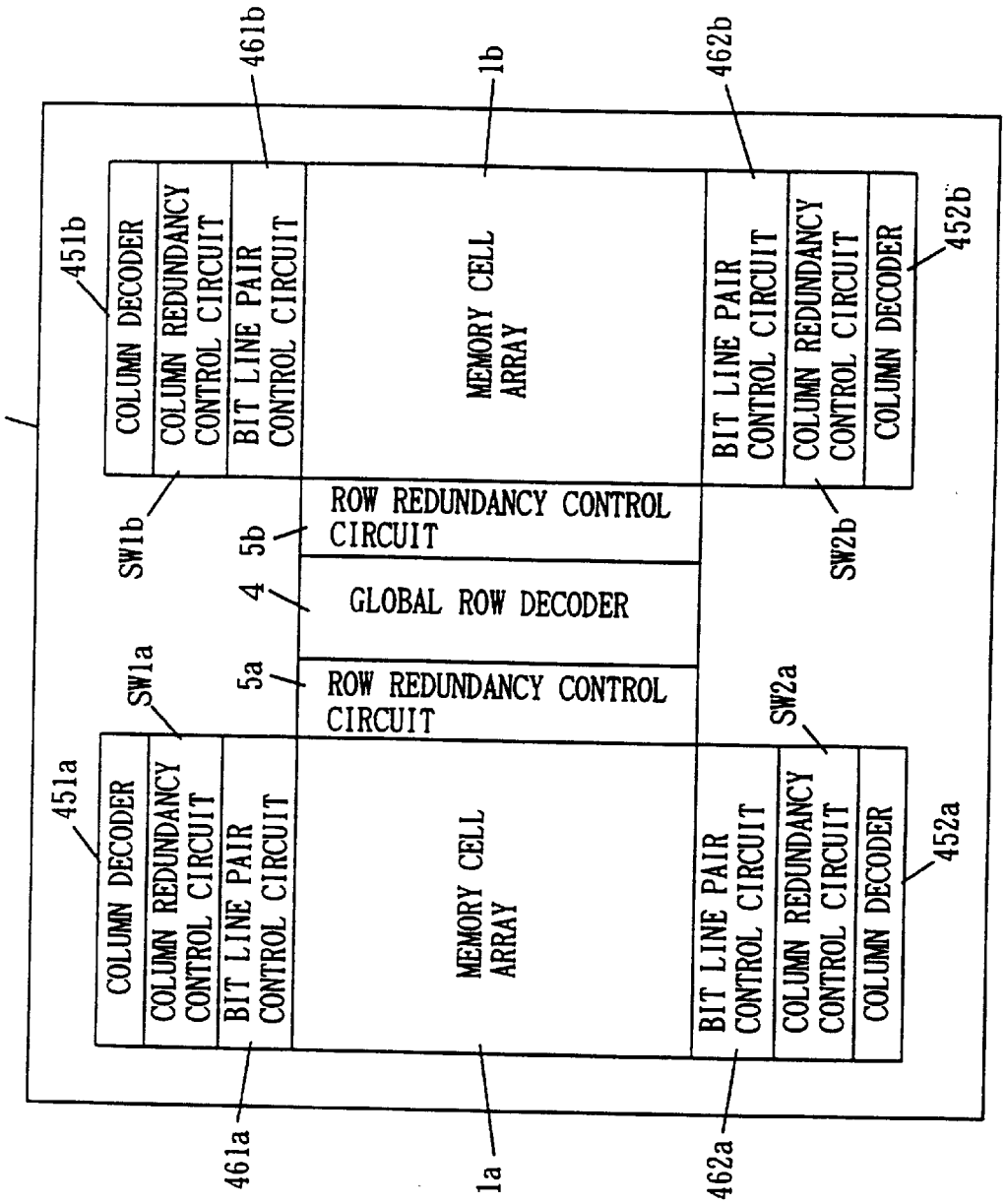
FIG. 41 is a diagram showing layout of a chip using a row redundancy circuit and a column redundancy circuit.

FIG. 41 is a diagram depicting an example of layout on a chip CH when the shift redundancy circuit of FIG. 37 and the shift redundancy circuit of FIG. 38 are combined.

A column redundancy control circuit SW1a is provided between a bit line pair control circuit 461a and a column decoder 451a, and a column redundancy control circuit SW2a is provided between a bit line pair control circuit 462a and a column decoder 452a. A column redundancy control circuit SW1b is provided between a bit line pair control circuit 461b and a column decoder 451b, and a column redundancy control circuit SW2b is provided between a bit line pair control circuit 562b and a column decoder 452b.

Each of bit line pair control circuits 461a, 462a, 461b, 462b includes a bit line load circuit and a column selection circuit.

In the layout of FIGS. 40 and 41, an example in which a memory cell array is divided into two blocks has been described, but the shift redundancy circuits of FIGS. 37 and 38 can also be applied to a case in which a memory cell array is divided into a larger number of blocks.

Figure 42:
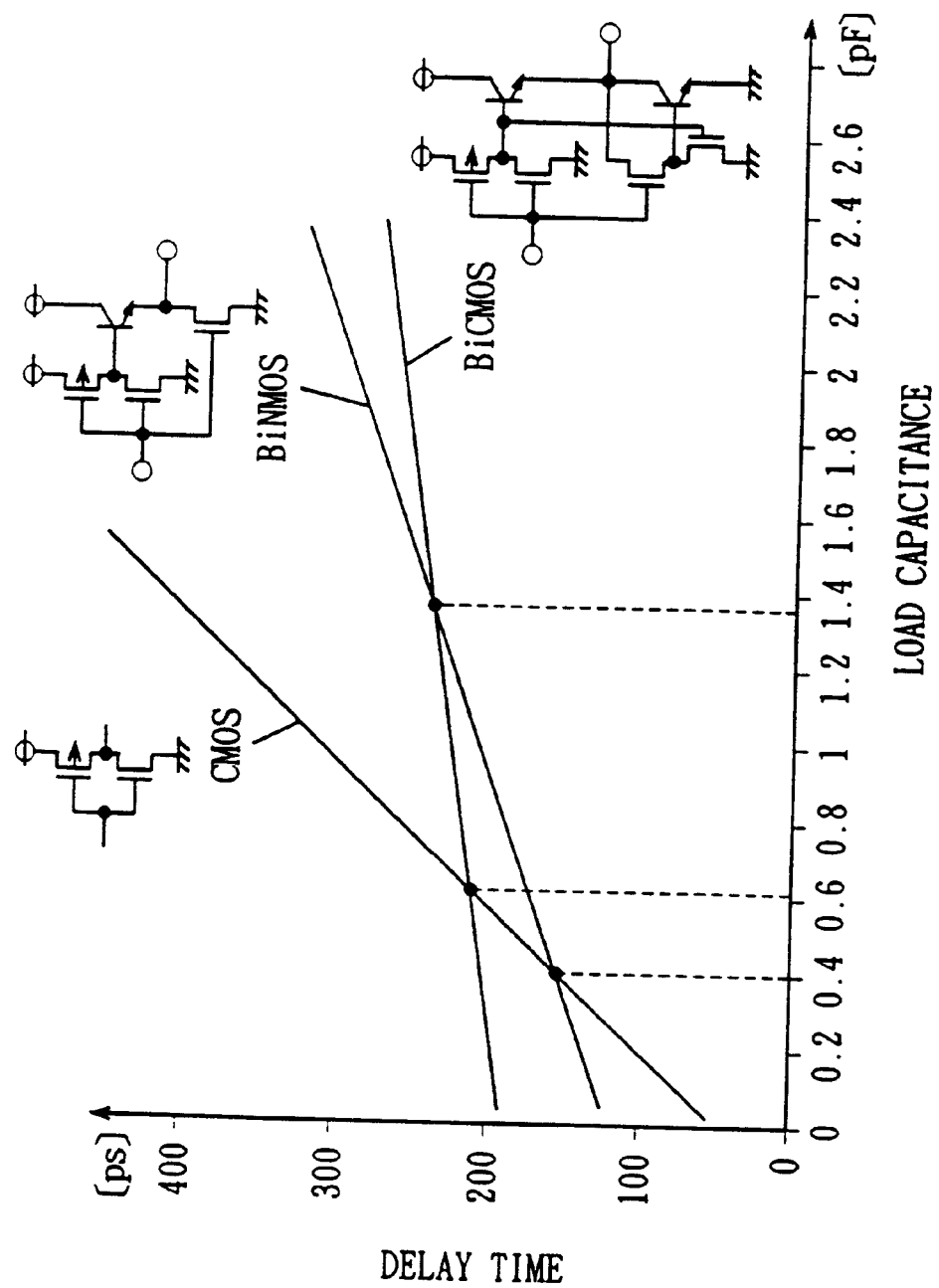
FIG. 42 is a diagram for use in describing an advantage of a combination of circuits of embodiments.

(3) Advantage of Combinations of Respective Parts (a) Input Buffer Circuit+Decoder Circuit; WE Buffer Circuit+Decoder Circuit FIG. 42 shows relation of load capacitance and delay time of BiNMOS inverter and BiCMOS inverter. As seen from FIG. 42, a delay time of CMOS inverter is the smallest in a region of load capacitance of 0.4 pF or lower, a delay time of BiCMOS inverter is the smallest in a region of load capacitance of 1.4 pF or higher, and a delay time of BiNMOS inverter is the smallest in a region where 0.4 pF<load capacitance <1.4 pF.

In FIG. 1, row address buffers 2, 7 and row predecoders 3, 8, column address buffers 10, 13 and column predecoders 11, 14, WE buffer 18 and WE waveform shaping circuit 19, Din buffer 22 and write data waveform shaping circuit 21, are, respectively, provided at positions relatively near to one another. Accordingly, the interconnection capacitance is small.

Also, in a predecoder, the number of gates connected in common is small. Accordingly, total gate capacitance is small and load capacitance of an input buffer circuit is small. Accordingly, the load capacitance of input buffer circuit and WE buffer circuit takes values between 0.4 pF through 1.4 pF.

Since output parts of input buffer circuits of FIGS. 3 and 4 and WE buffer circuits of FIGS. 5 and 9 are composed of BiNMOS push-pull circuits, the delay time becomes the minimum in the above-described combination. Accordingly, by introducing the above-described combination, an access time of further higher speed can be obtained.

(b) Decoder Circuit + Shift Redundancy Circuit

In the decoder circuit of the above-described embodiment, the design rule of MOS transistor is made narrow for speeding-up and a decrease in area, and a shared diode is employed as measures against hot carriers. Also, in the row redundancy circuit of the above-described embodiment, a shift redundancy circuit is employed for high speed, shift redundancy circuits are provided on left and right of a decoder circuit to improve yield, and left and right defects can be repaired independently.

Accordingly, by combining the decoder circuit and the row redundancy circuit of the above-described embodiments, a semiconductor integrated circuit device which maintains high speed performance and has high yield can be obtained.

(c) WE Buffer Circuit + Decoder Circuit + Bit Line Load Circuit

Figure 43:
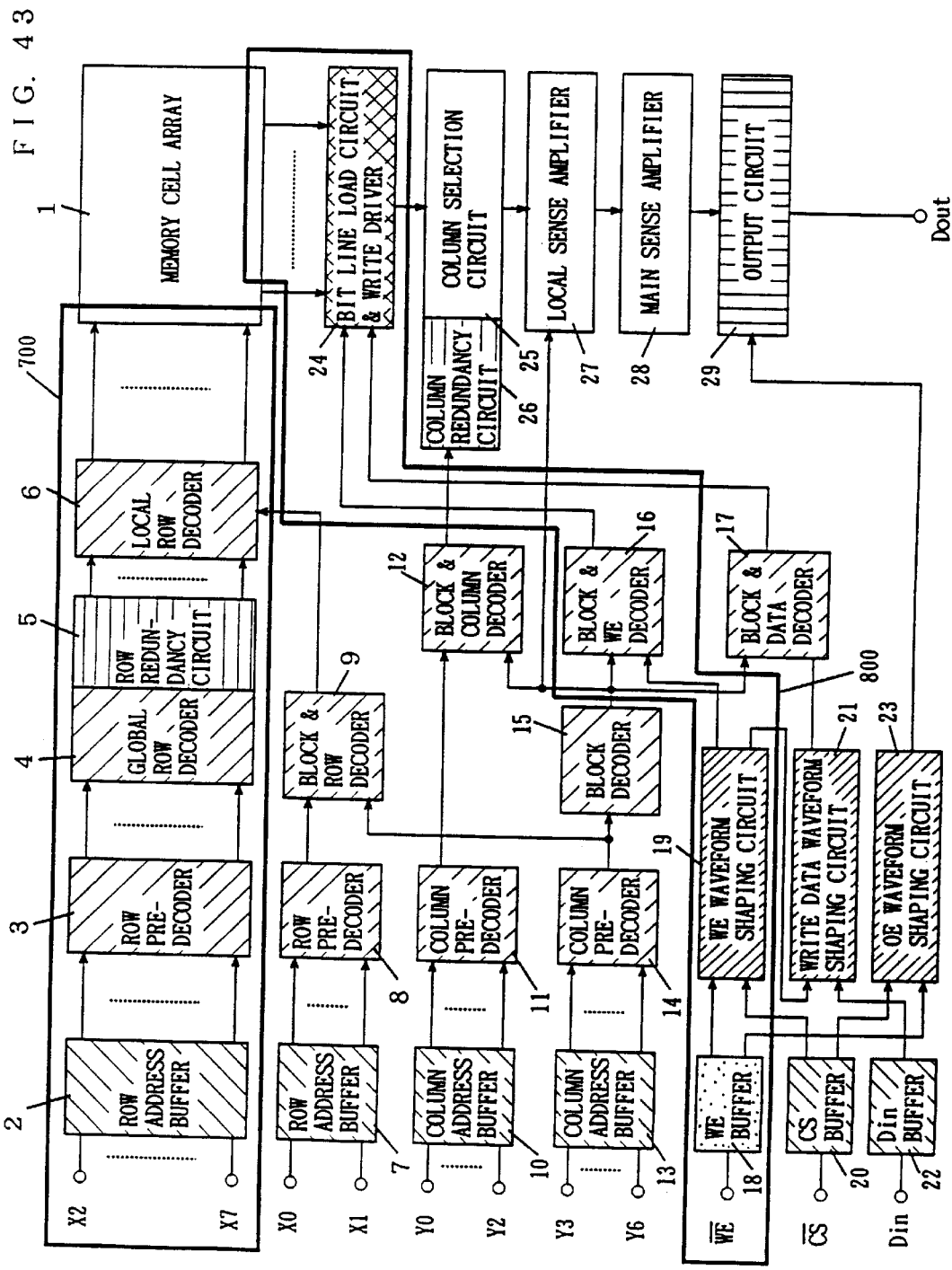
FIG. 43 is a diagram for use in describing an advantage of a combination of circuits of embodiments.

A word line selection path 700 and a write recovery path 800 are shown in FIG. 43. A comparison of write recovery times in the above-described embodiment and in a conventional example is shown in FIG. 44.

Figure 44:
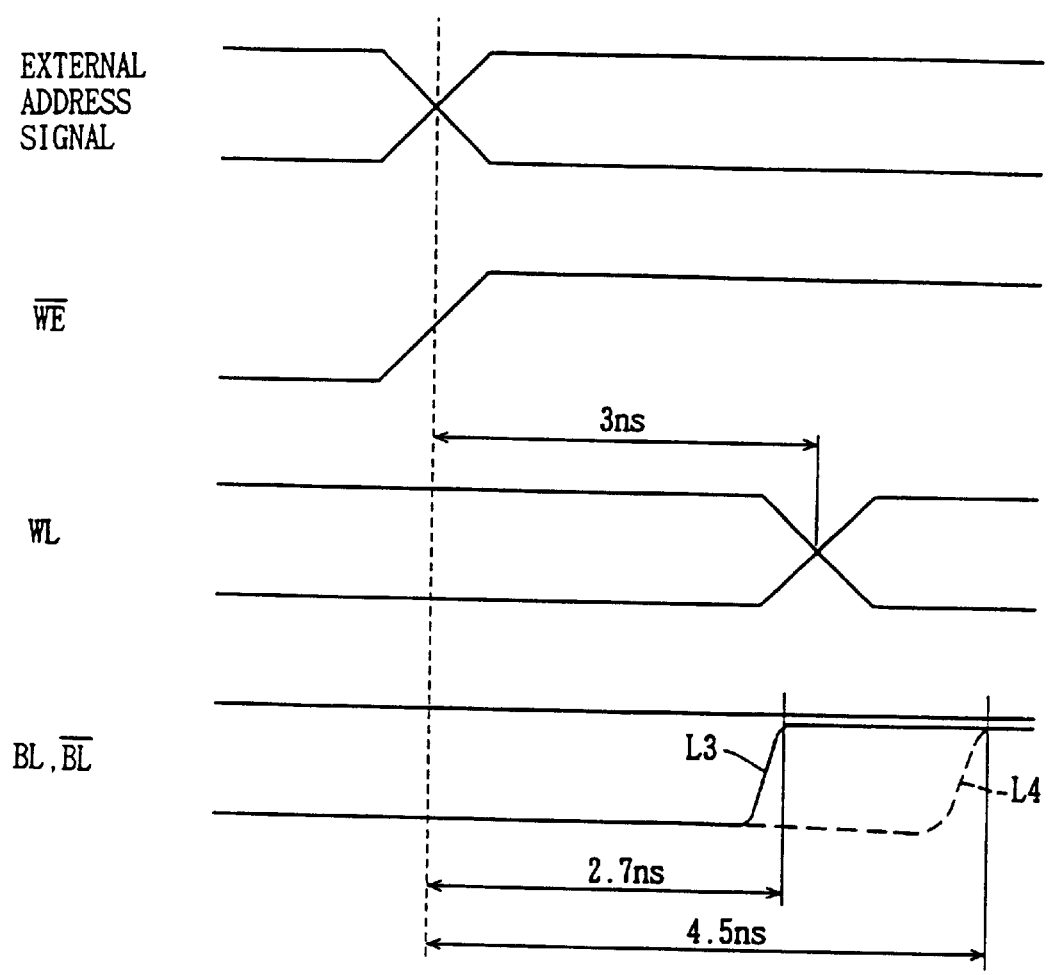
FIG. 44 is a diagram for use in describing comparison of write recovery times of an embodiment and a conventional example.
Figure 45:
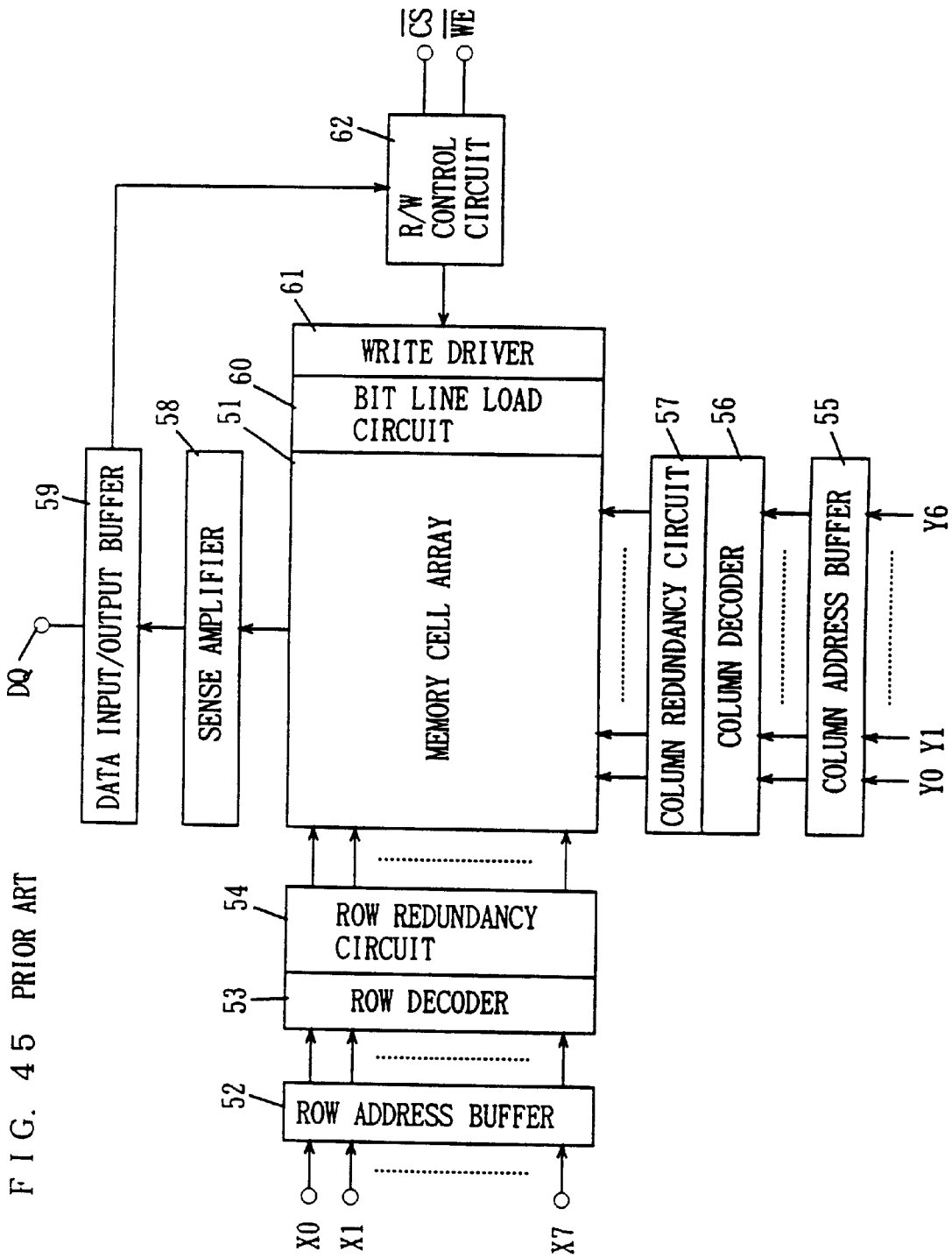
FIG. 45 is a block diagram showing a structure of a conventional general SRAM.
Figure 46:
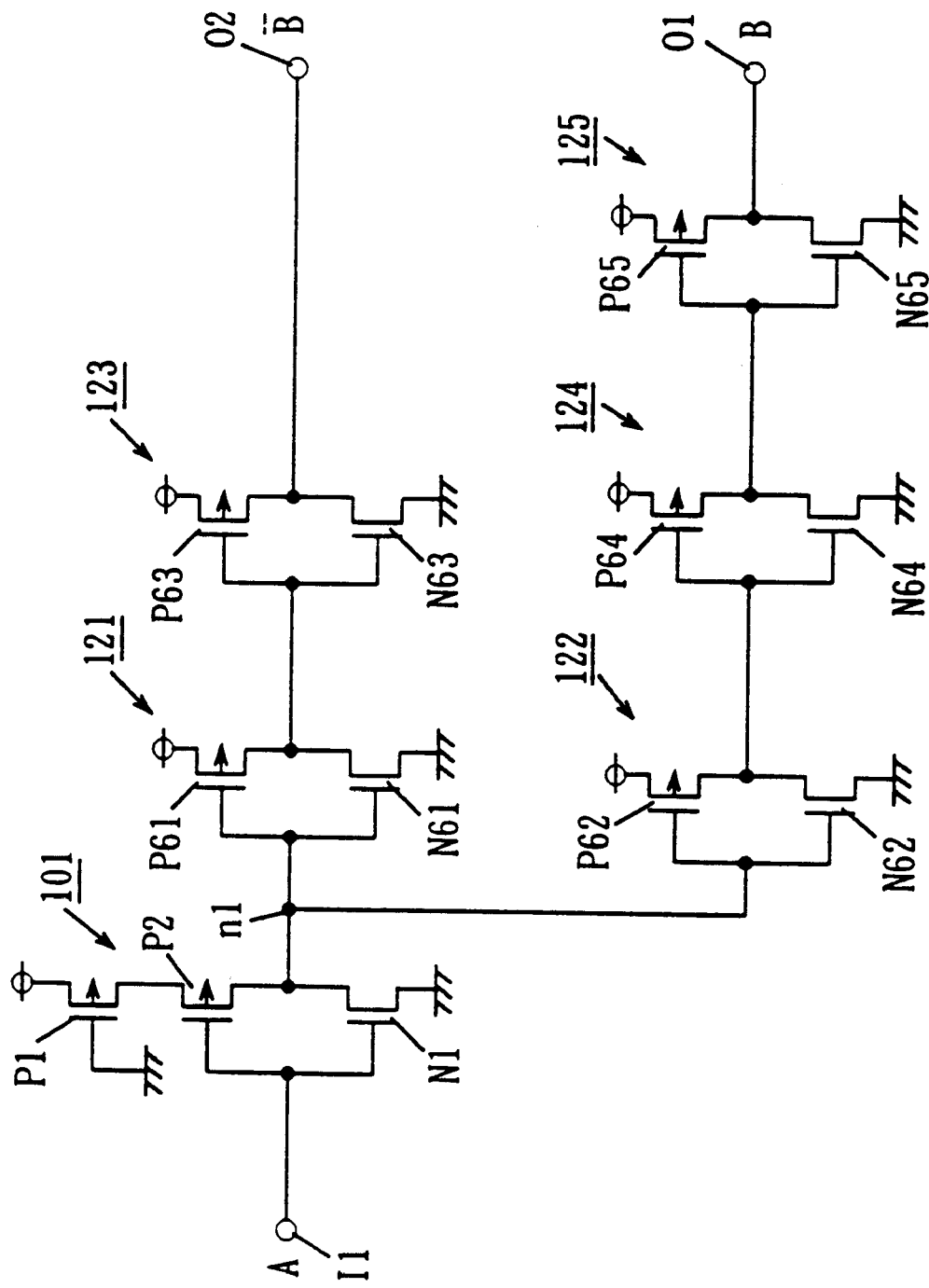
FIG. 46 is a diagram showing a conventional input buffer circuit.
Figure 47:
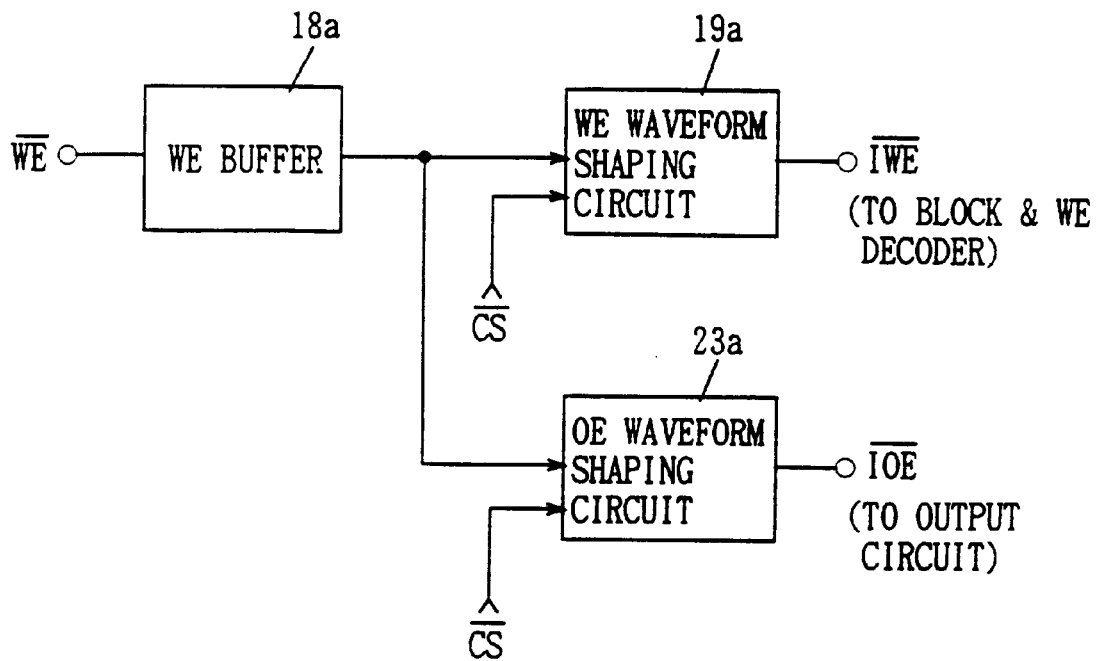
FIG. 47 is a diagram for use in describing a conventional method of generating an internal write enable signal and an internal output enable signal.
Figure 48:
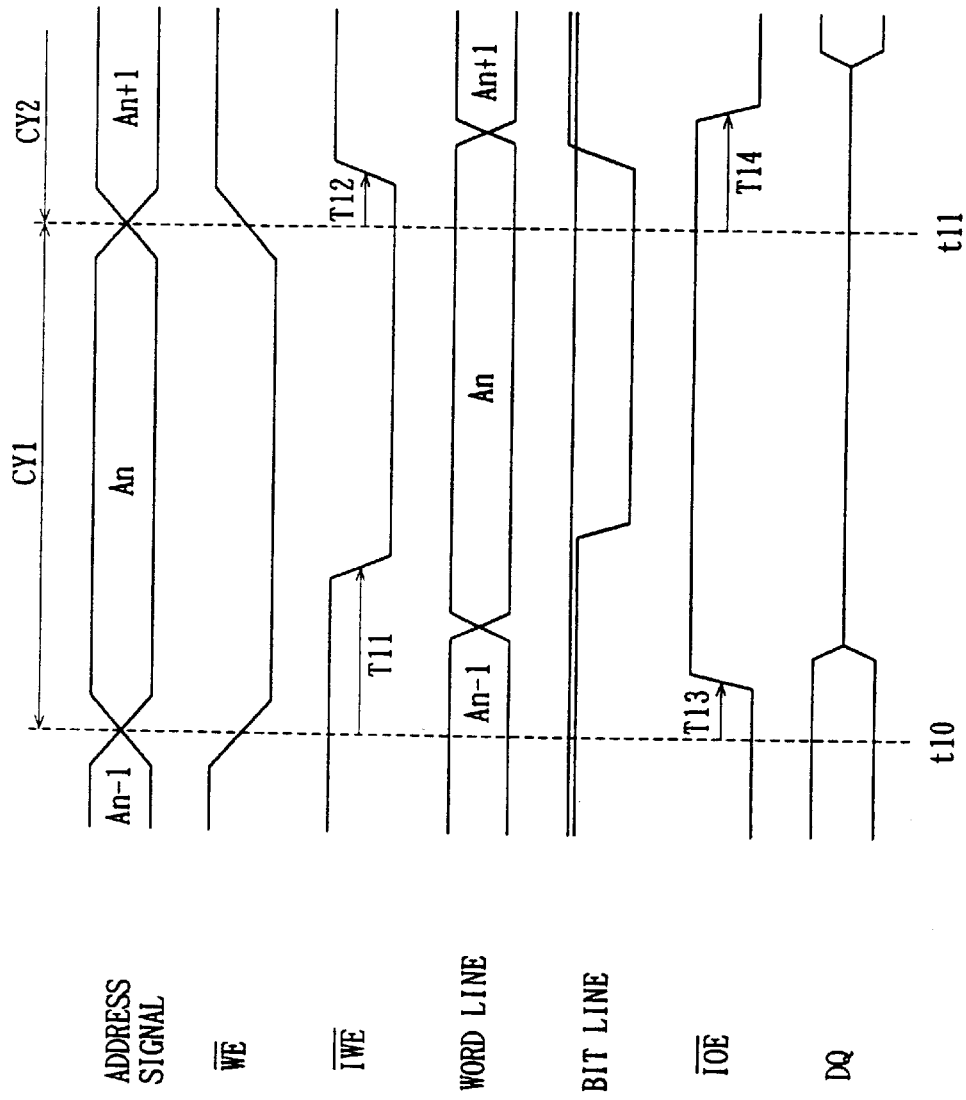
FIG. 48 is a diagram for use in describing timing of an internal write enable signal and an internal output enable signal.
Figure 49:
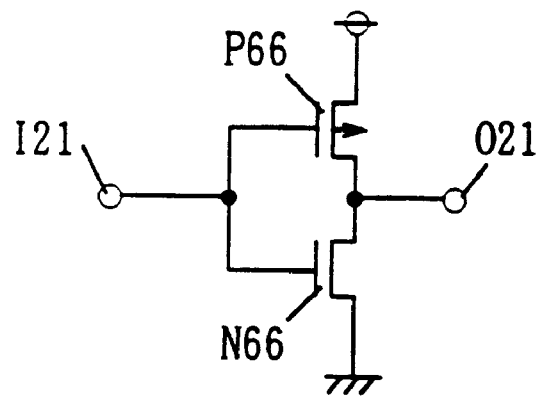
FIG. 49 is a diagram showing a conventional CMOS inverter circuit.

The word line selection time 3 ns of FIG. 44 is a value realized when making all of row address buffer 2, decoders 3, 4, 6 and so forth with the circuits in above-described embodiments in the word line selection path 700 of FIG. 43.

On the other hand, the write recovery time 2.7ns is a value realized when configuring all of WE buffer 18, decoder 16 and the like with the circuits of the above-described embodiments in the write recovery path 800 of FIG. 43. The write recovery time 4.5 ns is a value realized when all of the above circuits are formed of conventional ones.

The above result reveals that high speed access can be obtained with arbitrary timing because a write recovery time is shorter than a word line selection time even with the hardest timing shown in FIG. 44 with the above-described combination.

(d) Bit Line Load Alternate Arrangement + Column Redundancy Circuit

The bit line load alternate arrangement is introduced in the center power pin arrangement for speed up and a column redundancy circuit is configured of a shift redundancy circuit for speed up. By combining the same, a higher speed can be implemented, and also defects of continuous two columns which could not be repaired in convention shift redundancies can be repaired. Accordingly, while maintaining high speed performance, the yield can be enhanced.

(e) Bit Line Load Alternate Arrangement + Bit Line Load Circuit

As shown in FIG. 34, according to the architecture of the above-described embodiments, bit line load circuits can be arranged in a region of two column pitches in an actual layout. Accordingly, it is possible to double a size of a bit line load circuit. As a result, further speed-up is possible.

(f) WE Buffer Circuit + Output Buffer Circuit

As shown in FIGS. 23 and 24, NOR circuits 331 and 332 of the output buffer circuit of the above described embodiment are formed of BiNMOS circuits (can be BiCMOS circuits) for speeding-up. On the other hand, in a conventional output buffer circuit, a NOR circuit is formed of a CMOS circuit.

Accordingly, by combining the output buffer circuit of the above described embodiment with the WE buffer circuit of the above-described embodiment, an output disable time is especially further shortened. The output disable time means a time in which an output attains a high impedance state after a write enable signal $\overline{\text{WE}}$ changes from "H" to "L", or after a chip select signal $\overline{\text{CS}}$ changes from "L" to "H".

(4) Applicability to Other Semiconductor Integrated Circuit Devices

Respective circuits of the above-described embodiments can also be applied to other various kinds of semiconductor integrated circuit devices other than the SRAM shown in FIG. 1.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device, comprising:
   a plurality of bit line pairs (BL, $\overline{\text{BL}}$);
   a write data line pair (WBa, WBb) receiving write data;
   selection signal generating means (25) for generating a plurality of selection signals (Yi) respectively for selecting said plurality of bit line pairs;
   a plurality of bit line load means (24) respectively provided for said plurality of bit line pairs; and
   write signal generating means (16, 18, 19) for generating a write signal (WE) designating writing operation;
   wherein each of said plurality of bit line load means (24) includes,
      first charge means (P29, P30; B19, B20) controlled with said write signal (WE) and a corresponding selection signal (Yi) for charging a corresponding bit line pair (BL, $\overline{\text{BL}}$) to a predetermined potential,
      transfer meand (N47, N48) controlled with said write signal (WE) and a corresponding selection signal (Yi) for transferring write data of said write data line pair (WBa, WBb) to a corresponding bit line pair (BL, $\overline{\text{BL}}$), and second charge means (N49, N50; B17, B18) controlled with a potential of said write data line pair (WBa, WBb) for charging a corresponding bit line pair (BL, $\overline{BL}$) to a predetermined potential.

2. The semiconductor integrated circuit device according to claim 1, wherein
each transfer means includes a first conductivity-channel type field effect transistor pair (N47, N48) connected between said write data line pair (Wba, WBb) and a corresponding bit line pair (BL, $\overline{BL}$) and has gates responsive to logical product of said write signal (WE) and a corresponding selection signal (Yi),
each first charge means includes a second conductivity-channel type field effect transistor pair (P29, P30) connected between a potential line receiving a predetermined potential and a corresponding bit line pair (BL, $\overline{BL}$) and has gates responsive to logical product of said write signal (WE) and a corresponding selection signal (Yi), and
each second charge means includes a first conductivity-channel type field effect transistor pair (N49, N50) connected between a power-supply terminal receiving a power-supply potential and a corresponding bit line pair (BL, $\overline{BL}$) and has gates responsive to a potential of said write data line pair (WBa, WBb).

3. The semiconductor integrated circuit device according to claim 2, wherein
each of said plurality of bit line load means (24) further includes potential setting means (B16, R4) for setting potential of said potential line to a potential lower than the power-supply potential.

4. The semiconductor integrated circuit device according to claim 1, wherein
each transfer means includes a first conductivity-channel type field effect transistor pair (N47, N48) connected between said write data pair (WBa, WBb) and a corresponding bit line pair (BL, $\overline{BL}$) and having gates responsive to logical product of said write signal (WE) and a corresponding selection signal (Yi),
each first charge means includes a second conductivity-channel type field effect transistor pair (P29, P30) connected between a potential line receiving said predetermined potential and a corresponding bit line pair (BL, $\overline{BL}$) and having gates responsive to logical product of said write signal (WE) and a corresponding selection signal (Yi), and
each second charge means includes a bipolar transistor pair (B17, B18) connected between a power-supply terminal receiving a power-supply potential and a corresponding bit line pair (BL, $\overline{BL}$) and having bases responsive to a potential of said write data line pair (WBa, WBb).

5. The semiconductor integrated circuit device according to claim 4, wherein
each of said plurality of bit line load means (24) further includes potential setting means (B16, R4) for setting potential of said potential line to a potential lower than the power-supply potential.

6. The semiconductor integrated circuit device according to claim 1, wherein
each transfer means includes a first conductivity-channel type field effect transistor pair (N47, N48) connected between said write data line pair (WBa, WBb) and a corresponding bit line pair (BL, $\overline{BL}$) and having gates responsive to logical product of said write signal (WE) and a corresponding selection signal (Yi),
each first charge means includes,
a bipolar transistor pair (B19, B20) connected between a potential line receiving said predetermined potential and a corresponding bit line pair (BL, $\overline{BL}$) and having bases, and
a secondary conductivity-channel type field effect transistor pair (P29, P30) connected between said potential line and the bases of said bipolar transistor pair (B19, B20) and having gates responsive to logical product of said write signal (WE) and a corresponding selection signal (Yi), and
each second charge means includes a first conductivity-channel type field effect transistor pair (N49, N50) connected between bases of said bipolar transistor pair (B19, B20) of corresponding first charge means and said write data line pair (WBa, WBb) and having gates responsive to logical product of said write signal (WE) and a corresponding selection signal (Yi).

7. The semiconductor integrated circuit device according to claim 6, wherein
each of said plurality of bit line load means (24) further includes a second conductivity-channel type field effect transistor pair (P31, P32) connected between said potential line and the bases of said bipolar transistor pair (B19, B20) of corresponding first charge means and having gates responsive to a potential of said write bit line pair (WBa, WBb).

8. The semiconductor integrated circuit device according to claim 6, wherein
each of said plurality of bit line load means (24) further includes potential setting means (B16, R4) for setting potential of said potential line to a potential lower than the power-supply potential.

9. The semiconductor integrated circuit device according to claim 7, wherein
each of said plurality of bit line load means (24) further includes potential setting means (B16, R4) for setting potential of said potential line to a potential lower than the power-supply potential.

10. A semiconductor integrated circuit device, comprising:
a plurality of bit line pairs;
a plurality of first bit line control means at one end side of said plurality of bit pairs;
a plurality of second bit line control means at the other end side of said plurality of bit line pairs;
each of said plurality of first and second bit line control means including charge means for charging a bit line pair to a predetermined potential, first transfer means for transferring write data to a bit line pair, and second transfer means for transferring read data to a bit line pair, and
said plurality of bit line pairs being alternatively connected to the first bit line control means and the second bit line control means;
first and second spare bit line pairs adjacent said plurality of bit line pairs;
first selection means at said one end side of said plurality of bit line pairs for selecting any pair of said plurality of bit line pairs;
second selection means at said other end side of said plurality of bit line pairs for selecting any pair of said plurality of bit line pairs,
alternate ones of said plurality of bit line pairs being coupled only to said first selection means and the remaining of said bit line pairs being coupled only to said second selection means in a first configuration;

first defect repairing means for coupling said first spare bit line pair to said first selection means and changing the first configuration coupling of the bit line pairs to said first selection means; and second defect repairing means for coupling said second spare bit line pair to said second selection means and changing the first configuration coupling of the bit line pairs to said second selection means.

11. The semiconductor integrated circuit device according to claim 10, further comprising:

a first data bus (RBa, RBb) provided on said one end side of said plurality of bit line pairs (BL, $\overline{BL}$) and coupled to said plurality of first bit line control means (411, 413); and a second data bus (RBa, RBb) provided on said other end side of said plurality of bit line pairs (BL, $\overline{BL}$) and coupled to said plurality of second bit line control means (412, 414).

12. The semiconductor integrated circuit device according to claim 11, further comprising:

first output means (291, 292) provided on said one end side of said plurality of bit line pairs and connected to said first data bus (RB1, RB2); and second output means (293, 294) provided on said other end side of said plurality of bit line pairs and connected to said second data bus (RB3, RB4).

13. The semiconductor integrated circuit device according to claim 12, wherein said plurality of bit line pairs (BL, $\overline{BL}$) are divided into first and second blocks (1a, 1b), said first data bus (RB1, RB2) is provided in common with said first and second blocks (1a, 1b), said second data bus (RB3, RB4) is provided in common with said first and second blocks (1a, 1b), said first output means (291, 292) is provided in common with said first and second blocks (1a, 1b), and said second output means (293, 294) is provided in common with said first and second blocks (1a, 1b).

14. The semiconductor integrated circuit device according to claim 12, wherein said plurality of bit line pairs (BL, $\overline{BL}$) are divided into first and second blocks (1a, 1b), said first data bus is divided into first and second parts (RB1L, RB2L; RB1R, RB2R) corresponding to said first and second blocks (1a, 1b), said second data bus is divided into first and second parts (RB3L, RB4L; RB3R, RB4R) corresponding to said first and second blocks (1a, 1b), said first output means (291, 292) performs predetermined logical operation with respective to signals of said first and second parts of said first data bus, and said second output means (293, 294) performs predetermined logical operation with respective to signals of said first and second parts of said second data bus.

15. The semiconductor integrated circuit device according to claim 11, further comprising:

first sense amplifier means (421, 422) connected between said first data bus and said plurality of first bit line control means (431, 432); and second sense amplifier means (423, 424) connected between said second data bus and said plurality of second bit line control means (433, 434).

16. A semiconductor integrated circuit device comprising:

a data line pair connected to a memory cell;

an interconnection pair transmitting a data signal when a write signal designating an operation writing data to a memory cell has a first state, and transmitting a control signal when said write signal has a second state;

transfer means controlled by a select signal selecting said data line pair, for transferring said data signal on said interconnection pair to said data line pair; and data line control means connected directly to said data line pair, controlled by a signal on said interconnection line pair, for said first state responsive to said data signal for operating to allow said data line pair to attain a predetermined potential and for said second state responsive to said control signal for operating to allow said data line pair to attain a predetermined potential.

* * * * *